United States Patent [19]
Borowy et al.

[11] Patent Number: 4,558,275
[45] Date of Patent: Dec. 10, 1985

[54] LINE VOLTAGE MONITOR SYSTEM
[75] Inventors: Dennis M. Borowy, Torrington; Charles A. Crotty, Harwinton; Allen R. Perrins, Branford; Peter Senak, Jr., Bristol, all of Conn.
[73] Assignee: The Superior Electric Company, Bristol, Conn.
[21] Appl. No.: 256,239
[22] Filed: Apr. 21, 1981
[51] Int. Cl.⁴ .............................................. G01R 19/16
[52] U.S. Cl. ................................. 324/103 P; 340/661
[58] Field of Search ................... 324/103 P, 102, 113; 364/481, 492; 340/659–663

[56] References Cited

U.S. PATENT DOCUMENTS

| | | | |
|---|---|---|---|
| 3,079,084 | 2/1963 | Briney et al. | 235/183 |
| 3,182,181 | 5/1965 | Schumann | 235/164 |
| 3,478,328 | 11/1969 | Schillinger | 340/172.5 |
| 3,488,597 | 1/1970 | Schlein | 328/135 |
| 3,549,874 | 12/1970 | Vachitis | 235/193 |
| 3,573,614 | 4/1971 | Wittbrodt | 324/102 |
| 3,629,852 | 12/1971 | Thexton et al. | 340/172.5 |
| 3,629,854 | 12/1971 | Hauck et al. | 340/172.5 |
| 3,772,502 | 11/1973 | Hodge et al. | 235/150.5 |
| 3,775,675 | 11/1973 | Freeze et al. | 324/51 |
| 3,794,974 | 2/1974 | Henn et al. | 340/146.2 |
| 3,795,861 | 3/1974 | Lazenby et al. | 324/102 |
| 3,809,874 | 5/1974 | Pozzetti et al. | 235/183 |
| 3,813,667 | 5/1974 | Smith | 340/659 |
| 3,815,088 | 6/1974 | Kumpfbeck et al. | 340/63 |
| 3,842,422 | 10/1974 | VandenBrock et al. | 346/1 |
| 3,846,698 | 11/1974 | Lawton | 324/51 |
| 3,869,667 | 3/1975 | Canicatti | 324/113 |
| 3,882,378 | 5/1975 | Foord | 324/54 |
| 3,902,813 | 9/1975 | Vanden Broek et al. | 356/201 |
| 3,936,663 | 2/1976 | Taylor et al. | 235/150.51 |
| 3,973,197 | 8/1976 | Meyer | 324/103 P |
| 3,987,393 | 10/1976 | Knauer | 324/102 |
| 3,999,124 | 12/1976 | Haney | 324/99 D |
| 4,006,413 | 2/1977 | Silberberg | 324/103 P |
| 4,016,552 | 4/1977 | Horner et al. | 340/253 C |
| 4,031,463 | 6/1977 | Norberg | 324/77 A |
| 4,054,786 | 10/1977 | Vincent | 364/575 |
| 4,058,804 | 11/1977 | Sawada et al. | 340/248 A |
| 4,145,744 | 3/1979 | Sidorovich et al. | 364/554 |
| 4,156,280 | 5/1979 | Griess | 364/481 |
| 4,187,461 | 2/1980 | Cox | 324/102 |
| 4,193,118 | 3/1980 | Nash et al. | 364/734 |
| 4,206,413 | 6/1980 | Cox et al. | 328/127 |
| 4,210,906 | 7/1980 | Smith et al. | 340/659 |
| 4,215,413 | 7/1980 | Stark et al. | 364/570 |
| 4,241,336 | 12/1980 | Schonken | 340/661 |
| 4,245,150 | 1/1981 | Driscoll et al. | 340/663 |

OTHER PUBLICATIONS

"Power Line Disturbance Monitor", Model 3500; Franklin Electric, Sunnyvale, Calif.; Pre-1980; pp. 1–5.
"Power Line Disturbance Monitor-Model 3500-Specifications", *Franklin Electric, Programmed Power Division*, 5 pages.
"The Portable Power Line Disturbance Monitor--Model 3600"-*Franklin Electric-Programmed Power Division*, 3 pages.
B. Hogan, "Microprocessor-based Unit Functions as Locomotive 'Flight Recorder'", *Design News*, Dec. 1980, 2 pages.

*Primary Examiner*—Ernest F. Karlsen
*Attorney, Agent, or Firm*—F. Eugene Davis, IV

[57] ABSTRACT

The Detector Module derives a synchronization signal from the half-wave crossovers of the AC power line. A half-wave peak detector detects the peak voltage of each half wave. An impulse detector detects the voltage of any impulses occurring during a half-wave. A common mode detector detects the peak value of each half-wave across the common mode terminals. A microcomputer is provided together with a clock/calendar for recording threshold values and for each half-cycle if a SAG or SURGE is detected; the time that the SAG or SURGE was initiated; the voltage of the half cycle of greatest SAG or SURGE during the event and the number of cycles is recorded. For LO and HI AVERAGE an average resistor stores the average of the peak values for each of the last thirty-two half cycles and that average is compared with the threshold to determine if an event has occurred. If an event has occurred, the duration and the lowest average occurring during the event is stored. The time an impulse occurs is recorded to the nearest second along with the voltage of the peak impulse during the half cycle of the event is stored. For COMMON mode the value of the worst half cycle occurring during any event is recorded along with the number of cycles during which the COMMON mode occurs. BLACKOUT time OFF and time ON are recorded.

21 Claims, 92 Drawing Figures

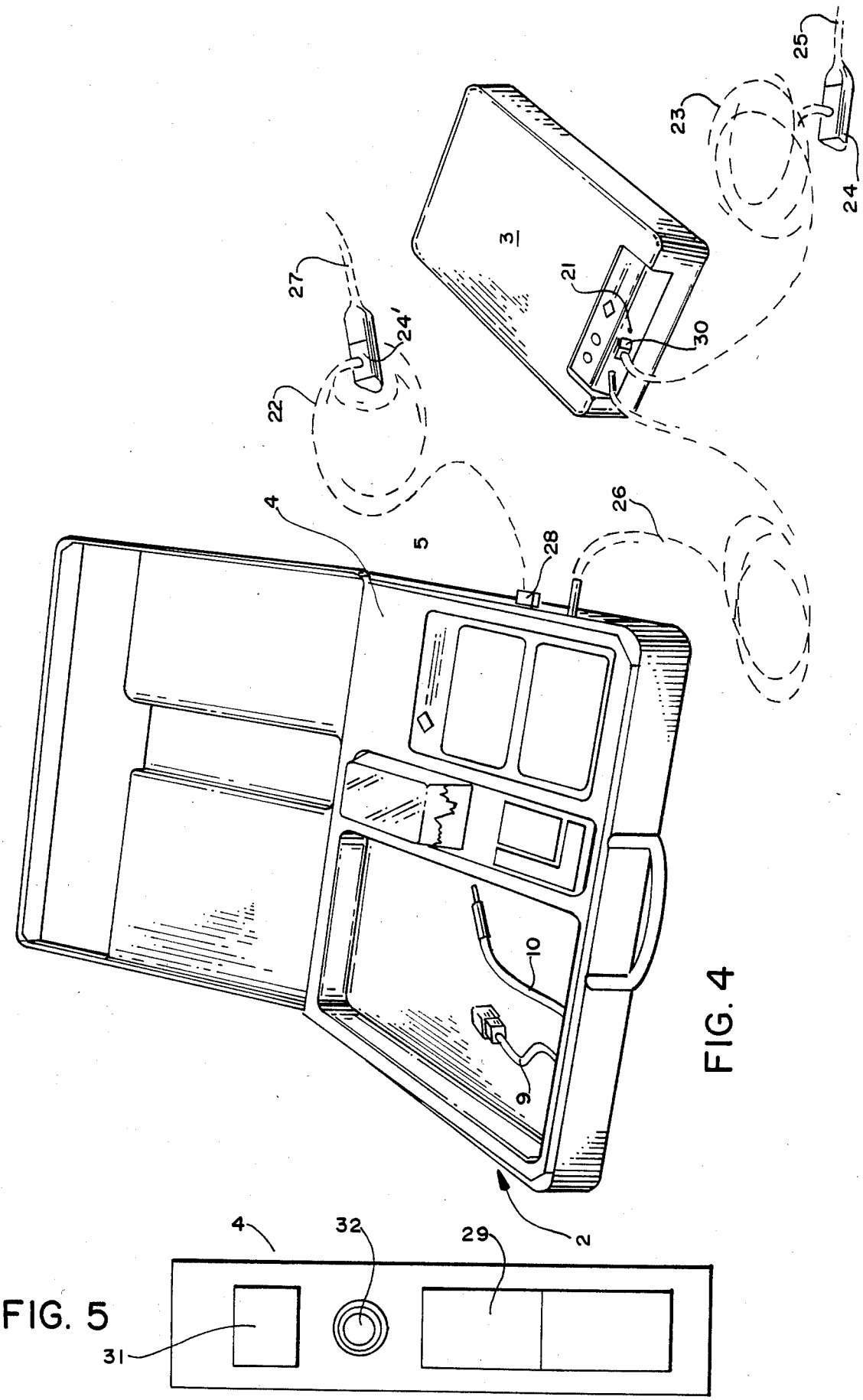

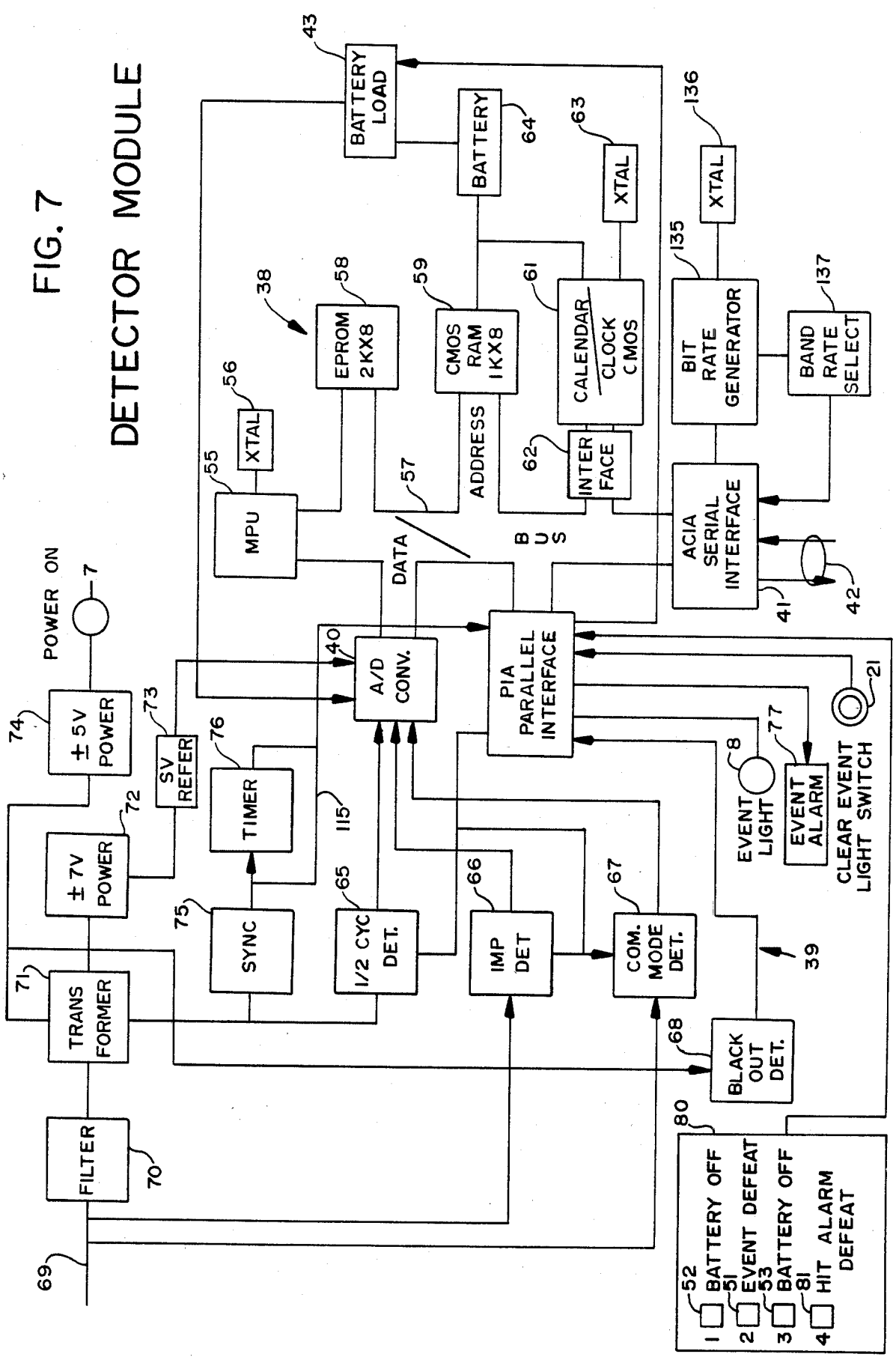

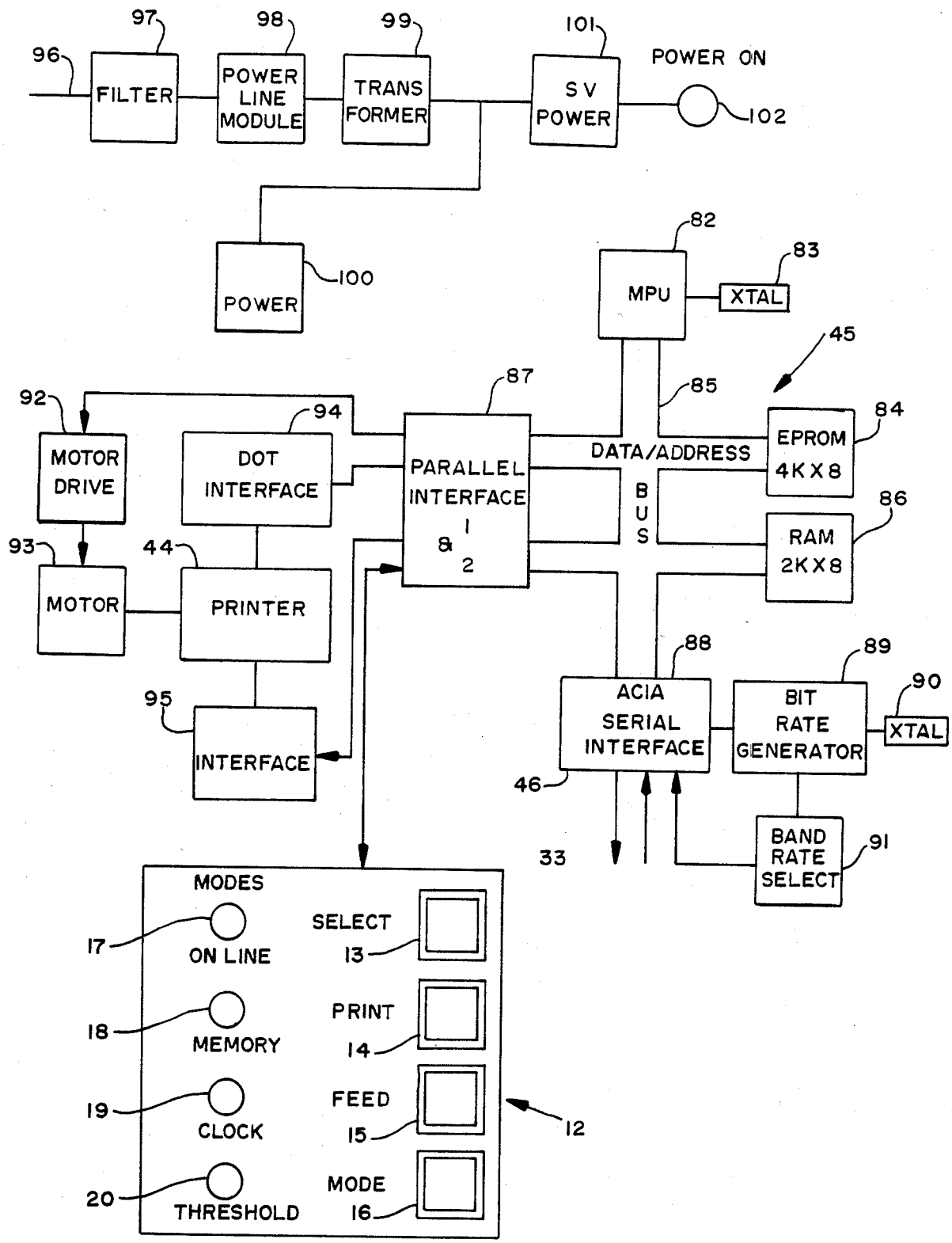

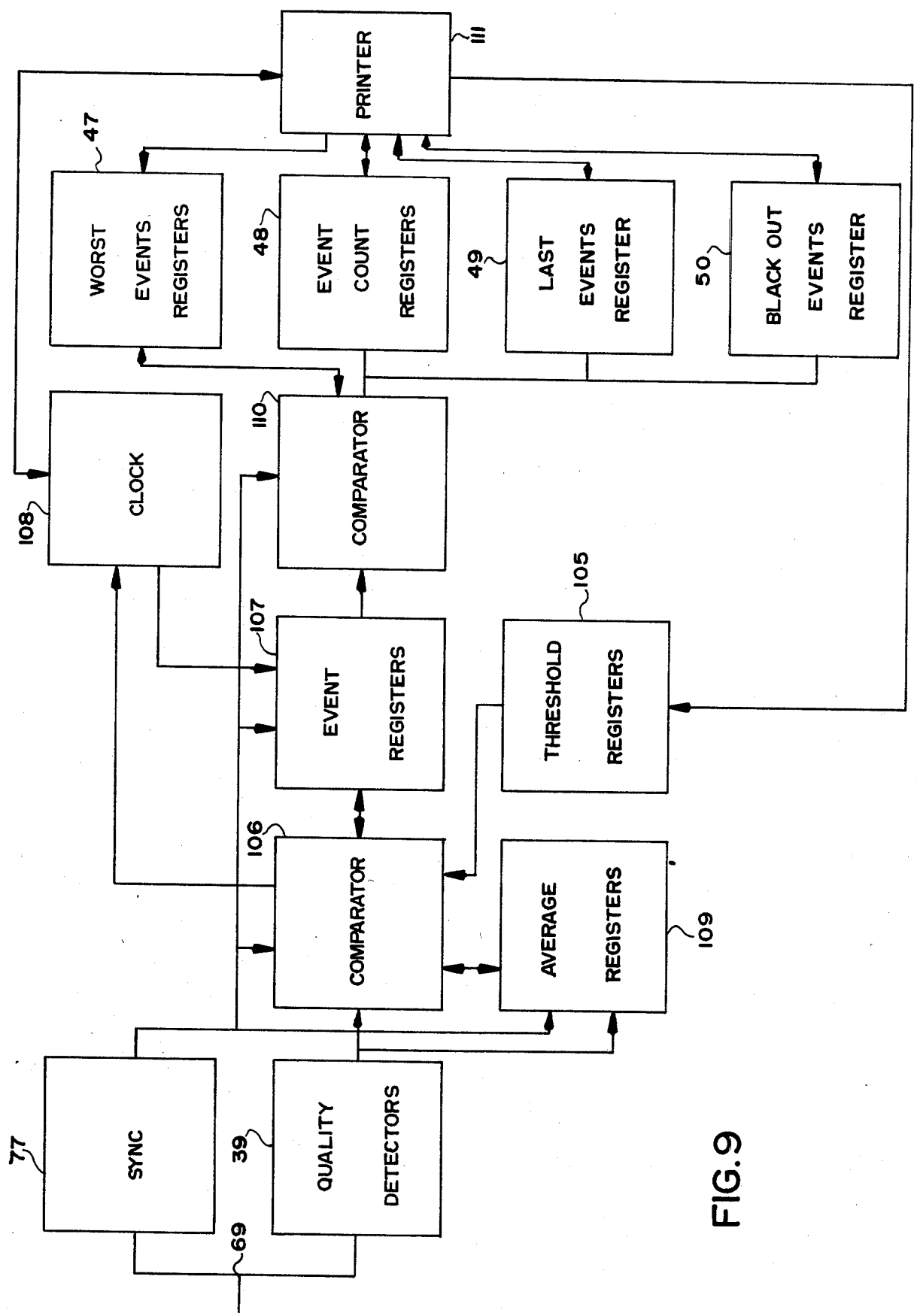

FIG. 10

```
STABILINE AC VOLTAGE
CONDITIONING SYSTEMS
  COPYRIGHT 1981
  SUPERIOR ELECTRIC
  BRISTOL CT 06010
  TEL: 203 582-9561

LINE CONDITIONS
ON-LINE:    117 VOLTS

MONITOR ID: 0001

VOLTAGE THRESHOLDS
SAG  LO  HI  SUR  IMP
090 100 130 140 500

DATE       TIME
  MO/DA/YR   HR:MN:SE
  04/07/81   08:25:04

DAY  TIME VOLTS DUR
HI AVG:              SEC
07 08:25:08 138  001
LO AVG:              SEC
07 08:25:15 091  001
SAG:                 CYC
07 08:25:18 073  153
LO AVG:              SEC
07 08:25:18 074  005
HI AVG:              SEC
07 08:25:25 139  001
COM MODE:            CYC
07 08:25:32      107
COM MODE:            CYC
07 08:25:41      322
COM MODE:            CYC
07 08:25:56      001
```

FIG. 11

```
STABILINE AC VOLTAGE
CONDITIONING SYSTEMS
  COPYRIGHT 1981
  SUPERIOR ELECTRIC
  BRISTOL CT 06010
  TEL: 203 582-9561

LINE CONDITIONS
         MEMORY

MONITOR ID: 0001

VOLTAGE THRESHOLDS
SAG  LO  HI  SUR  IMP
090 100 130 140 500

DATE       TIME
  MO/DA/YR   HR:MN:SE
  04/07/81   08:27:23

SAG:       0002 HITS
DAY  TIME VOLTS CYC
07 08:25:18 073 153
07 08:26:12 013 045

SURGE:     0000 HITS

LO AVG:    0004 HITS
DAY  TIME VOLTS SEC
07 08:25:15 091 001
07 08:25:18 074 005
07 08:26:12 041 001
07 08:26:39 053 001

HI AVG:    0003 HITS
DAY  TIME VOLTS SEC
07 08:25:08 138 001
07 08:25:25 139 001
07 08:26:45 137 005

IMPULSE:   0000 HITS
```

```
COM MODE:  0004 HITS
DAY  TIME          CYC
07 08:25:32        107
07 08:25:41        922
07 08:25:56        001
07 08:26:13        001

BLK OUT:   0001 HITS
DAY  TIME
07 08:26:13 OFF
07 08:26:39 ON

TOTAL:     00014 HITS

LAST EVENTS:
LO AVG:              SEC
07 08:25:18 074  005
HI AVG:              SEC
07 08:25:25 139  001
COM MODE:            CYC
07 08:25:32      107
COM MODE:            CYC
07 08:25:41      922
COM MODE:            CYC
07 08:25:56      001
SAG:                 CYC
07 08:26:12 013  045
LO AVG:              SEC
07 08:26:12 041  001
COM MODE:            CYC
07 08:26:13      001
LO AVG:              SEC
07 08:26:39 053  001
HI AVG:              SEC
07 08:26:45 137  005
```

FIG. 12

```
   DATE        TIME
MO/DA/YR    HR:MN:SE
11/11/00    11:11:04

11/11/00    11:11:09
CLOCK SET:
  ?
 01/11/00   11:11:09
   ? ?
 01/21/00   11:11:09
   ?
 01/22/00   11:11:09
 01/23/00   11:11:09
   ?
 01/23/10   11:11:09
 01/23/20   11:11:09
 01/23/30   11:11:09
 01/23/40   11:11:09
 01/23/50   11:11:09
 01/23/60   11:11:09
 01/23/70   11:11:09
 01/23/80   11:11:09
    ? ?
 01/23/80   21:11:09
 01/23/80   01:11:09
 01/23/80   11:11:09
 01/23/80   21:11:09
 01/23/80   01:11:09
    ?
 01/23/80   02:11:09
 01/23/80   03:11:09
 01/23/80   04:11:09
 01/23/80   05:11:09
 01/23/80   06:11:09
 01/23/80   07:11:09
 01/23/80   08:11:09
 01/23/80   09:11:09
    ??
 01/23/80   09:11:00*
```

FIG. 13

```
VOLTAGE THRESHOLDS

SAG  LO  HI  SUR  IMP
090 100 125 130  330

THRESHOLDS SET:
??? ???
090 101 125 130  330
090 102 125 130  330
090 103 125 130  330
090 104 125 130  330
090 105 125 130  330
        ??? ???
090 105 125 131  330
090 105 125 132  330
090 105 125 133  330
090 105 125 134  330
090 105 125 135  330
                 ???
090 105 125 135  330*

MONITOR ID: 22
ID SET:     ?
           32
            ?
           33
           34
           34*
```

FIG. 14

```
STABILINE AC VOLTAGE
CONDITIONING SYSTEMS
  COPYRIGHT 1981
 SUPERIOR ELECTRIC
 BRISTOL CT 06010
 TEL: 203 582-9561

LINE CONDITIONS
      MEMORY

PRINTER OFF-LINE OR
COMMUNICATION ERROR
```

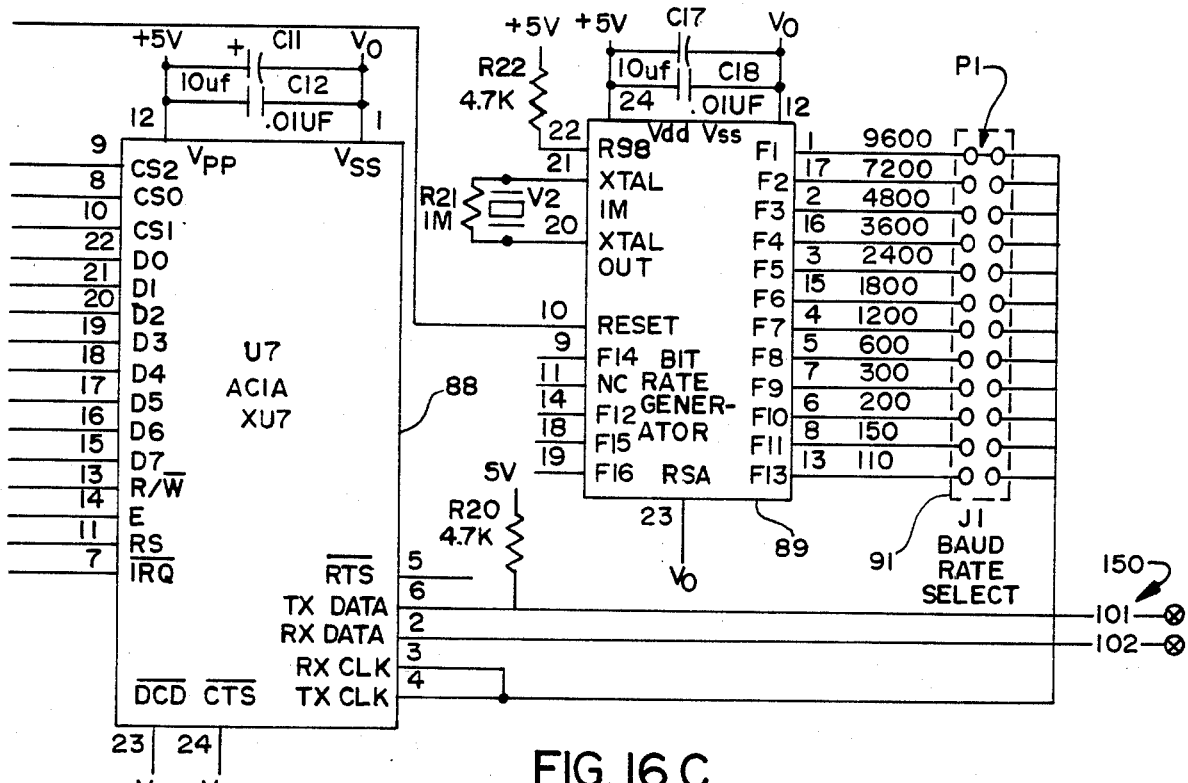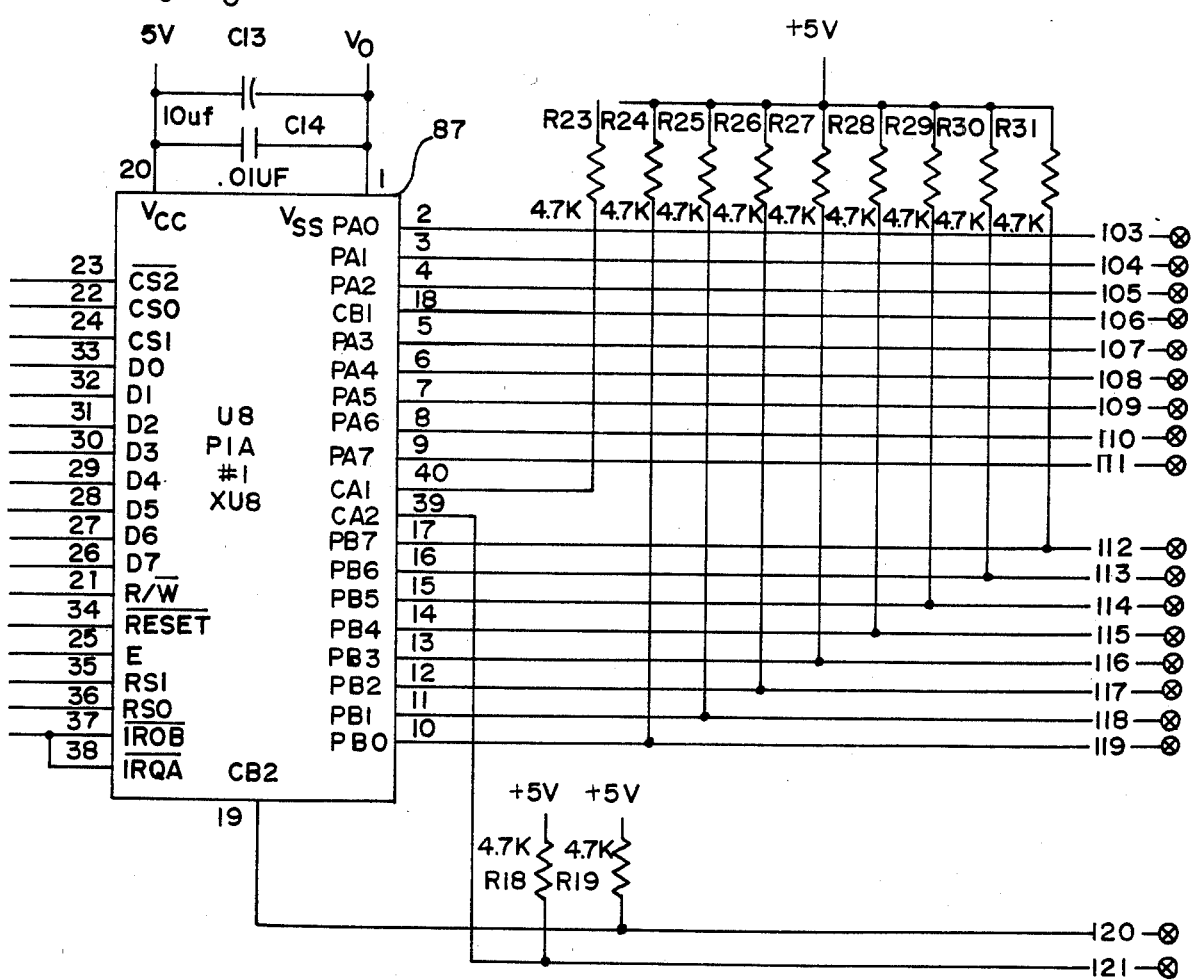
FIG. 16 C

FIG. 17C
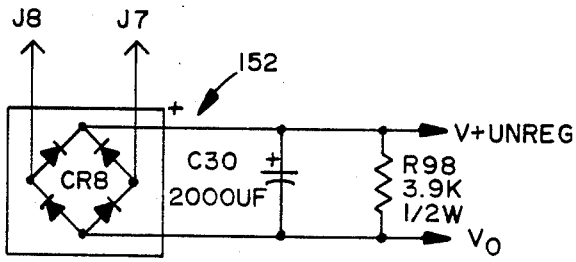
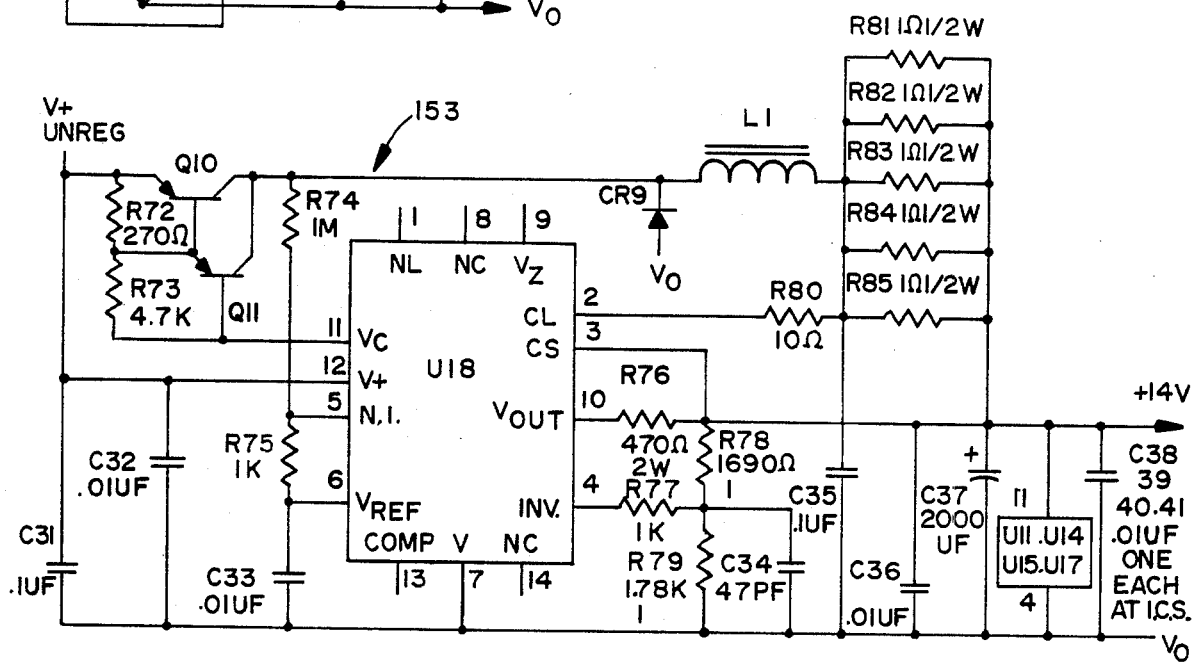
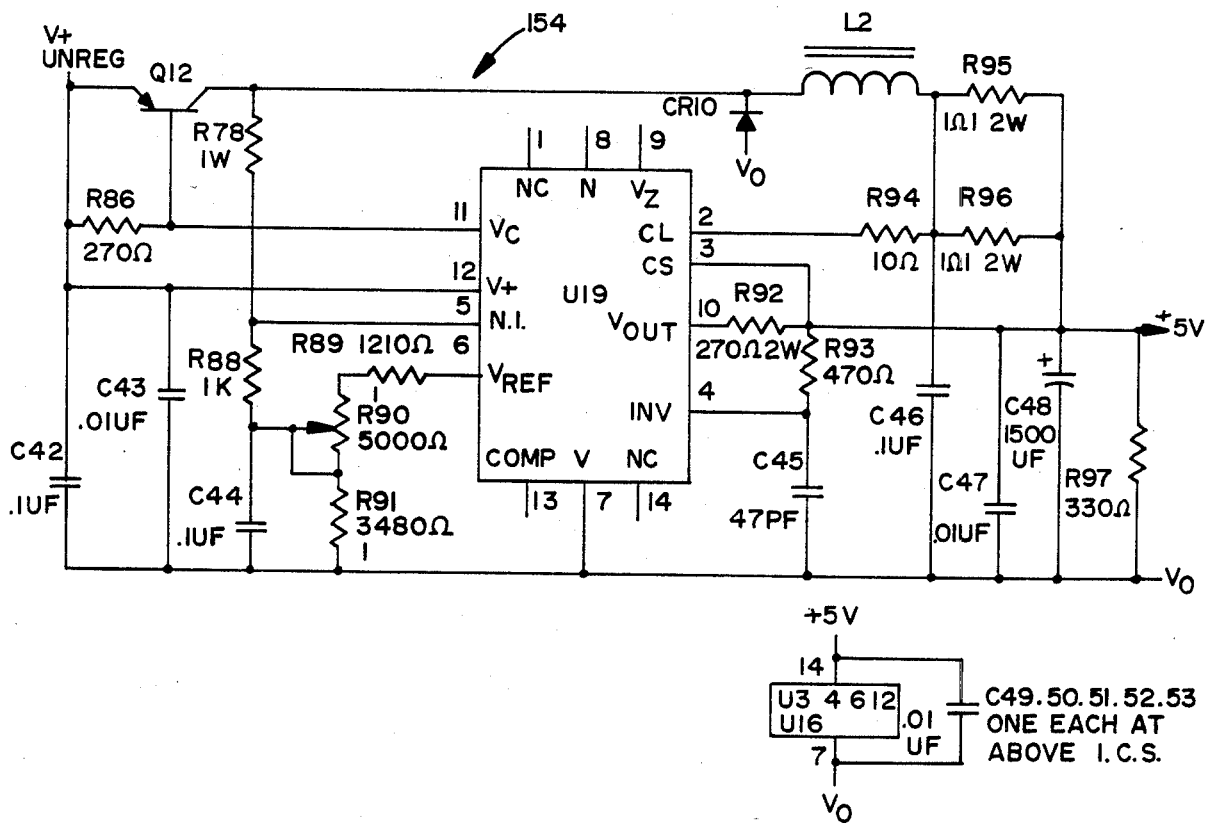

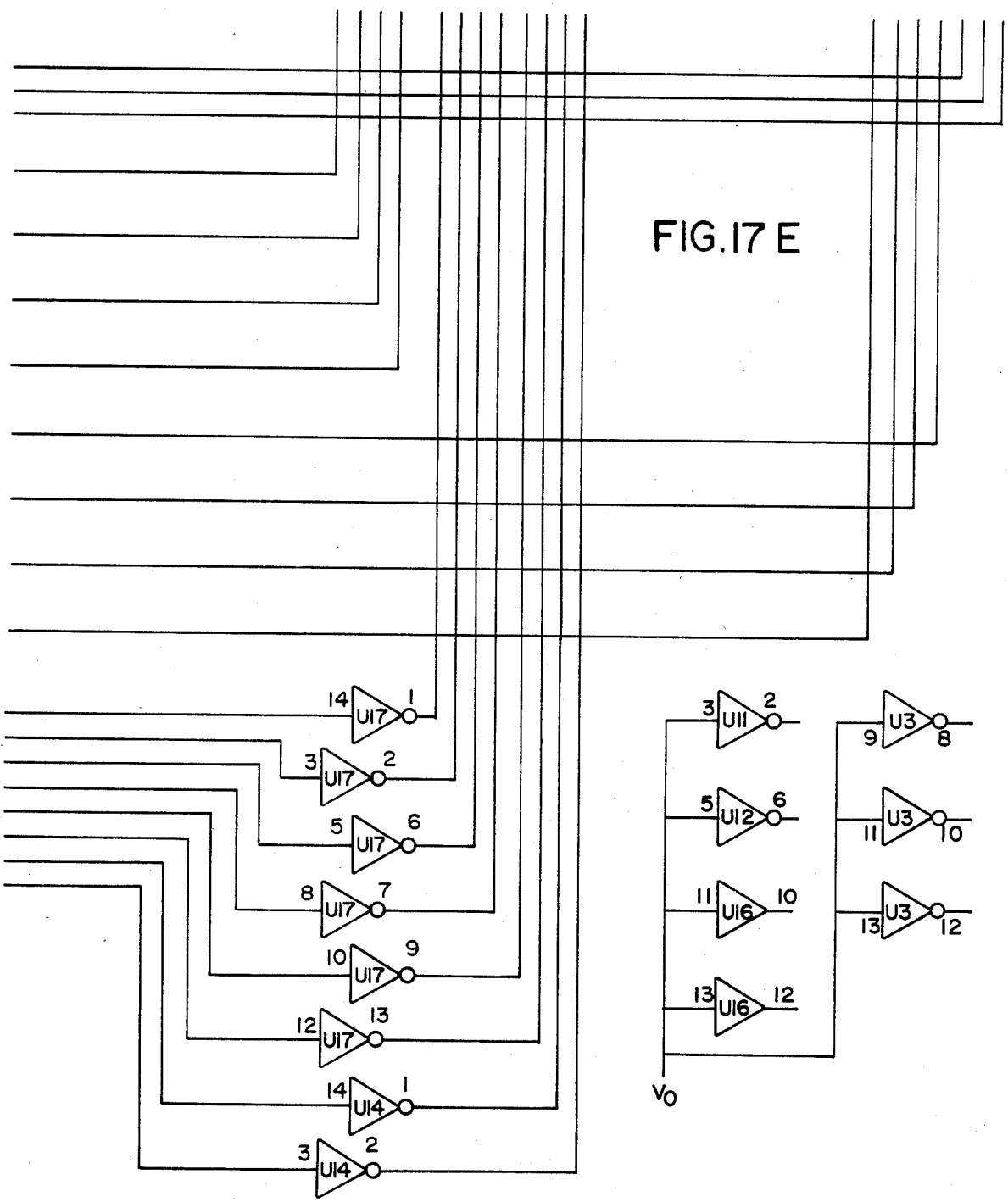
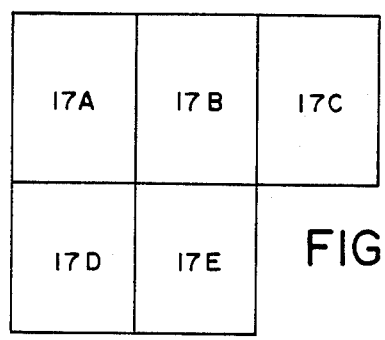
FIG.17 F

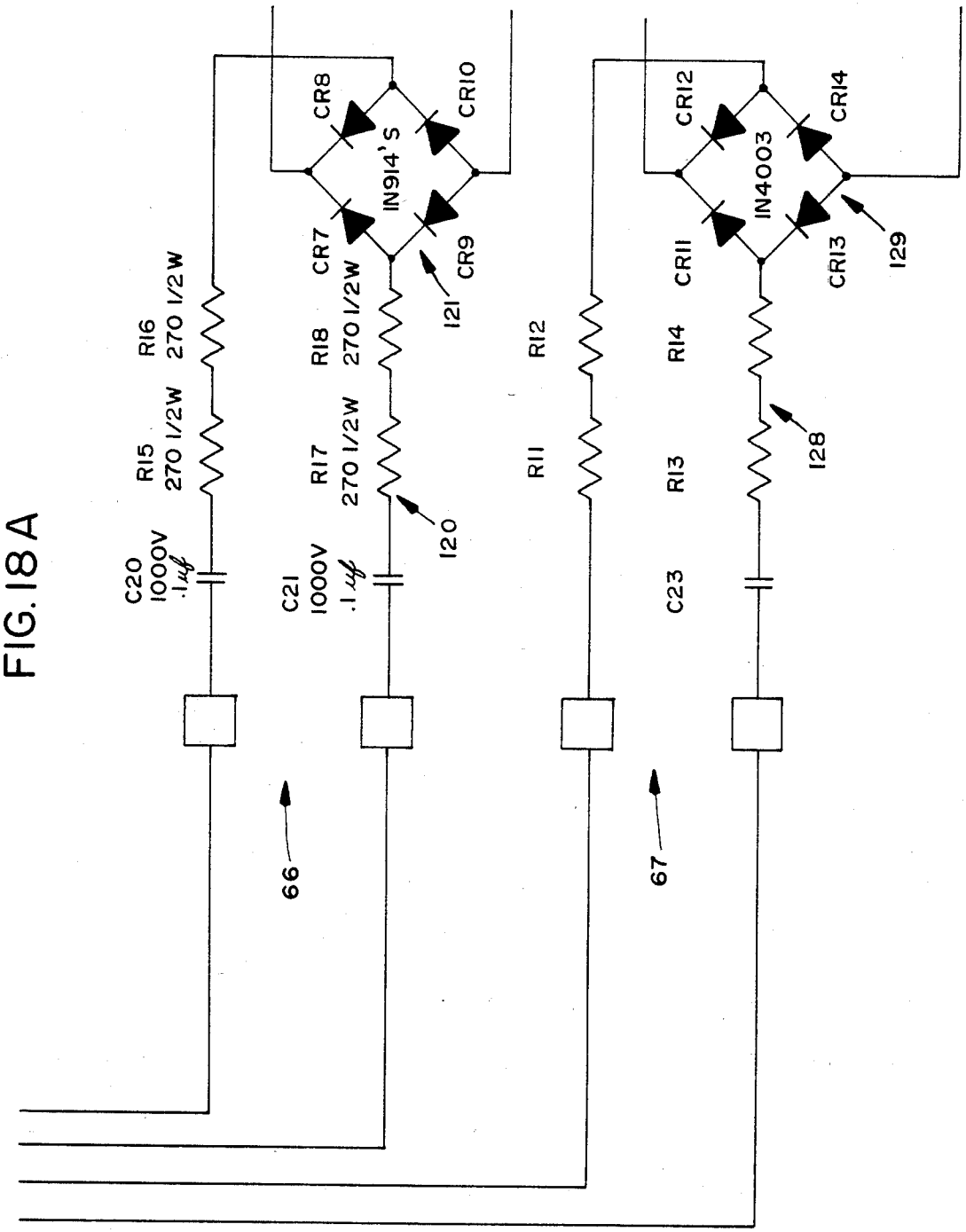

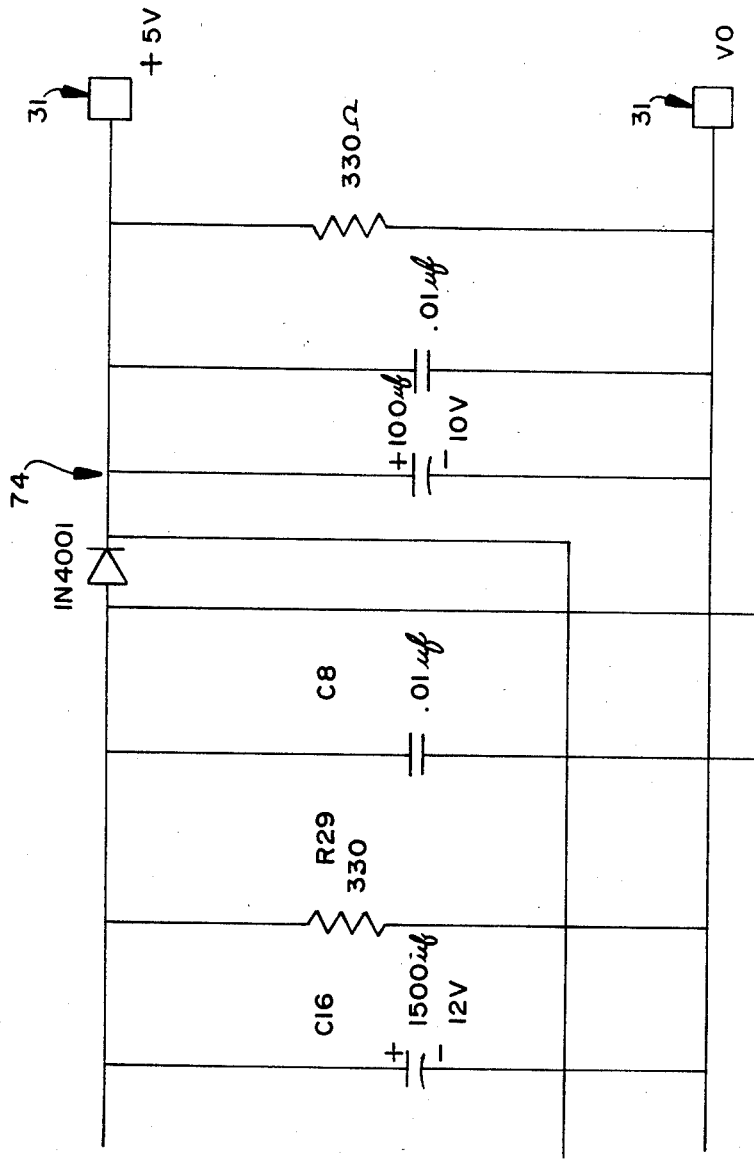

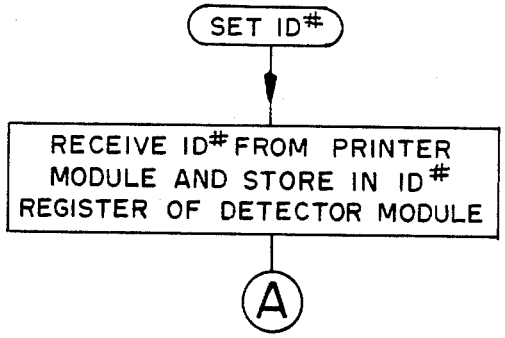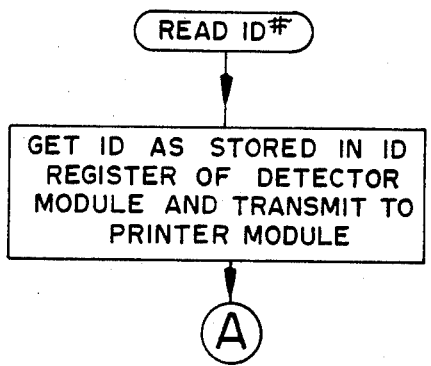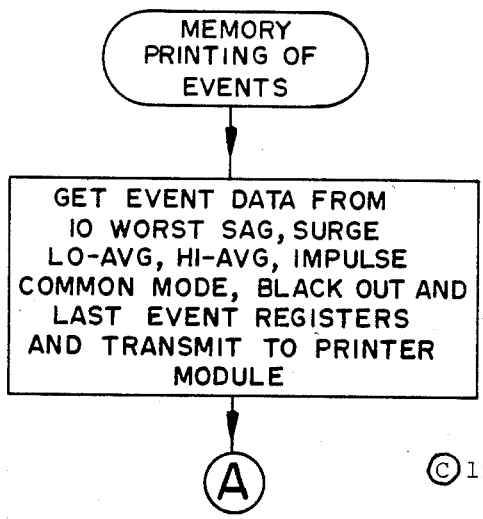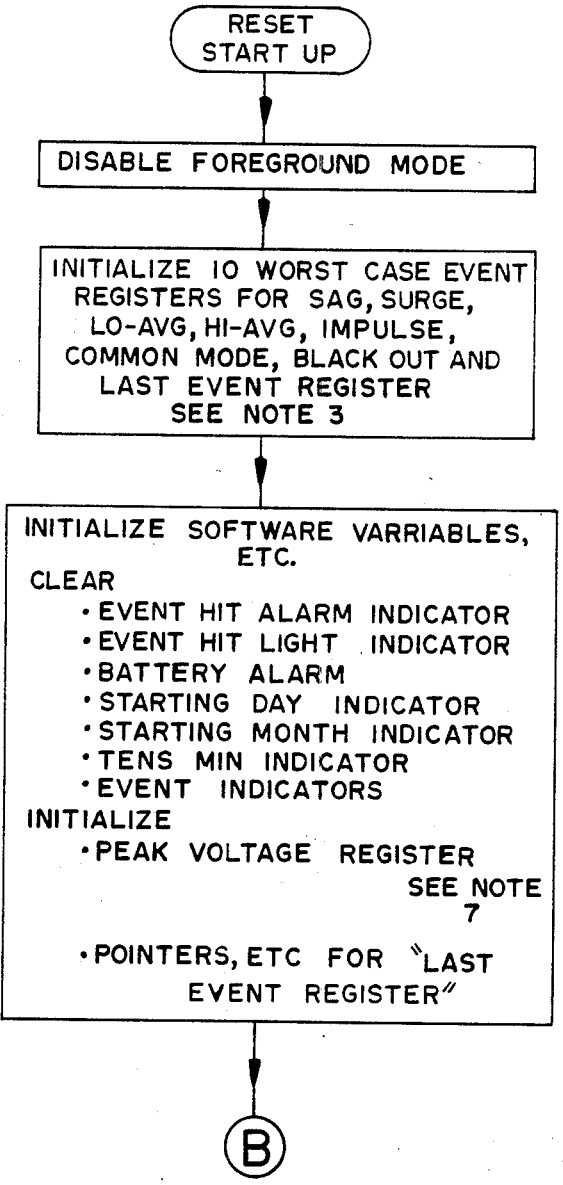

© 1980,81 THE SUPERIOR ELECTRIC CO.

© 1980,81 THE SUPERIOR ELECTRIC CO.

TYPICAL 'VOLTAGE THRESHOLD' OUTPUT

```
VOLTAGE THRESHOLDS
SAG  LO.  HI  SUR  IMP
090  100  130 140  500
090  100  130 140  500
   THRESHOLDS SET:
??? ???

090  101  130 140  500
090  102  130 140  500
090  103  130 140  500
090  104  130 140  500
090  105  130 140  500

??? ??

090  105  130 150  500
090  105  130 160  500
090  105  130 170  500
090  105  130 180  500
090  105  130 190  500
090  105  130 100  500
090  105  130 110  500
090  105  130 120  500
090  105  130 130  500

?

090  105  130 131  500
090  105  130 132  500
090  105  130 133  500
090  105  130 134  500
090  105  130 135  500

???

090  105  130 135  500 *
090  105  130 135  500 *
090  105  130 135  500 *
```

© 1980, 81 THE SUPERIOR ELECTRIC CO.

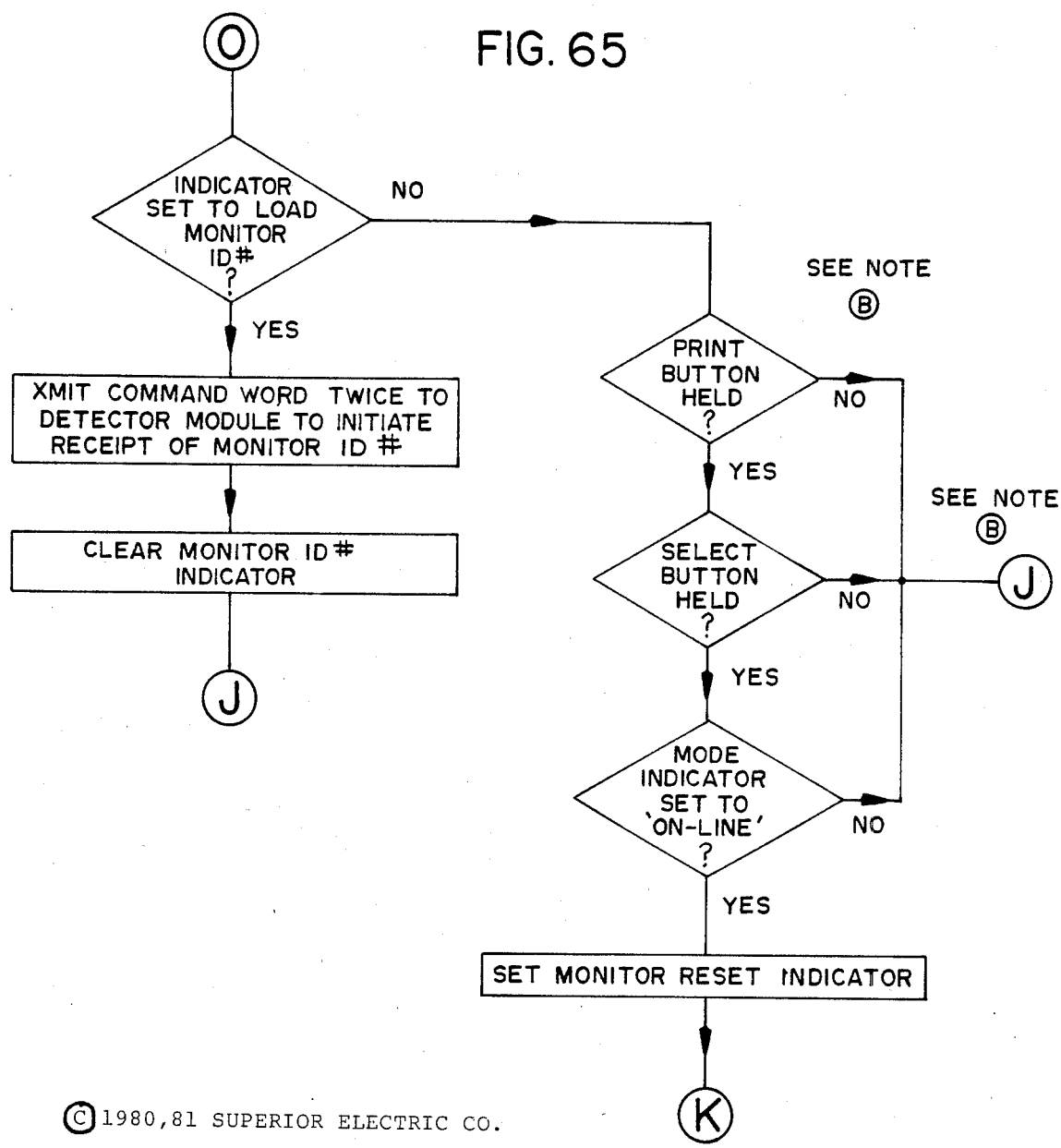

LINE VOLTAGE MONITOR SYSTEM

TECHNICAL FIELD

This application relates to a Line Voltage Monitor System. More particularly it relates to such a system employing separable Detector and Printer units. In a broader aspect, the system can be viewed as an event detector and can be utilized to detect any type of quality event in monitored data. The detector uniquely provides for the storage of the ten worst events of each quality being monitored, the number of events of each quality being monitored, the last ten events of all qualities that have occurred and five BLACKOUT events.

The Detector Module may be connected to or not connected to the Printer Module. Thus a system of several detectors can monitor the input and output from line conditioning apparatus, or the status of a line at different places for determining where events are occurring. Several detectors may be synchronized together utilizing the same printer for determining simultaneous events and reducing costs.

BACKGROUND ART

Line voltage monitors have come into widespread use over the last ten or fifteen years. However the detectors presently in use are expensive and have severe disadvantages. Not the least of the disadvantages is that the monitors comprise a detector and a printer and a data entry device. Some monitors according to the prior are utilize switches of various kinds for entering a limited number of thresholds. Others provide a full numeric keyboard and ON-LINE display such as LED's. Furthermore, these prior art devices do not detect and store events of many of the qualities and numbers that are desired by the users.

DISCLOSURE OF THE INVENTION

Now referring to FIG. 1, a Line Voltage Monitor System 2 according to the invention comprises a Detector Module 3 and a Printer Module 4. The Printer Module is incorporated in to an attache case 5. Cord storage is provided in the upper portion or the attache case generally indicated at 6.

The Detector Module 3 is provided with a power on light 7 and event light 8. When stored in the attache case 5 as shown in FIG. 1 it may be connected to a power line via power cable 9 and to the Printer via communications cable 10. The Printer Module 4 is provided with a thermal printer generally indicated at 11. The keyboard 12 comprises only four switches: SELECT 13, PRINT 14, FEED 15 and MODE 16. Four mode lights are provided; ON-LINE 17, MEMORY 18, CLOCK 19 and THRESHOLD 20.

The Detector Unit 3 is also provided with an event light off switch 21 and an EVENT DEFEAT, a HIT ALARM DEFEAT, and two battery off switches (not shown).

Referring to FIG. 2, the Printer is connected to power via power line cable 22 and the Detector Unit when in the Printer as shown in FIG. 2, is connected to a power line via its own cable 23. Each cable is provied with a piggy-back male and female connector 24, 24'.

Detector Module 3 may be utilized independently as shown in FIG. 3 to monitor a power line. The critical device to which it is desired to connect to the monitored power line may be plugged in to the connector 24.

Now referring to FIG. 4, when the Detector Module 3 is connected to monitor power line 25 the Printer 4 may be brought to the Detector 3 and the Detector connected to the Printer via communications cable 26. The Printer may be connected to a different power line 27 via its own power cord 22.

The Printer power cord 22 is provided with a special connector 28 which connects to a special printer supply connector 29, shown in FIG. 5. The connector 30 of the Detector power cord 23 is different from connector 28 and may only be plugged in to the special detector power line connector 31, shown in FIG. 5, which is on the Printer and a duplicate connector on the Detector. The communications cord 26 is plugged in to another connector 32 on the Printer 4.

Now referring to FIG. 6, communications connector 32 of the Printer 4 is connected by two parallel cords 33 and 34. Cord 33 is connected to the Printer. Cord 34 is provided with a connector 35 for connection to the Detector. Special power connector 31 for the Detector is connected via dedicated power cord 36 to connector 37 for connection to the Detector.

The overall systems diagram of the Detector Module is shown in FIG. 7. It comprises a microcomputer portion generally indicated at 38, a detector portion generally indicated at 39 and an analog-to-digital converter 40. It is also provided with a communications ACIA serial interface 41 connected to a communications cable jack 42 (see also FIG. 1).

A special battery load 43 is provided for testing the battery every ten minutes.

Now referring to FIG. 8, the Printer Module comprises a thermal printer 44, a microcomputer 45, a serial interface 46 connected to the communications cable 33 (see FIG. 6), a keyboard 12 and mode display lights 17, 18, 19 and 20. No other display or keyboard or switches are required to set the thresholds, to set the clock to set the monitor ID and to provide for all readouts at the Printer Module.

Now referring to FIG. 9, one aspect of the invention, broadly speaking, is the provision of a plurality of worst event registers 47, event count registers 48, last event registers 49 and blackout event register 50 in the Detector, as these provide for basic summary information which the user requires when the Detector is not connected to the Printer and printing each event as it occurs. Another aspect of the invention is the four modes of the Printer and the various printouts provided thereby illustrated in FIGS. 10 through 14. Still another aspects of the invention is the method of setting the clock and thresholds and monitor ID illustrated in FIGS. 12 and 13, which utilizes the Printer in a novel way together with the SELECT 13, PRINT 14 and MODE 16 pushbuttons of the Printer.

Another aspect of the invention is the derivation of SAG, SURGE, LO-AVERAGE and HI-AVERAGE voltages from the peak voltage occurring in each half cycle after low pass filtering and the derivation of a sync pulse for cycling the computer from the zero crossovers of the line voltage.

Still another aspect of the invention is an impulse detector comprising a high pass filter, full wave rectifier, current transformer and sample and hold circuit.

Yet another aspect of the invention is a common mode detector employing a full wave rectifier, an electro-optical isolator and a sample and hold circuit. Another aspect of the invention is the method of determining LO and HI AVERAGE by storing the peak values of the last thirty-two half waves in a shift register and comparing the average thereof with a threshold each half wave.

Another aspect of the invention is provision for checking whether the memory has not been compromised during battery backup. The digits from 1 to 300 are stored in successive positions in the memory. Upon restart, after battery backup, a counter is set to zero and counts up. At the same time the number stored in each successive memory position is checked against the counter. If it always agrees, then the memory is presumed to have not been compromised during the battery backup. If they do not agree an error condition is noted.

Again referring to FIGS. 1 and 7, another aspect of the invention is the provision of an event defeat switch 51 which stops the detector from recording data and allows the battery to keep in memory all recorded events for a year or more.

Still another aspect is the provision of two battery off switches 52 and 53, so that the battery can be turned off during long self-storage, but two switches must be operated so that this will not be done accidentally.

Still another aspect of the invention is the provision of the clear event light switch 21 of FIGS. 1 and 7.

Other aspects of the invention will in part be obvious and will in part appear hereinafter and will be pointed out in the Claims.

OBJECTS OF THE INVENTION

It is therefore an object of the invention to provide a line voltage monitor system.

Another object of the invention is to provide such a system having separate detector and printer modules.

A further object of the invention is to provide such a system in which the printer and detector modules may be employed together.

Still another object of the invention is to provide such a system in which the detector and printer modules may always be connected to separate power lines.

Yet still another object of the invention is provide such a system in which critical apparatus may be conveniently connected to the same power outlet as the detector module.

Another object of the invention is to provide such a system in which the detector and printer module may be conveniently connected to the same outlet.

A further object of the invention is to provide an indication at the detector of the occurrence of events.

Still another object of the invention is to provide a system of the above character employing a minimum number of input switches at the printer.

Yet still another object of the invention is to provide such a system with no on line display device.

A further object of the invention is to provide such a system for printing out each event as it occurs when the detector is connected to the printer.

Still another object of the invention is to provide such a system in which summary data is recorded so that when the detector is not connected to the printer the most needed information is still supplied to the user when the detector is again connected to the printer for printout.

Yet still another object of the invention is to provide such a system for providing multicycle average value detection of selected variables.

A still further object of the invention is to provide such a system for recording the time of occurrence of each event and the in time of number of cycles of such events.

Another aspect of the invention is to provide such a system in which the memory in the detector may be protected over long intervals.

A further object of the invention is to provide such a system in which the memory is checked for integrity at the conclusion of any period of battery backup.

Still another object of the invention is to provide a method of determining battery condition regularly.

Yet still another object of the invention is to provide a method of setting threshold monitor ID and time and data without utilizing a full numeric keyboard or an on-line display device.

A still further object of the invention is to provide an improved impulse detector.

Another object of the invention is to provide a system having an improved common mode detector.

A further object of the invention is to provide such a system for monitoring a power line at half wave intervals.

Still another object of the invention is to provide such a system in which a plurality of detector modules may be synchronized and used independently of the printer module to monitor the condition of a single power line at different places or the input and output power to and from a line conditioning device.

Other objects of the invention will in part be obvious and will in part appear hereinafter.

The invention accordingly comprises the several steps and the relation of one or more such steps with respect to each of the others, the apparatus embodying features of construction, combinations of elements and arrangements of parts which are adapted to effect such steps, and a system comprising features, combinations of elements and steps all as exemplified in the following detailed disclosure. The scope of the invention will be indicated in the Claims.

BRIEF DESCRIPTION OF THE DRAWINGS

For a fuller understanding of the nature and objects of the invention reference should be had to the following detailed description taken in connection with the accompanying drawings in which:

FIG. 4 is a perspective view of the Printer Module of FIG. 1 showing how it may be connected to a Detector Module which is monitoring a power line for reading out the data stored in the Detector Module;

FIG. 5 is a side view of the Printer Module taken from the right in FIG. 4;

FIG. 7 is a overall block diagram of the circuitry of the Detector Module of the invention;

FIG. 8 is an overall block diagram of the circuitry of the Printer Module of the invention;

FIG. 9 is a block diagram illustrating how the system works;

FIGS. 10 through 14 are exemplary print out provided by the Printer Module of the invention.

FIGS. 15A, 15B, 15C and 15D, is a schematic circuit diagram of the digital portion of the Detector Module of FIG. 7;

FIG. 15E is a diagram of how FIGS. 15A, 15B, 15C and 15D may be placed together to form FIG. 15;

FIGS. 17A, 17B, 17C and 17D, is a partial schematic circuit diagram of the Printer Module of FIG. 8;

FIG. 17E is a diagram showing how FIGS. 17A, 17B, 17C and 17D may be placed together to form FIG. 17;

FIG. 18, comprising FIGS. 18A through 18I, is a schematic circuit diagram of the analog portion of the Detector Module of FIG. 7;

FIG. 18J is a diagram showing how FIGS. 18A through 18I may be placed together to form FIG. 18;

FIGS. 19 through 42 are flow charts of the program utilized in the Detector Module of FIG. 7;

FIGS. 43 through 65, with the exception of FIG. 61, are flow charts of the computer program employed in the Printer Module of FIG. 9;

FIG. 61 is a printout produced by the Printer of FIG. 9 when setting thresholds.

The same reference characters refer to the same elements throughout the several views of the drawings.

BEST MODE FOR CARRYING OUT THE INVENTION

Figure 1:
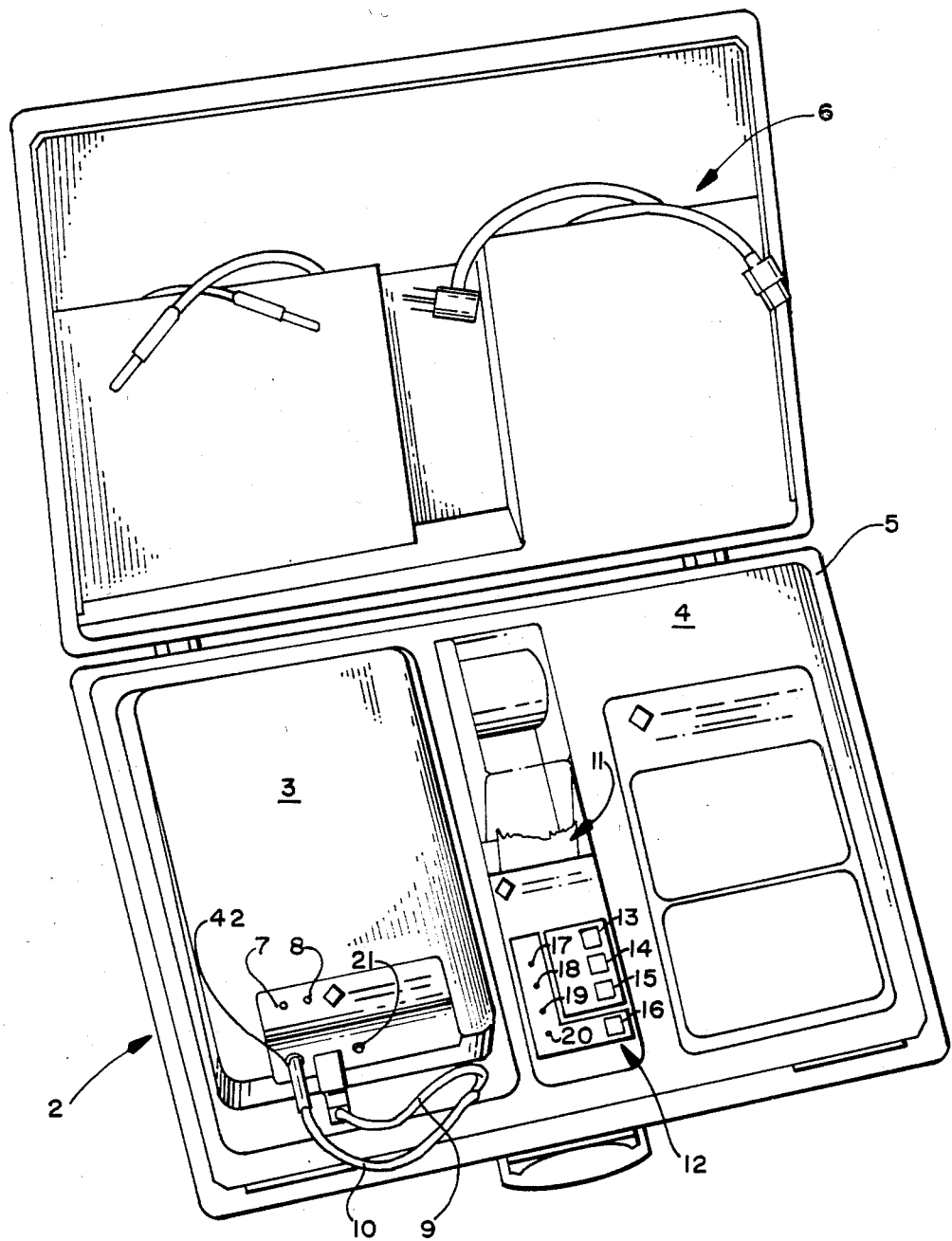
FIG. 1 is a top perspective view of a Line Voltage Monitor System according to the invention.
Figure 2:
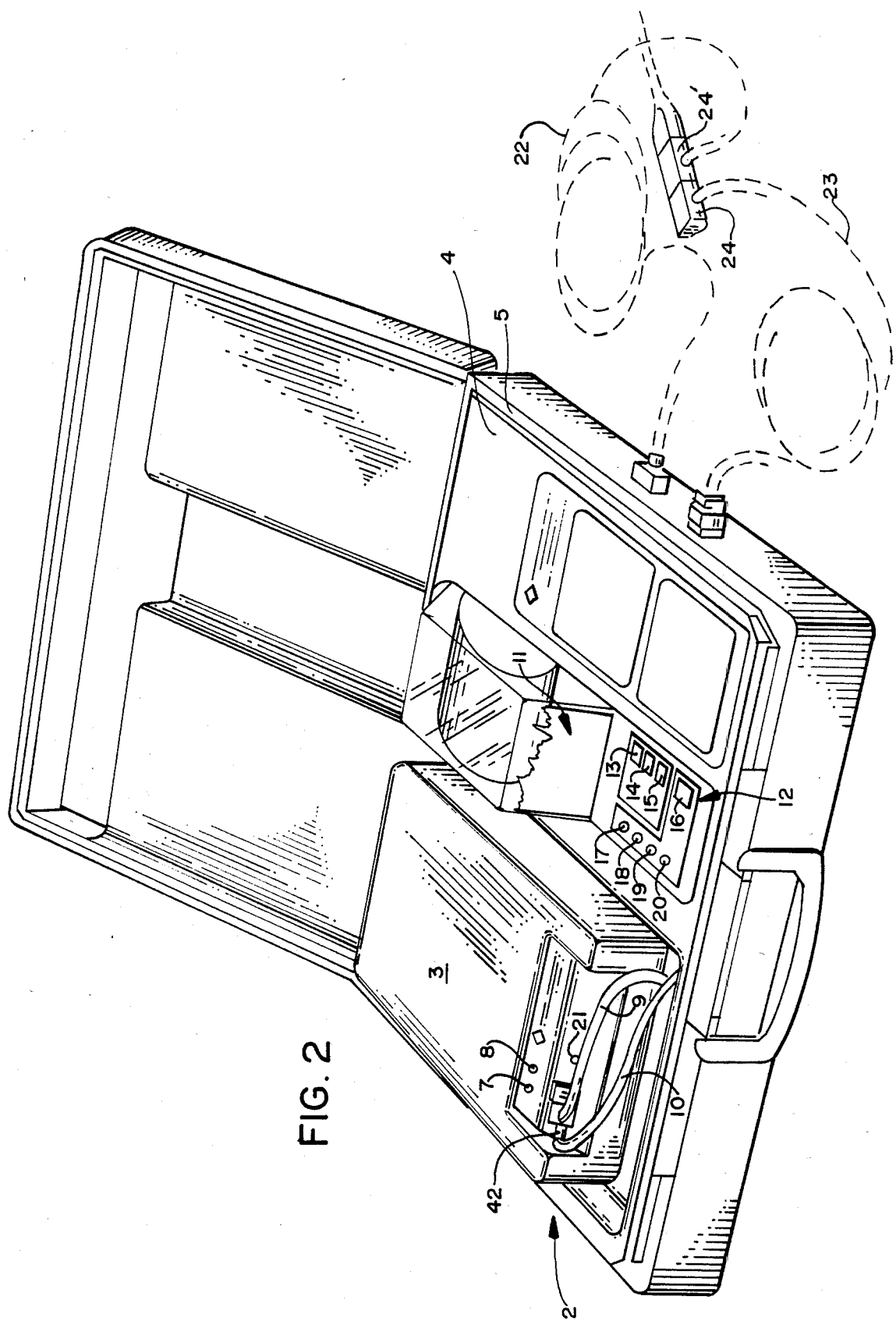
FIG. 2 is another perspective view of the system of FIG. 1 showing its connection to a power line to be monitored.
Figure 3:
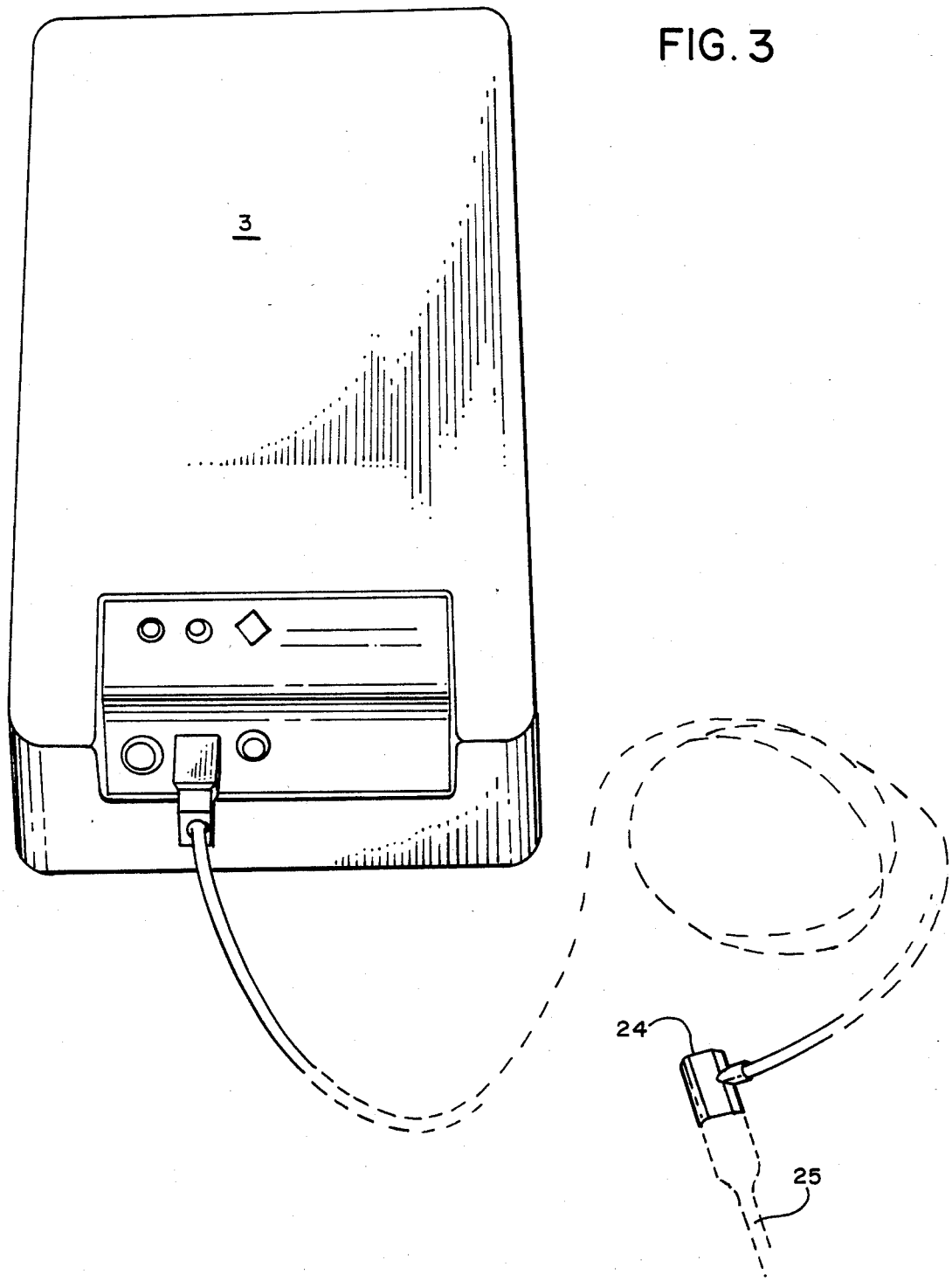
FIG. 3 is a perspective view of the Detector Module of the invention removed from the Printer Module of the invention and connected to a power line to be monitored.
Figure 6:
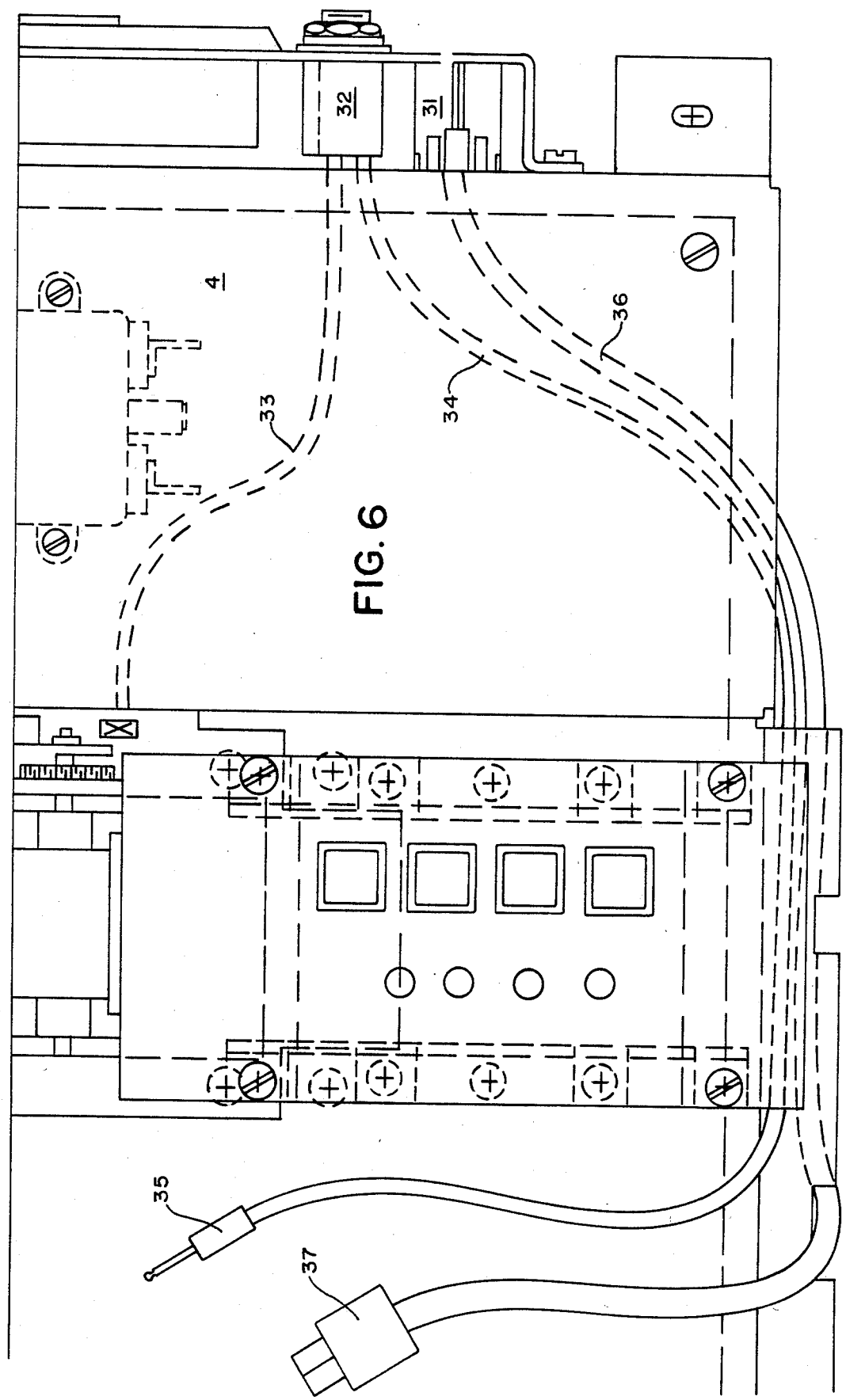
FIG. 6 is a diagramatic top view of the Printer Module of the invention.

Now referring to FIG. 7, the Detector Module comprises a microprocessing unit 55 and a crystal computer clock 56. Connected to the microprocessing unit via the data/address bus 57 are an erasable programmable read only memory 2K×8 58 in which the operating program for the microprocessing unit 55 is stored; a complimentary metal oxide semiconductor (CMOS) random access memory 1K×8 59; an analog-to-digital converter 40; a PIA parallel interface 60; an ACIA serial interface 41 and a CMOS calendar clock 61 and interface 62. A separate crystal 63 is provided for the calendar clock 61. A backup battery 64 supplies the CMOS RAM 59 and clock calendar 61 during backouts.

Under control of the PIA parallel interface 60, half cycle detector 65, impulse detector 66, common mode 67 and blackout detector 68 supply their detected information to the analog-to-digital converter 40. The impulse and common mode detector 66 and 67 are connected directly to the power line 69.

The power supply comprises low pass filter 70, transformer 71, five volt reference generator 73, providing reference voltage to the +5V power supply 74, and five volt power supply 74. Power on light 7 is connected to the five volt power supply 74.

The half cycle detector 65 is connected to the transformer after the low pass filter 70 so that it is unaffected by impulses, as is the zero crossover or sync module 75. The sync signal is provided to the PIA parallel interface 60 and in the absence of a sync signal after a predetermined time due to a dropout, a timer 76 provides an artificial sync signal to the PIA parallel interface 60 with a period slightly less than every 10 milliseconds to be compatible with both 50 and 60 cycle power lines. Event light 8 is controlled by the PIA parallel interface, as is an event alarm 77 and the half cycle impulse and common mode detectors 65, 66 and 67.

A bit rate generator 135, under control of crystal 136 and baud rate select connector 137 are connected to ACIA 41.

A dip switch 80 is provided with battery off switches 52 and 53, both of which must be thrown to disconnect the battery during long shelf life; an event defeat switch 51 and a hit alarm defeat switch 81 which turns off the event alarm 77. The dip switch 80 is connected to the PIA parallel interface.

The detector module circuitry is disclosed in detail in the schematic circuit diagrams thereof. The program is explained with reference to the flow charts of the detector module program, and the program listings appear in microfiche appendix A.

Now referring to FIG. 8, the Printer Module comprises a microprocessing unit 82 under control of the crystal clock 83. A 4K×8 EPROM 84 is connected to the MPU via data address bus 85 as is a 256×8 RAM 86. As in the detector module the EPROM contains the operating program and the RAM is used to store data.

Also connected to the data address bus 85 is a PIA parallel interface 87 comprising PIA's numbers 1 and 2 and an ACIA serial interface 88. Connected to the ACIA serial interface 88 is a bit rate generator 89 under control of crystal 90 and a baud rate select connector 91. The PIA parallel interface 87 supplies appropriate signals to motor drive 92 to control the motor 93 of the printer 44. It also supplies appropriate signals to dot interface 94 and column interface 95.

Keyboard 12 is connected to the PIA parallel interface 87 and as previously described comprises the select switch 13, print switch 14, feed switch 15 and mode switch 16. The keyboard is also provided with on-line light 17, memory light 18, clock light 19 and threshold light 20. Power from the line 96 is supplied to filter 97, thence to power line module 98, transformer 99, then to 14 volt power supply 100 and 5 volt power supply 101, to which power on light 102 may be connected.

The Detector Module is disclosed in more detail with reference to the schematic circuits diagrams. The program is described with reference to the Printer Module flow charts and the program listings are contained in microfiche appendix B.

A general understanding of the capabilities of the invention may be gained by reference to FIG. 9 which is a schematic block diagram illustration of a "hardware" representation of the functions performed by the computer programs in the detector and printer modules of FIGS. 7 and 8. Referring to FIG. 9, the sync generator 77 and a plurality of quality detectors 39 are connected to the data source monitored 69. Thresholds are stored in threshold registers 105. The sync signal is supplied to a comparator 106 which compares the values of the quality detectors against the threshold values stored in the threshold registers 105, and if a threshold is exceeded, the event is recorded in a plurality of event registers 107 together with the time and date supplied by the clock 108. Most of the event registers have a portion which counts the number of sync pulses generated by sync generator 77 or clock pulses generated by clock 108 which occurs during the event so that when the event is terminated this information is also recorded in the event registers. Average registers 109 which may comprise shift registers, which store values to be averaged in each synchronous interval for a plurality of intervals, compute the average and supply the same to comparator 106. The comparator compares the averages supplied by the average registers 109 with the thresholds supplied by the threshold registers 105 and supply any that exceed threshold to the event registers 107. At the termination of each event the contents of the appropriate event register is stored in the worst events register 47, if they are not filled. However, if they are filled, then the event is compared by a second comparator 110 with the least worst (least significant) event stored in the appropriate worst events register 47 and if the new event is worse, it is stored in the worst event register. Each type of event has a separate event count register 48 which is incremented by the comparator 110 each time an event occurs. The last occurring event is stored in the last events register 49 which functions like a shift register so that eventually the last ten events (in the particular apparatus disclosed) are stored. Similarly predetermined number of blackout events consisting of time ON and time OFF are stored in the blackout events register 50. Thermal printer 111 may be used to set the clock 108 and the threshold registers 105 monitor ID and can request printout of the worst event registers 47, event count registers 48, last event register 49 and blackout event register 50 as well as print events as they occur.

OPERATION OF THE DETECTOR MODULE

Two LED indicator lights are provided to indicate the following:

The event light 8 indicates that an event has been received since memory reset. The power on light 7 indicates that the DETECTOR MODULE is receiving power. The CLEAR EVENT LIGHT push button 21 turns off the EVENT LIGHT if no event is in progress. The DIP switch 80 comprises four switches. Number 1 and 3 may be set to disconnect the battery during shelf storage. Number 2 prevents any further events from being recorded and thus protects the data being stored in memory.

An acoustic buzzer, the HIT alarm is activated by a one second minimum pulse width signal whenever an event occurs. It is defeatable by switch number 4 of DIP switch 80. The buzzer sounds continuously when the memory support voltage falls below a preset voltage. This signal is not defeatable by the operator. A switch is provided which places the memory in a hold status when desired.

The AC line conditions monitored are: Sag, Surge, High Average, Low Average. Information is gathered by sensing each half cycle of the line from the output of the power supply. The sensed value is transformer coupled, detected by a peak sensing track and hold amplifier followed by an 8 bit A/D converter. A maximum input to the A/D converter of 5.00 volts corresponds to an AC input of 240.4 volts peak (170 V RMS sinusoid) yields a maximum digital output of 255 binary (FF). The accuracy of measurement is ±3 bits which is ±2 volts RMS over the range of 70-160 volts RMS sinusoid.

Data is taken in a period of approximately 200 micro sec, centered about the voltage zero crossing of the line, as determined by the synchronizing signal.

The binary value from the track and hold A/D conversion is compared against threshold values preset by the operator and retained in memory in the following manner:

The Sag and Surge events are qualified by excursion beyond the preset threshold. The maximum excursion amplitude is recorded in 0-255 binary. The duration of the event in cycles is recorded in 0-1023 binary. The start time of the event to the second of real time is recorded. The total number of events in each category is recorded in 0-4095 binary. Each event is entered into "Last ten general events" register 49. Each event is tested by amplitude for entry into the worst ten events register 47 for each category of event. (FIG. 9).

Recording Low Average, High Average: the binary value from the track and hold A/D conversion is entered into an averaging register 109 which retains the mean value of the previous 32 half cycles. The mean value as updated each half cycle in the averaging register is compared with the operator selected threshold values for each category as follows:

An event is recorded when the mean value of the previous 32 half cycles exceeds the preset threshold. The maximum average amplitude is recorded in 0-255 binary. The duration of the event in seconds is recorded in 0-1023 binary. The start time of the event to the second of real time is recorded. The total number of events in each category is recorded in 0-4095 binary. The event is entered in "Last ten general events" register. The event is tested by amplitude for entry into worst ten events register for each category of event.

Figure 18B:
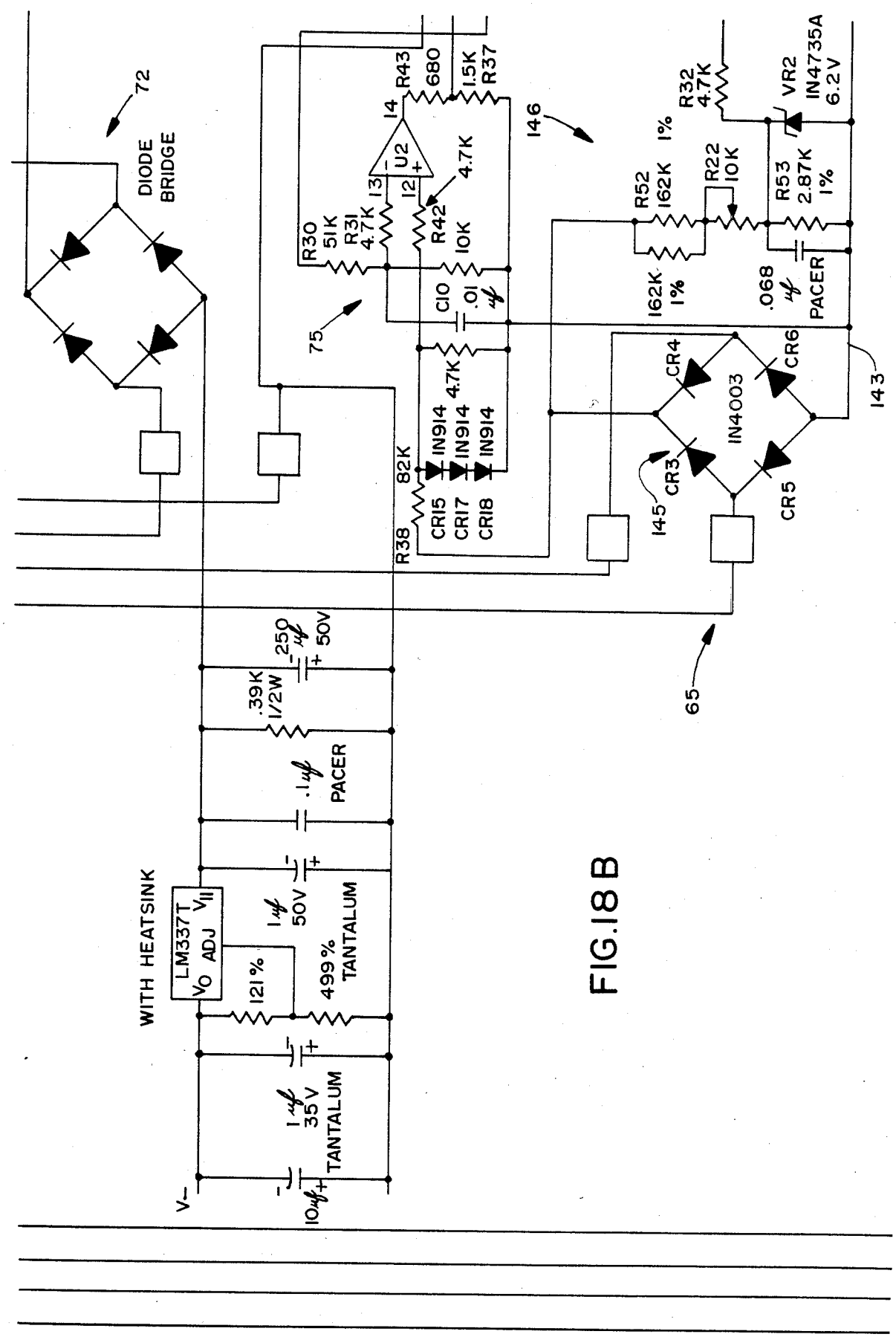
Figure 18C:
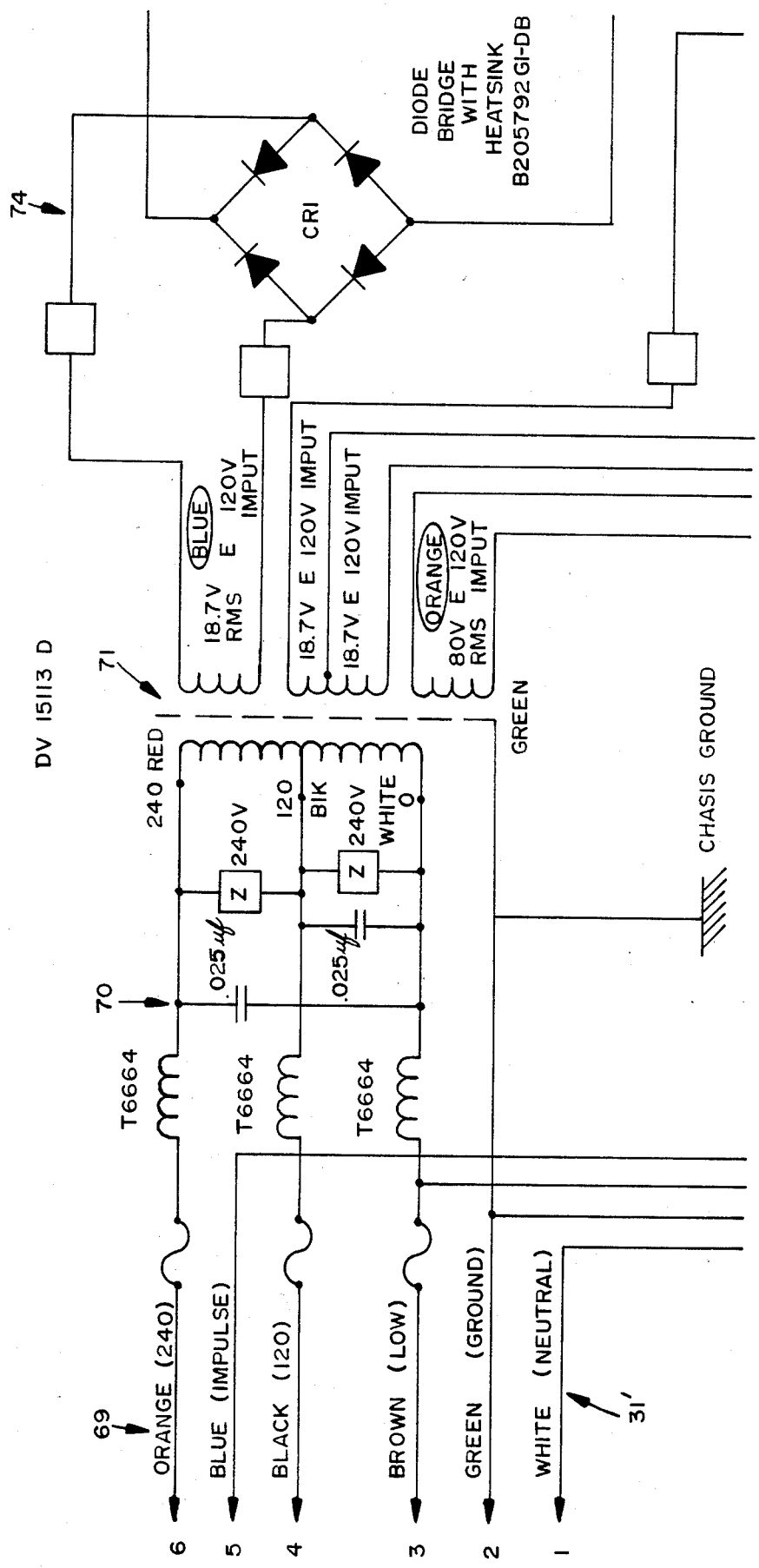
Figure 18D:
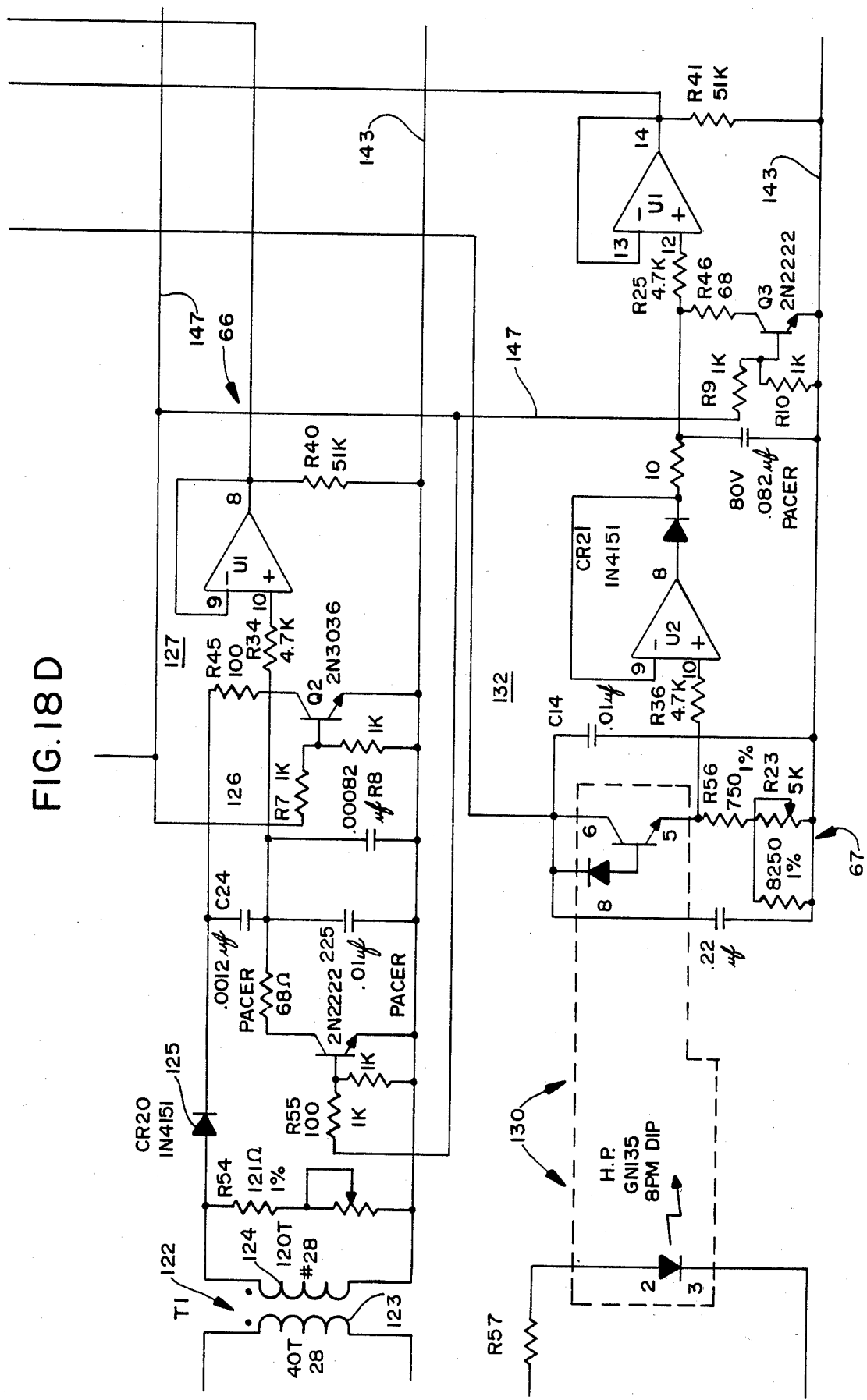
Figure 18E:
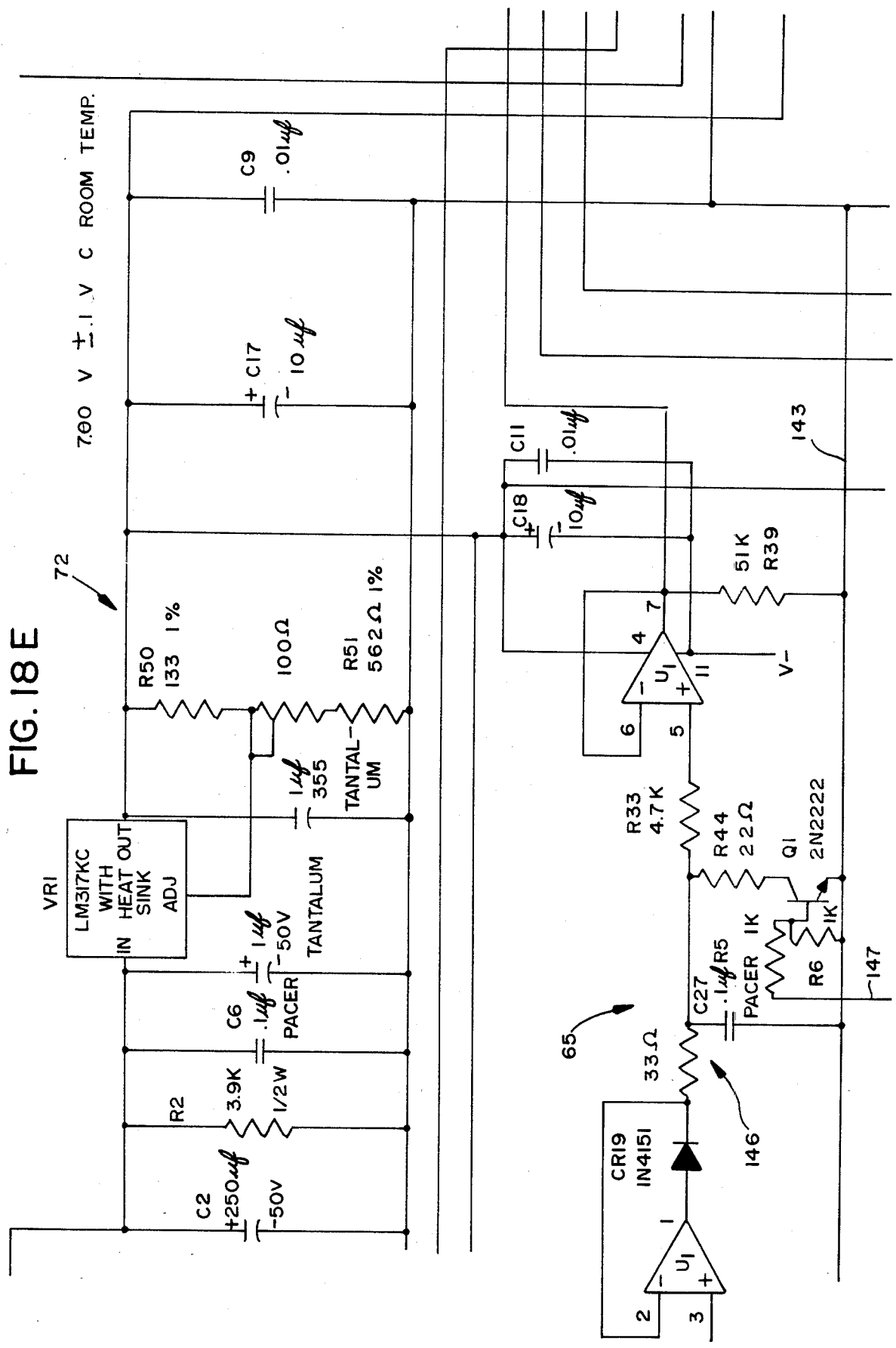
Figure 18F:
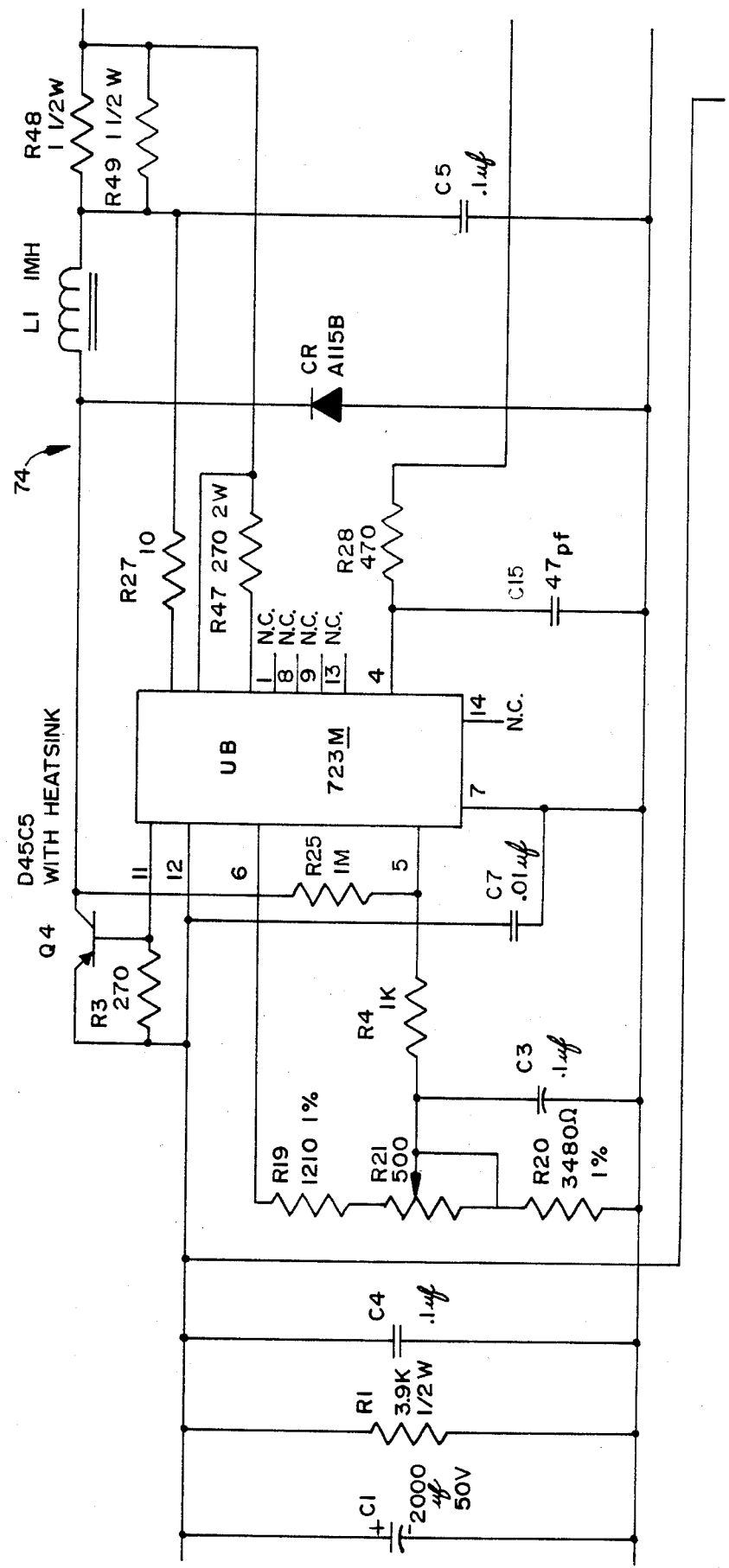
Figure 18G:
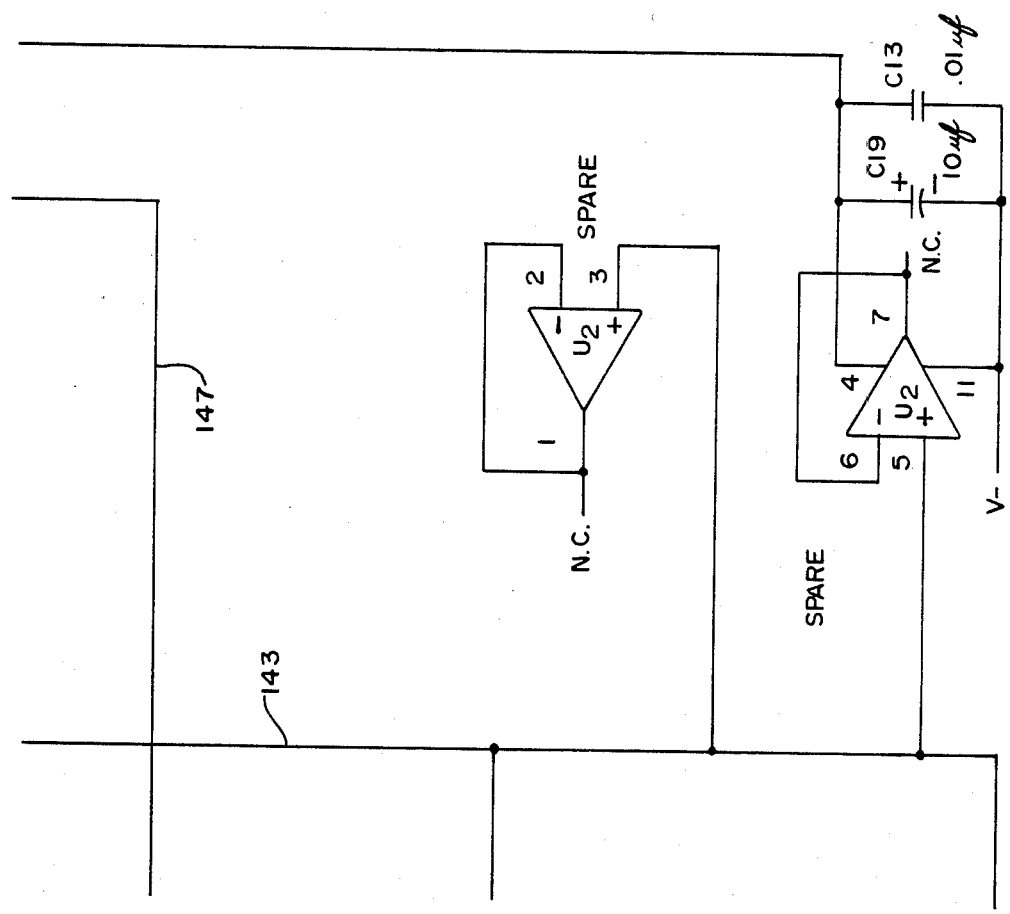

The AC line is Monitored for Impulse. Referring to FIGS. 18A and 18D, information is gathered through a high pass filter 120 feeding a rectifier 121 and current transformer 122 with a current proportional to the impulse voltage. A series R-C circuit 120 with a nominal time constant of 50 sec removes the 60 HZ component of line voltage. The remaining current is full wave rectified and passed through a low turn primary winding 123 of a ferrite current transformer 122. A current peak of 1 ampere corresponds to an impulse peak of 1,000 volts. The secondary of the current transformer 124 is resistively loaded producing a voltage proportional to a primary current. This voltage is fed via a low leakage blocking diode 125 to a capacitor divider network 126, which drives a track and hold amplifier 127.

The capacitor divider network C24 and C25, provide an attenuation ratio of approximately 10:1. This allows the voltage across the pulse transformer secondary 124 to have a maximum value in the order of 60 times the offset voltage of the blocking diode 125 while keeping the maximum input voltage to the track and hold amplifier 127 to approximately 5 volts. The result is improved linearity and reduction of temperature effects due to the diode 125.

The output of the track and hold amplifier 127 is multiplexed into the 8 bit A/D converter 40 following the evaluation of the common mode data.

The binary value from the track and hold A/D conversion is compared against the threshold value for impulse as preset and stored and is processed as follows: A/D conversion to 0-255 binary corresponding to 0-1020 volts peak. 1 μsec rise time to 50 μsec rise time. Events are qualified by excursion beyond the preset threshold. The maximum excursion amplitude in any one half cycle is recorded in 0-255 binary. The time of event to the second of real time is recorded. The total number of impulses is recorded in 0-4095 binary. The event is entered into "Last ten general events" register. The event is tested by amplitude for entry into ten worst events register for impulses.

The AC Line is monitored for common mode noise. The common mode voltage sensed is that appearing between the green safety ground wire and the grounded neutral conductor of a 3 phase, 5 wire system or the grounded center conductor (white, common) of a modern single phase 4 wire Edison system.

Referring to FIGS. 18A and 18D, the signal as described above is sensed via a high pass filter 128 feeding a full-wave rectifier 129 and a opto-isolator 130. The output of the opto-isolator 130 is peak sensed by a track and hold amplifier 132 and thence multiplexed into the 8 bit A/D converter following the evaluation of the half-cycle data. The response time of the opto-isolator 130 limits the upper frequency response of the common mode channel.

The binary value from the common mode track and hold A/D conversion is tested against a software stored threshold value and is processed as follows: A/D conversion to 0-255 binary with 255 corresponding to 32.0 volts peak. The threshold is internally set at 16 volts. An event is qualified by excursion beyond the 16 volt threshold. The maximum excursion amplitude in any event is recorded in 127-255 binary. The duration of the event in cycles is recorded in 0-1023 binary. The start time of an event to the second of real time is recorded. The total number of events is recorded in 0-4095 binary. Each event is entered into the "Last ten general events" register. Each event is tested by amplitude for entry into worst ten events register for common mode.

The AC line is monitored for blackout: because a blackout consists of a power off transient and a power on transient which may occur at widely separated times, the Blackhout condition has been separated into two events, Power off and Power on. The information to qualify a Blackout event of either kind is taken from the main power supply of the detector module.

Now referring to FIG. 15B, the unregulated power supply voltage is monitored in the detector module by a Schmitt trigger circuit associated with the power up logic. This circuit creates a processor interrupt when the line voltage drops below a preset voltage and thus causes the processor to enter an orderly shut down including termination of all events still in progress and store the same in memory along with the power off event. Hysteresis is included so that the Power on half of a Blackout event does not start until the voltage rises above a preset voltage.

The Blackouts events are processed as follows: an event is qualified by excursion beyond threshold as described above. The time of an event to the second of real time is recorded. The total number of events is recorded in 0-4095 binary. Each event consists of time off or event at time on. Each event is entered into last ten blackout register.

The AC line is monitored for Drop Out: A complete and abrupt drop out line voltage of less than one cycle will be monitored by the evaluation of the A/D circuitry in the manner of a Sag following the synchronization pulse. The synchronization pulse is generated when the instantaneous full wave rectified value of input voltage drops below a preset voltage. In the absence of a normal sync pulse, the timer 76 is enabled creating artificial pulses until the normal line voltage is reestablished or a blackout sequence is initiated.

The track and hold amplifier voltage is evaluated during a 75μ second interval after the synchronous pulse is received. The exact value digitized is dependent on rise time or fall time of the line voltage after the synchronous pulse has been developed.

Referring to FIG. 7, the CMOS RAM memory (1024×8) is made non-volatile by the use of a nickel-cadmium battery back-up circuit 43 under microprocessor control.

The last ten events register is maintained on a first in, first out basis without regard to amplitude, duration, or category of event. Black out information is not stored in this register.

In each event category, a worst ten events register is maintained in random sequence. Once a register is filled, each subsequent event is tested on an amplitude basis against the register contents and least significant event is replaced by the newly qualified event. When these registers are loaded into the printer, they are reassembled in the printer module into chronological order. The blackout register does not quantify or qualify the events, but retains them in chronological order.

The voltage thresholds for those event categories where the thresholds are operator selected are stored in non-volatile memory. The thresholds are stored in BCD format for echo back to the printer. They are stored in binary format, 0-255 for detector utilization. A range bit is also stored in the detector for Sag, Surge, low average and high average utilization. When the low average threshold as stored is less than 160 volts, the range bit is set to indicate a nominal 120 volt input connection. The printer then converts all binary voltage data by a factor 2/3, thus establishing a voltage range of 0-255 binary equal to 0-170 volts RMS. When a low average threshold is set for 160 volts or higher, the range bit is set to indicate a nominal 240 volt input connection. The printer then converts all binary voltage data by a factor of 4/3, thus establishing a voltage range of 0-255 binary equal to 0-340 volts RMS.

The real time calendar clock 611 is a BCD oriented CMOS device made non-volatile by the same battery back up circuit under microprocessor control as RAM memory. The clock is read every half cycle and its contents stored in a register to be appended to each event when initially qualified. The clock can be set to proper time by the printer control via the communications link. Military/European time format is used. Data format confusion is avoided by positive identification of month, day and year in that order. The clock rate is adjusted by a capacitor and is adjustable to 60 PPM or 5 seconds per day.

The clock is also used to generate a daily midnight signal. If the printer is connected and the system is in the memory mode, all events in progress are terminated and a complete memory print-out is executed. The memory is then reset and the detector is again active. If the printer is not active, or not in the memory mode, the midnight signal is ignored.

OPERATION OF THE PRINTER MODULE

Referring to FIG. 8, a twenty column thermal printer which may be a Texas Instrument Model EPN 9120 is used for all functional output information. Average printing rate is 1.5 lines per second. The basic energy drive circuitry for the dot thermal excitation is 11 milli-sec ON, 4 milli-sec OFF. The stepping motor drive logic provides two 8 msec pulses which overlap by 4 milli-sec plus a 4 milli-sec rest period. Four LED indicator lights are provided to indicate mode status:

On Line light 17, Memory light 18, Clock light 19, and Threshold light 20.

In the On Line mode, the printer is active, providing a printout of each event as it occurs in real time. Upon entry to the On Line mode, a header including current voltage, detector module ID number, thresholds and current data and time is printed followed by a listing of the last ten events from detector module memory. Thereafter events are printed as they occur, see sample printout, FIG. 10.

Upon entry into Memory mode, a header including the detector module ID number is printed and then the systems waits either for automatic midnight printout of memory followed by a memory reset or a print command to print current memory contents. The memory printout includes a header with thresholds and current data and time followed by memory printout, See sample printout, FIG. 11.

When the clock mode is entered, the data and time are immediately printed. Pressing the Select button 13, FIG. 8, enables the clock setting procedure, See sample printout, FIG. 12.

When the Threshold mode is entered, event voltage thresholds as stored in the detector module are printed. Pushing the Select button 13, enables the threshold setting procedure, See sample printout, FIG. 13.

After the Threshold mode setting procedure has been completed. the system automatically proceeds to the monitor ID number sub mode wherein the ID number currently assigned to the connected detector module is printed. Pushing the Select button 13 enables the ID number setting procedure, See sample printout, FIG. 13.

Four function pushbutton keys are provided to allow operator control of the system.

The interface integrity is under constant surveillance by the interface ACIA control device which will cause an error message to be generated at the printer end of the link if an error occurs or if all bits are not properly timed, etc. See sample printout, FIG. 14.

When no Detector Module is connected to it, the Printer stores no data except its own program. It is functionless until a Detector Module is connected to it.

Referring to FIG. 8, the mode lights 17, 18, 19 and 20, indicate the mode in which the printer is operating when a Detector Module is connected to it. If the ON LINE light 17 is illuminated the printer is in the ON LINE mode and causes the printer to print out the message shown in FIG. 10, that is the line voltage, the monitor identification number, the preset voltage thresholds for SAG, LO, HI, SURGE and IMPULSE, the data and time, the contents of the last ten events register and thereafter new events as they occur. Depressing the FEED button 15 merely advances the tape of the printer. Pressing the SELECT button 13 in the ON LINE mode results in bypassing event printing. Pressing the print button 14 causes line voltage printout. Pressing the MODE button 16 changes the mode to memory (pressing it again would change the mode to CLOCK).

In the MEMORY mode the Printer Module received from the Detector Module and prints the message shown in FIG. 11, comprising the title, the monitor identification number, and upon pressing the print button the voltage thresholds, the data and time, the number of times a SAG event has occurred, the day, time, volts and number of cycles of the worst ten SAG events; the same information with respect to SURGE events; the number of occurrences of LO-AVERAGE events; the day, time, volts and seconds of duration of the worst ten LO-AVERAGE events; the same information with respect to HI-AVERAGE events as LO-AVERAGE events; the number of IMPULSE events, the day, time and voltage of the worst ten IMPULSE events; the number of COMMON mode events, the day, time and number of cycles of the ten worst COMMON mode events; the number of BLACKOUT events, the day and time of each OFF or ON BLACKOUT event; the total number of events (identified as HITS) and the last ten events. While the select button is depressed, printout of the contents of the event registers is defeated. When the detector module is connected to the printer module there is an automatic memory printout at midnight followed by the reset of memory.

To reset the memory the PRINT and SELECT buttons 14 and 13 must be pressed simultaneoulsy when in the ON LINE mode and then held while the mode button is pressed.

Depressing the MODE pushbutton 16, changes the mode to from MEMORY to CLOCK. The date and time are printed out as shown in FIG. 12. The date and time may be printed again by depressing the PRINT button 14.

Pressing the SELECT button 13 places the unit in the clock setting mode, the words CLOCK SET are printed as shown in FIG. 12, and thereafter a ? is printed in the first digit position. The ? may be advanced to a digit which it is desired to change by depressing the SELECT button. Again, each time the SELECT button is pressed, the ? will be printed on the same line; that is the printer goes backwards and prints the ? on the same line until it advances to the digit to be selected. The digits such as 1 of the 21st day shown in FIG. 12 may be advanced one digit at a time by depressing the PRINT button. Thereafter the SELECT button is depressed the number of times required to go to the next digit to be changed and ultimately comes to the last digit which can be changed, in this case the units digit of the minutes. Depressing the SELECT button again causes the set date and time to be printed out followed by an *, the seconds being shown as 00. If the MODE button 16 is then pressed, the clock will be set to the new setting. If it is desired not to change the clock to the new setting, SELECT may again be depressed and the ? will occur in the tens digit for the month and the setting process can be run through again, or if the MODE button is then depressed with the ? in any position, the MODE will be changed to THRESHOLD and the clock will continue to run at the old setting.

In the THRESHOLD mode, the thresholds can be changed in the same way as the date and time in the CLOCK SET mode, by depressing the SELECT button to advance the ? and by depressing the PRINT button to advance a digit until the * appears as shown in FIG. 13, and thereafter depressing the MODE button. In this case the monitor identification number is then printed out and the words ID SET and the identification number may be changed in the same manner as date, and time and threshold. After the * occurs, the new identification number will be entered by depressing the MODE button and the mode will be changed to ON LINE.

DETECTOR MODULE SCHEMATICS

Figure 15A:
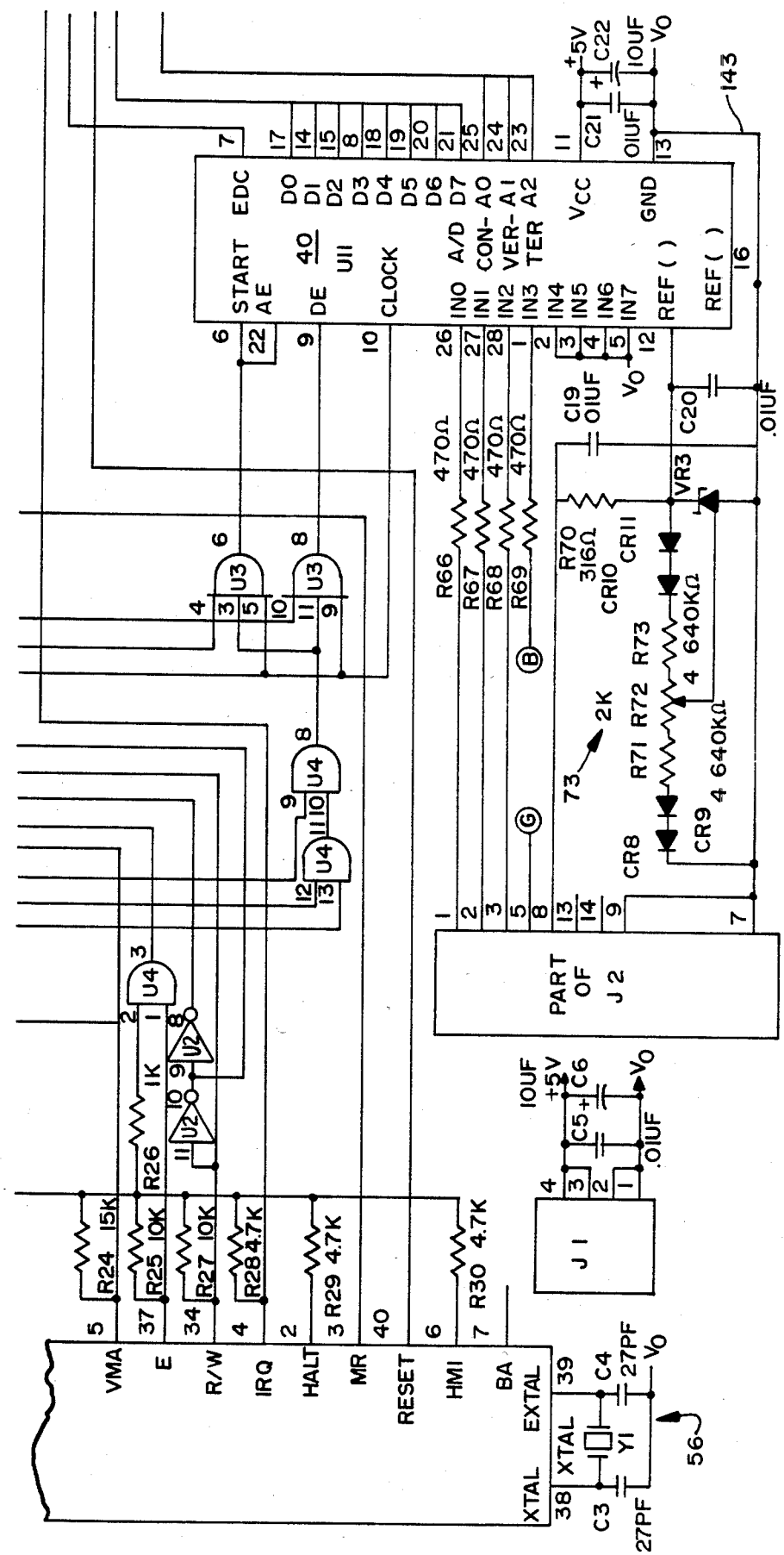
Figure 15:
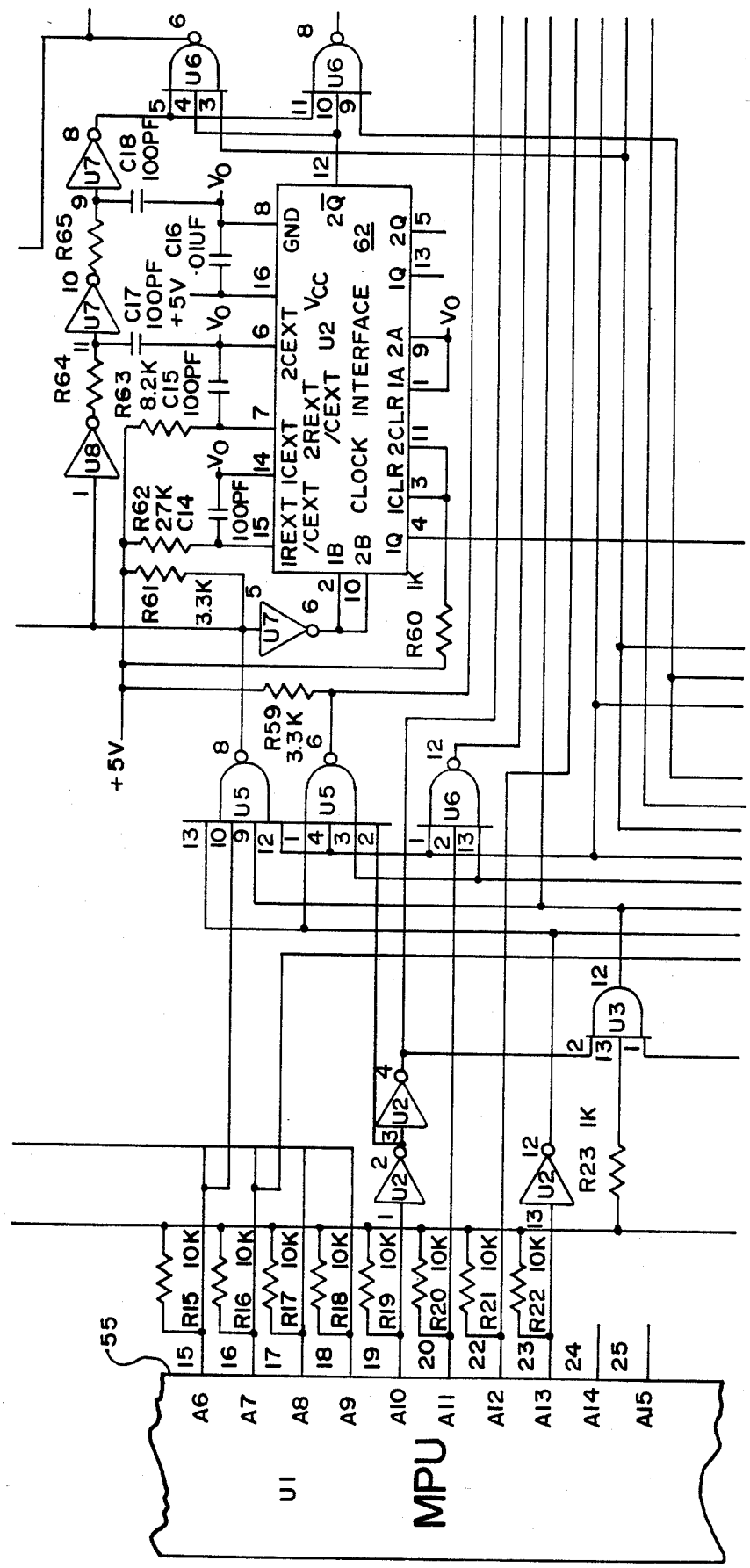
FIG. 15, comprising
Figure 15:
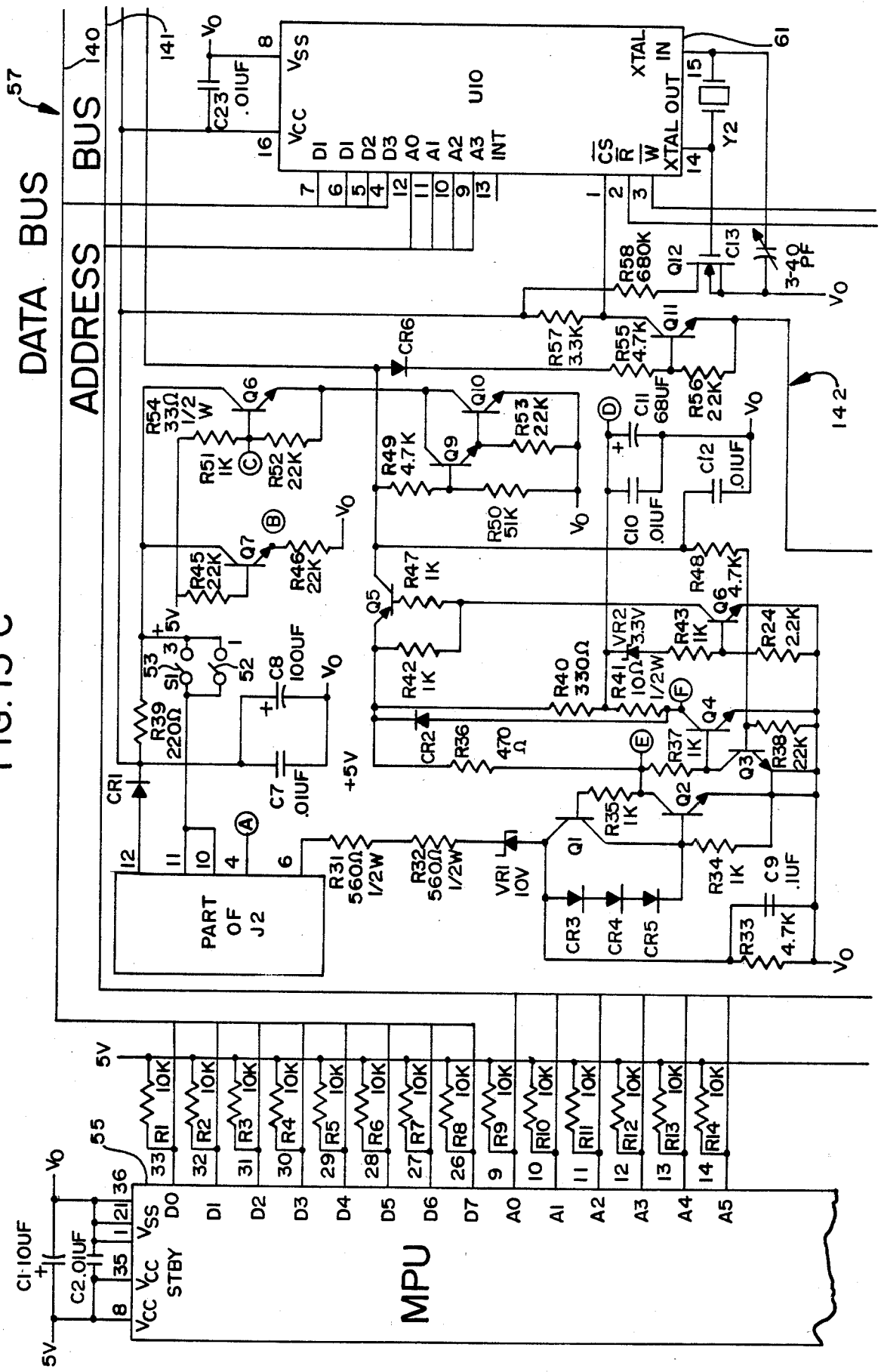
Figure 15:
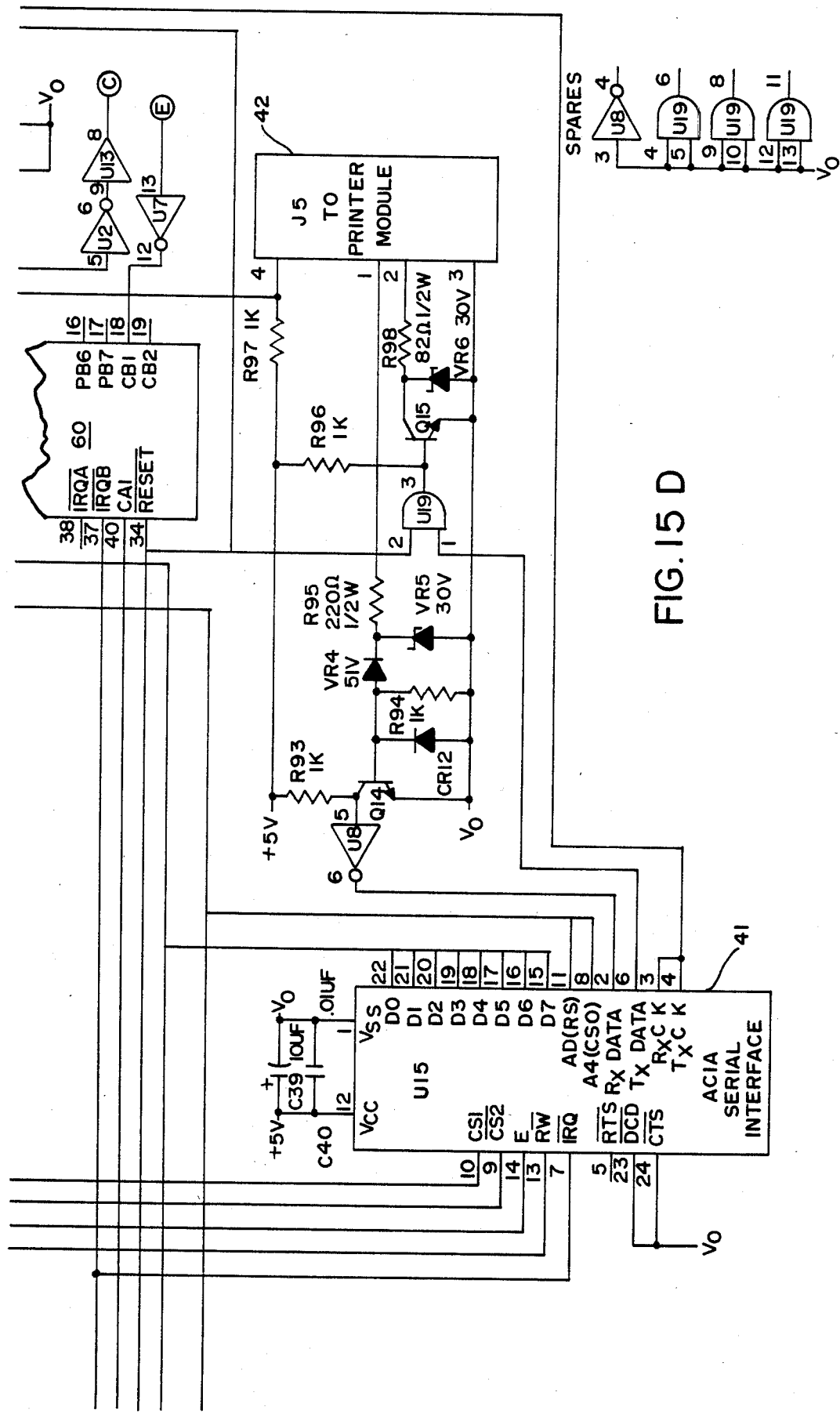
Figure 15:
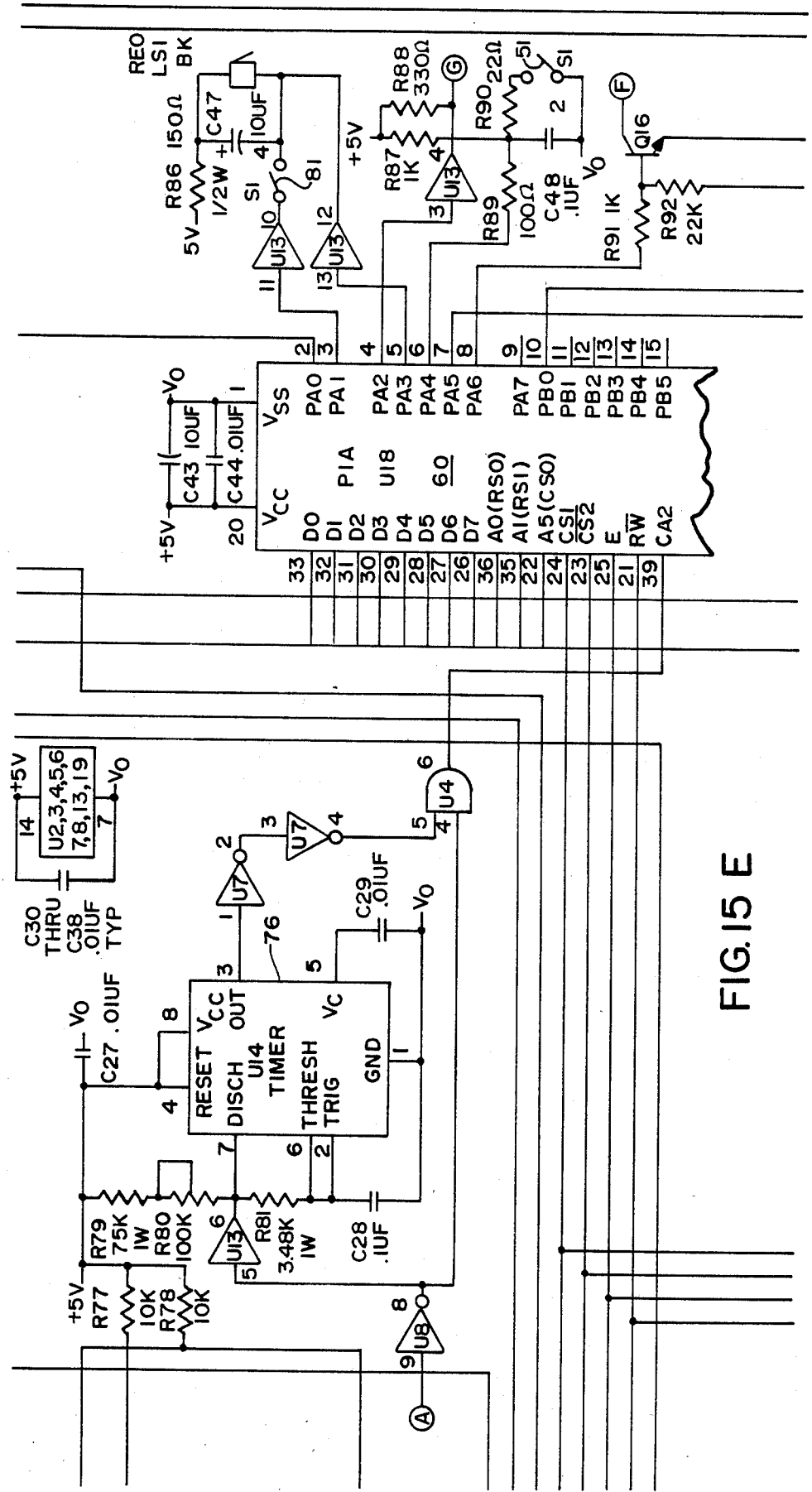
Figure 15:
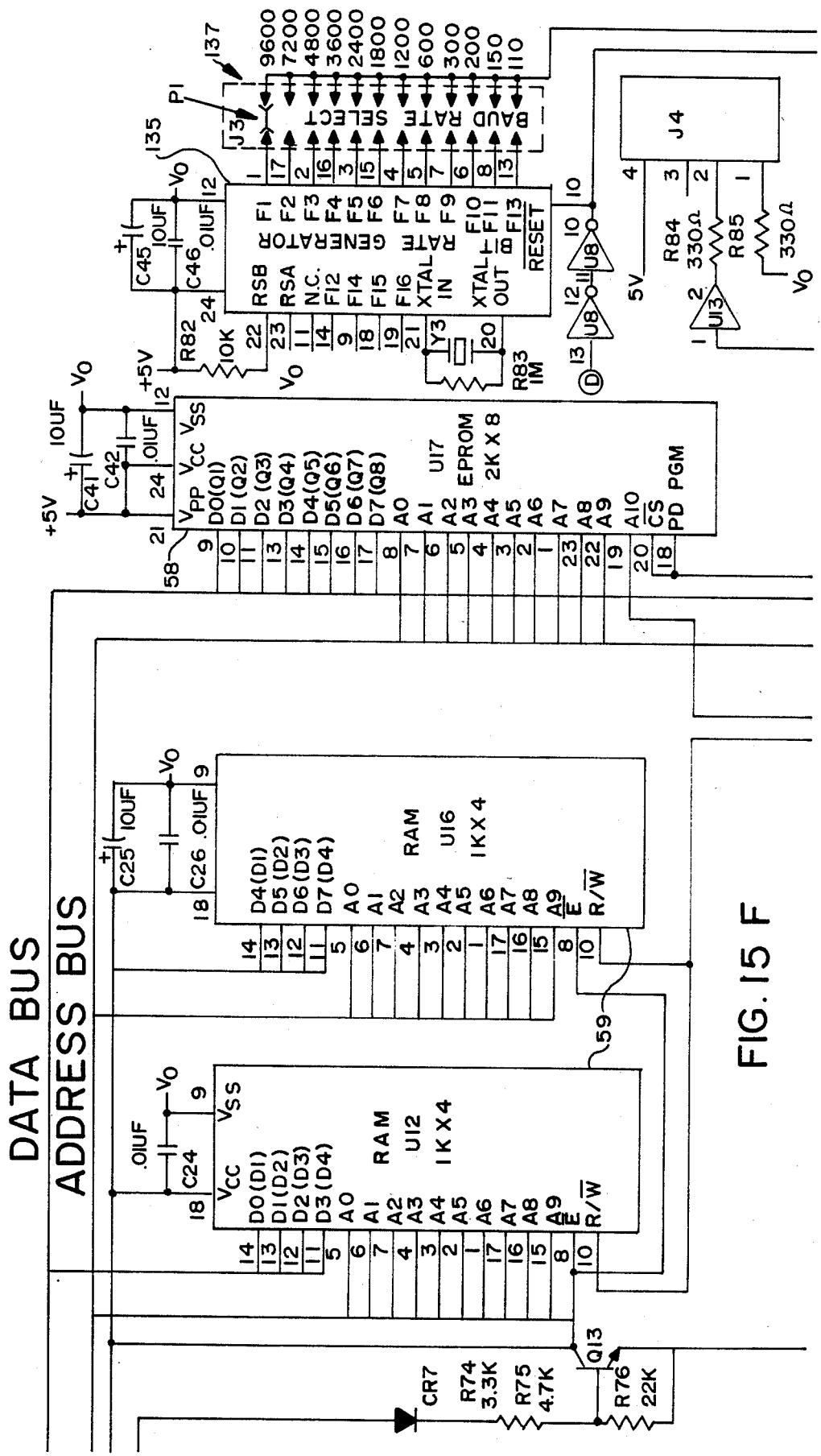
Figure 15:
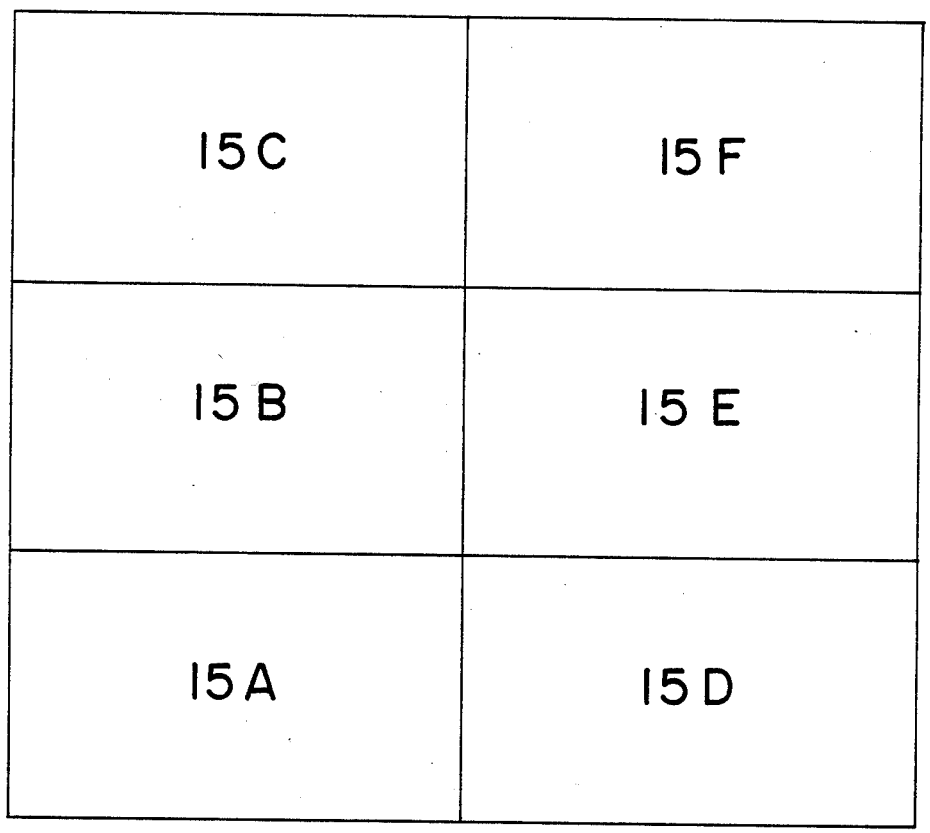

FIG. 15 is a schematic diagram of the digital portion of the detector module circuit. FIG. 18 is a schematic diagram of the analog portion. They are connected together at connectors J1 and J2 which appear on both diagrams. Connector J3 is the baud rate select connector 137. The baud rate may be varied from 110 to 9600. Connector J4 connects to the event light 8 and event alarm 77. The event light 8 has a locking relay software circuit associated therewith such that once it is turned on it stays on until the event light switch 21 which is connected to pin 4 of the J5 connector 42 is depressed.

The data/address bus 57 comprises a data bus 140 and an address bus 141 connected as shown.

The circuitry 142 in FIG. 15B controls orderly startup and shutdown of the microprocessor during blackouts. Thus circuit monitors pin 6 of connector J2 which is the unregulated 5 volt supply. When this rises to approximately 1.5 volts a reset signal is supplied to the microprocessor 55 which causes the microprocessor software to initialize the PIA. Thereafter when the voltage at pin 6 of J2 reaches approximately 4.4 volts the circuit enables the clock/calendar 61. The circuitry 124 also causes orderly shutdown at the beginning of a blackout in a well known manner.

Circuitry 142 also controls supply of battery backup to the calendar/clock 61 and RAM 59 during blackout. Switches 52 and 53 are utilized to disconnect the battery as previously described.

Now referring to FIG. 15A, ground 143 is utilized in the analog detectors 39 only to supply a basic reference to the analog-to-digital converter 40. A stable 5 volts is supplied to PIN 12 of the analog digital converter 40 by means of the temperature compensated zener diode ZR3 connected between PIN 12 and ground 143.

The remaining circuitry and the operation thereof will be apparent to one having ordinary skill in the microprocessor art.

FIG. 18 is a schematic circuit diagram of the analog circuitry of the detector module 3. In the upper left hand corner of FIG. 18C there is indicated a six terminal connector 31' prime which is the connector and the detector to which plug 30 is connected (FIG. 4) and is identical to Connector 31 on the printer module (FIG. 5). For 120 volt operation PINS 1 and 3 of connector 30' are connected to white, PIN 2 is connected to green, PINS 4 and 5 are connected to black and PIN 6 is not connected to anything. In the case of monitoring 240 volts, a separate supply cord 23 is provided in which its connector 30 is connected such that PIN 1 is connected to white, PIN 2 is connected to green, PIN 3 to black, PIN 4 no connection, and PINS 5 and 6 to red.

Figure 18H:
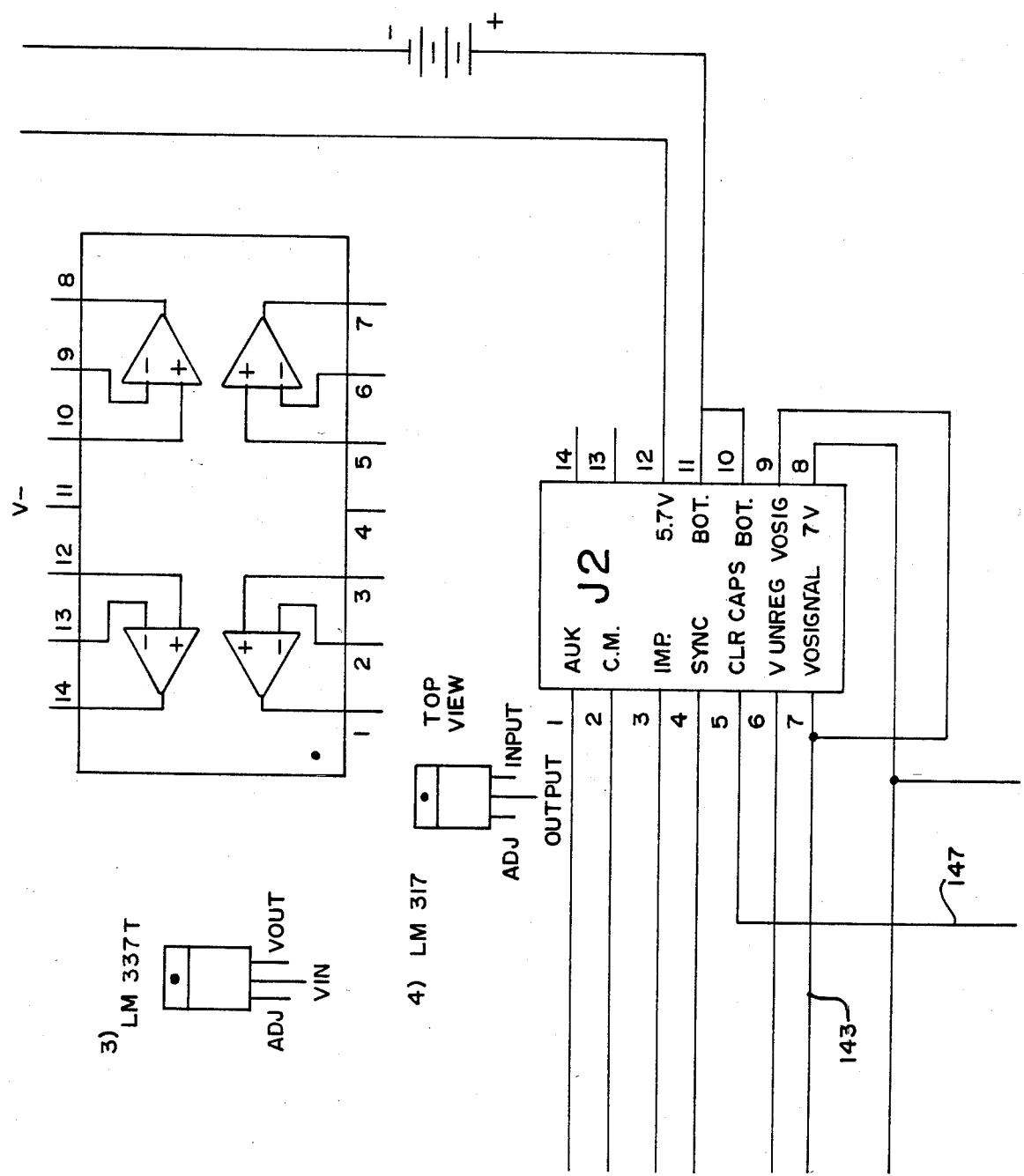

The connection of 240 volts and the 110 volt lines to the transformer 71 is such that the same output voltages appear across the secondaries of transformer 71 in both cases. The 7 volt 72 and 5 volt 74 power supplies of FIG. 18 are conventional. The impulse detector 66 and the common mode detector 67 have been previously described. Their output signals are supplied to pines 3 and 2 respectively of connector J2 (FIG. 18H). The sync circuit generally indicated at 75 in FIG. 18 B detects a zero crossover and supplies a pulse after each half wave to pin 4 of connector J2. The half cycle detector generally indicated at 65 in FIGS. 18B and 18E comprises full wave rectifier 145 and sample and hold circuitry generally indicated at 146. It supplies a signal indicating the peak voltage obtained in each half cycle to pin 1 or connector J2. Each of the sample and hold circuits of the half wave detector 65, the impulse detector 66 and the common mode detector 67 are reset by discharging their storage capacitors via line 147 connected to pin 5 of J2.

It should be noted that the impulse and common mode detectors 66 and 67 respectively, take their inputs directly from the power line, whereas the half wave detector 65 takes its signal from the transformers 71 after the low pass filter 70 which filters out any impulse noise.

DETECTOR MODULE PARTS LIST Digital board

Below are listed the types and values of the parts employed in the apparatus of FIG. 15.

| REF SYM | DESCRIPTION |
|---|---|
| | PRINTED WIRING BOARD |
| C1,6,22,25,39 C41,43,45,47 | CAP. 10UF 20V |
| C2,5,7,10,12,16,19 C20,21,23,24,26,27 C29-38,40,42,44,46 | CAP. .01UF 50V |
| C3,4 | CAP. 27PF 1000V |
| C8 | CAP. 100UF 10V |
| C9,28,48 | CAP. .1UF 80V |
| C11 | CAP. 68UF 15V |
| C13 | CAP. TRIM 3 40PF |
| C14,15,17,18 | CAP. 100PF 1000V |
| CR1,2 | DIODE 1N4001 |
| CR3-12 | DIODE 1N914 |
| J1,4,5 | CONNECTOR 4 PIN |
| J2 | SOCKET, DIP |
| J3 | CONNECTOR MINI JUMPER |
| S1 | BUZZER |
| P1 | PLUG MINI JUMPER |
| Q1,5 | TRANSISTOR 2N2907 |
| Q2-4 6-11 13-16 | TRANSISTOR 2N2222 |
| Q12 | TRANSISTOR 3N170 |
| R1-22,25,27,77 R78,82 | RES. 10K OHM 5% ¼W |
| R23,26,34,35,37,42,43 R47,51,60,87,91,93,94 R96,97 | RES. 1K OHM 5% ¼W |
| R24 | RES. 15K OHM 5% ¼W |
| R28-30,33,48,49,55,75 | RES. 4.7K OHM 5% ¼W |
| R31,32 | RES. 560 OHM 5% ¼W |
| R36,66-69 | RES. 470 OHM 5% ¼W |
| R38,45,46,52,53 R56,76,92 | RES. 22K OHM 5% ¼W |
| R39 | RES. 220 OHM 5% ¼W |
| R40,84,85,88 | RES. 330 OHM 5% ¼W |
| R41 | RES. 10 OHM 5% ¼W |
| R44 | RES. 2.2K OHM 5% ¼W |
| R50 | RES. 51K OHM 5% ¼W |
| R54 | RES. 33 OHM 5% ¼W |
| R57,59,61,74 | RES. 3.3K OHM 5% ¼W |
| R58 | RES. 680K OHM 5% ¼W |
| R62 | RES. 27K OHM 5% ¼W |
| R63 | RES. 8.2K OHM 5% ¼W |
| R64,65 | RES. 180 OHM 5% ¼W |
| R70 | RES. 316 OHM 1% ¼W |
| R71,73 | RES. 4640 OHM 1% ¼W |
| R72 | RES. VAR 2K OHM ¾W |
| R79 | RES. 75K OHM 1% ¼W |
| R80 | RES. VAR 100K OHM ¾W |
| R81 | RES. 3480 OHM 1% ¼W |
| R83 | RES. 1M OHM 5% ¼W |
| R86 | RES. 150 OHM 5% ¼W |
| R89 | RES. 100 OHM 5% ¼W |
| R90 | RES. 22 OHM 5% ¼W |
| R95 | RES. 220 OHM 5% ¼W |
| R98 | RES. 82 OHM 5% ¼W |
| U1 | I.C. MC6808P |
| U2 | I.C. 74LS04 |
| U3 | I.C. 74LS11 |
| U4 | I.C. 74LS08 |
| U5 | I.C. 74LS22 |
| U6 | I.C. 74LS10 |
| U7,8 | I.C. 74LS14 |
| U9 | I.C. 74LS123 |
| U10 | I.C. MM58174 |
| U11 | I.C. ADC0809CCN |
| U12,16 | I.C. HMI-6514C-9 |
| U13 | I.C. 7417 |
| U14 | I.C. SE555 |
| U15 | I.C. MC6850P |
| U17 | I.C. MCM2716C |
| U18 | I.C. MC0321P |
| U19 | I.C. 740SCC |

-continued

| REF SYM | DESCRIPTION |
|---|---|
| U20 | I.C. MC14411P |
| VR1 | DIODE ZENER 10V IN4740A |
| VR2 | DIODE ZENER 3.3V IN4728A |
| VR3 | DIODE ZENER LM336Z-5.0 |
| VR4 | DIODE ZENER 5.1V IN4733A |
| VR5,6 | DIODE ZENER 30V IN4751 |
| XU1,18 | SOCKET DIP 40 |
| XU10 | SOCKET DIP 16 |
| XU11 | SOCKET DIP 28 |
| XU12,16 | SOCKET DIP 18 |
| XU15,17,20 | SOCKET DIP 24 |
| Y1 | CRYSTAL 4.0 MHZ |
| Y2 | CRYSTAL 32.768 KHZ |
| Y3 | CRYSTAL 1.8432 MHZ |

The values of the components of FIG. 18 are as shown on the schematic.

Printer Module Schematics

Figure 16A:
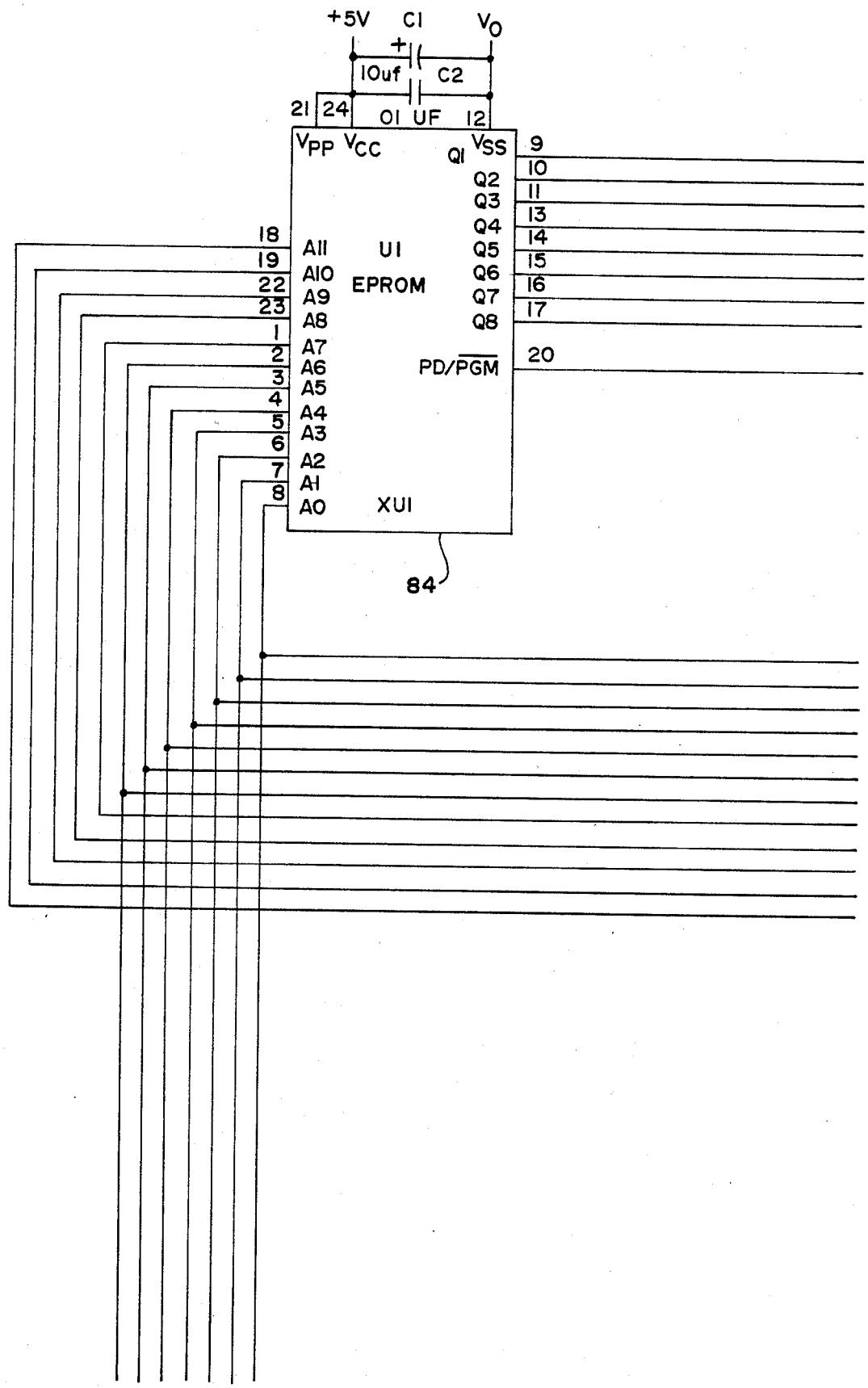
FIGS. 16A, 16B, 16C and 16D, is a partial schematic diagram of the Printer Module of FIG. 8.
Figure 16B:
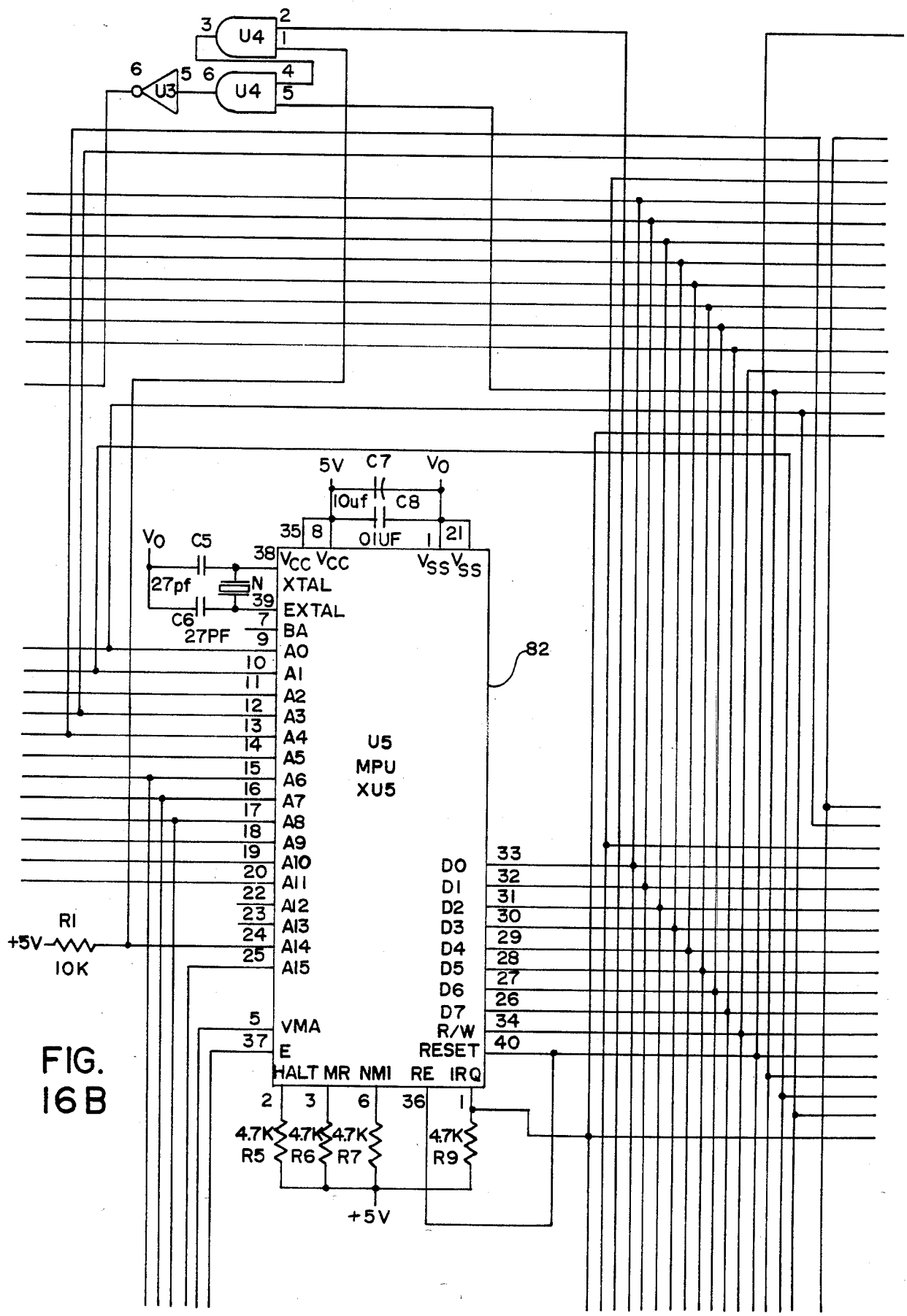
Figure 16:
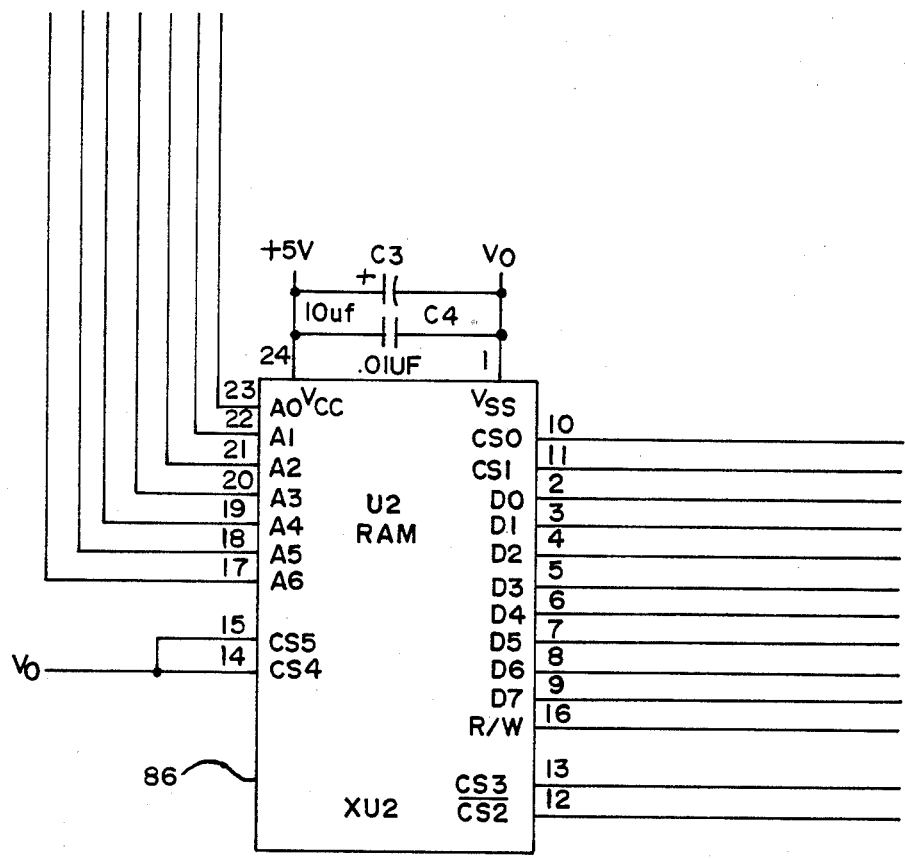
FIG. 16, comprising
Figure 16:
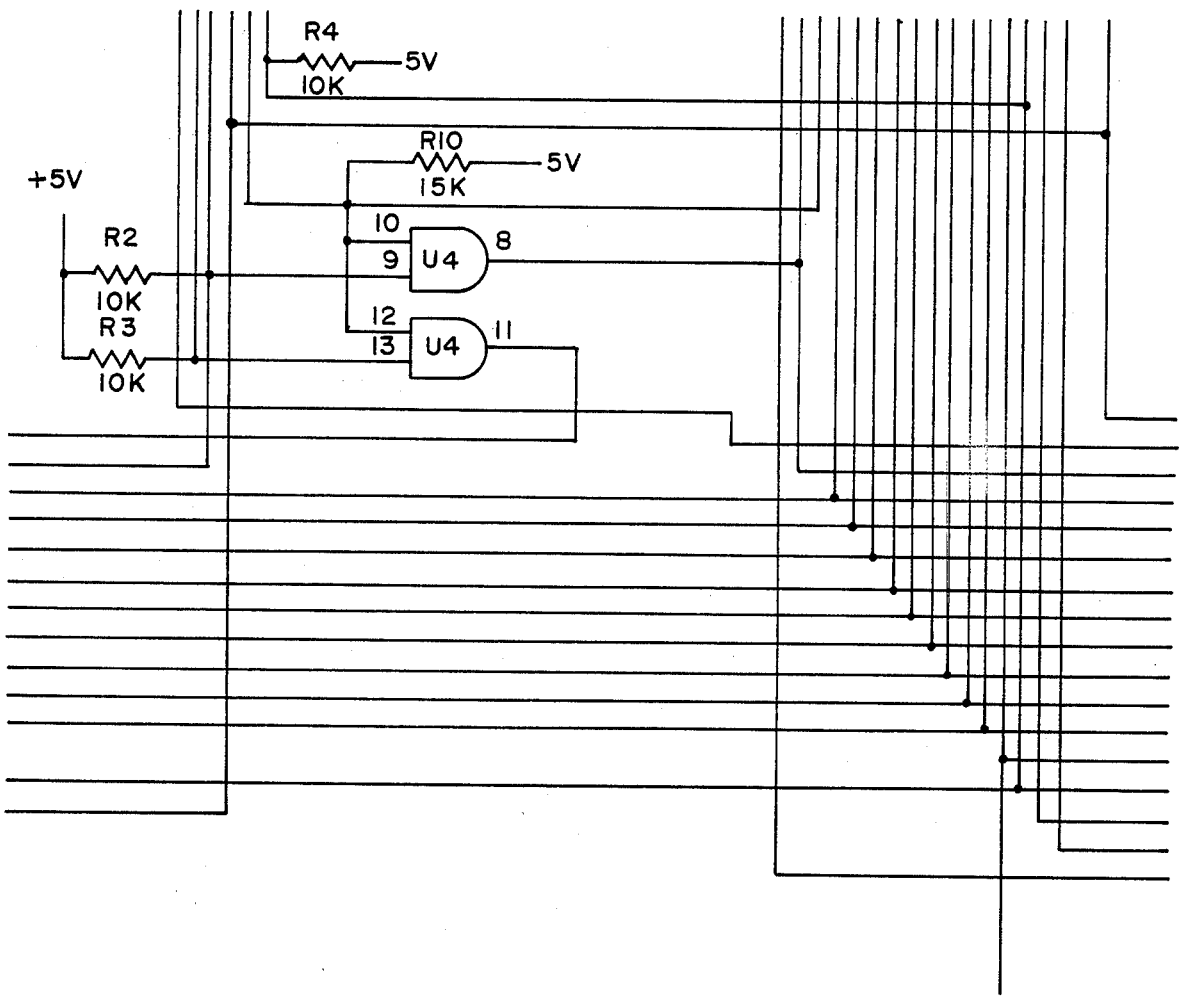
Figure 16F:
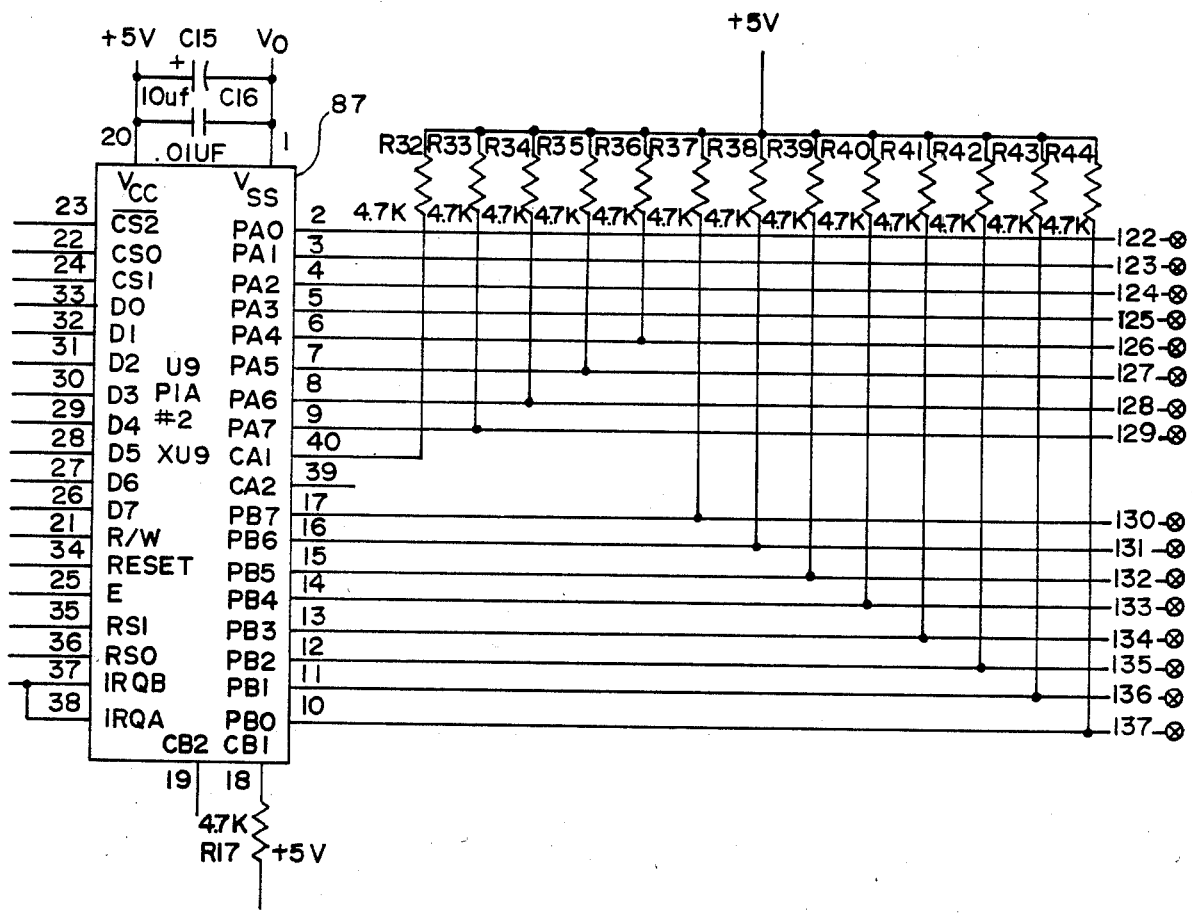
FIG. 16E is a diagram showing how FIGS. 16A, 16B, 16C and 16D may be placed together to form FIG. 16.
Figure 16:
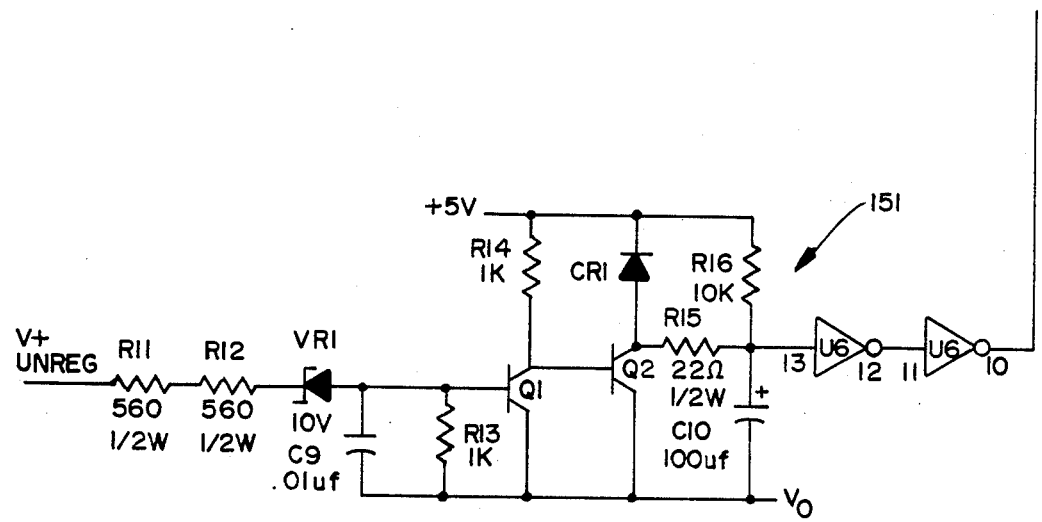
Figure 16:
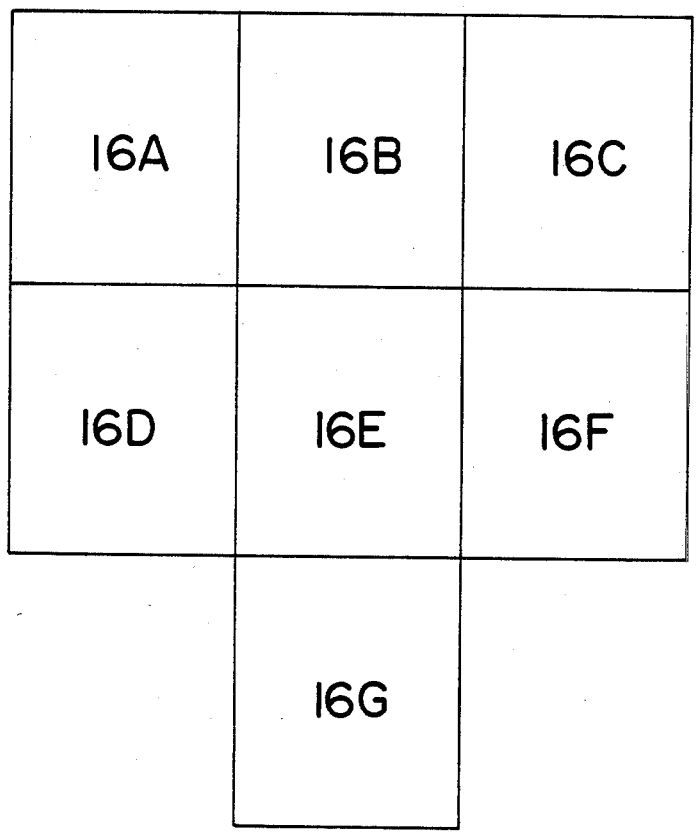
Figure 17:
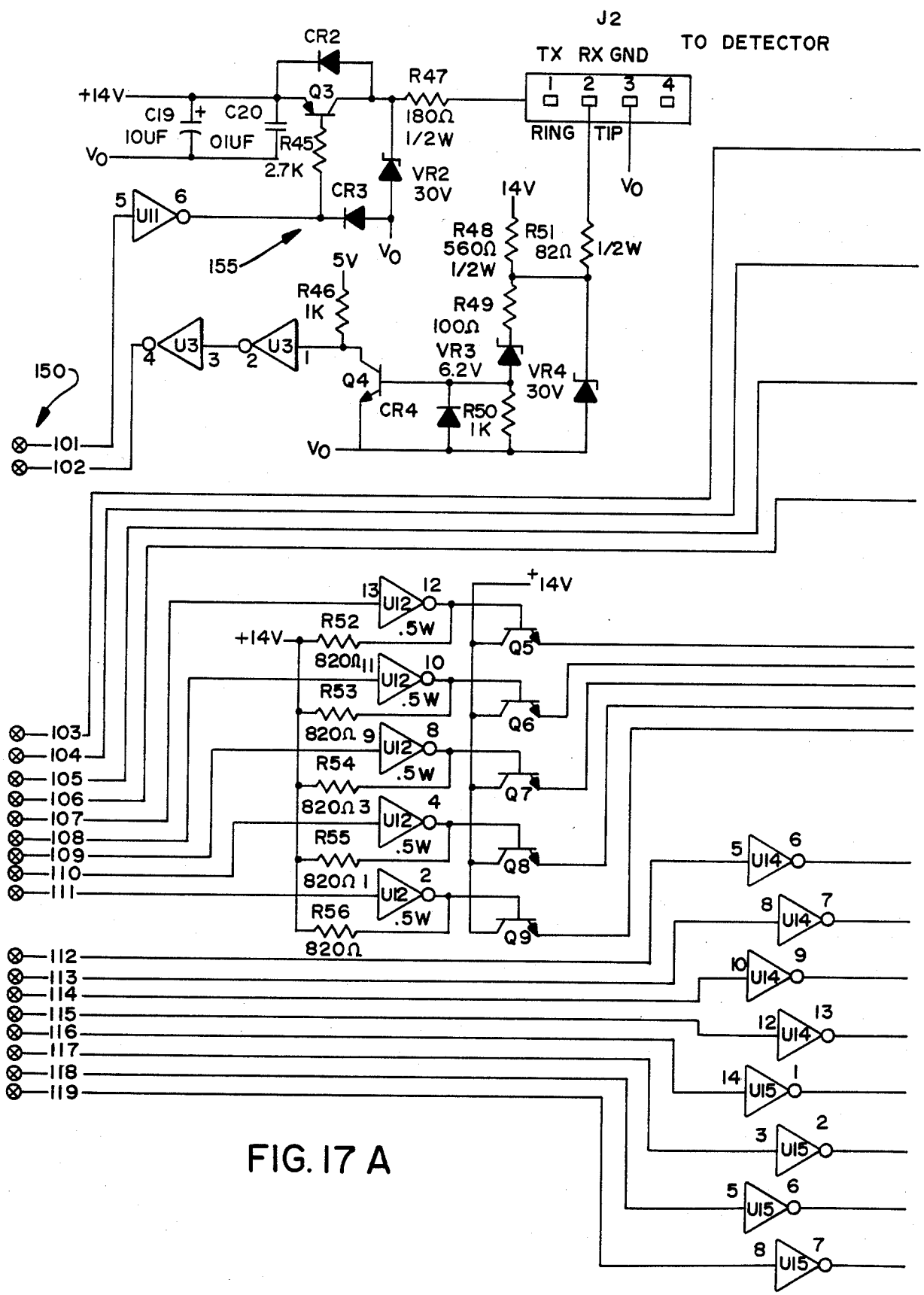
FIG. 17, comprising

FIGS. 15 and 17 comprise a schematic diagram of the printer module 4. FIGS. 16 and 17 connect together at the numbered connections generally indicated at 150 in FIGS. 16C and 17A.

Reset circuitry generally indicated at 151, FIG. 16D, restarts the printer microprocessor after BLACKOUTS. It is connected to the unregulated 110 volt power supply generally indicated at 152 in FIG. 16C. The 14 volt power supply 153 and 5 volt power supply 154 are conventional.

Now referring to FIG. 17 communications circuitry generally indicated at 155 is connected to the detector through terminal J2 and the communications cable.

Figure 17B:
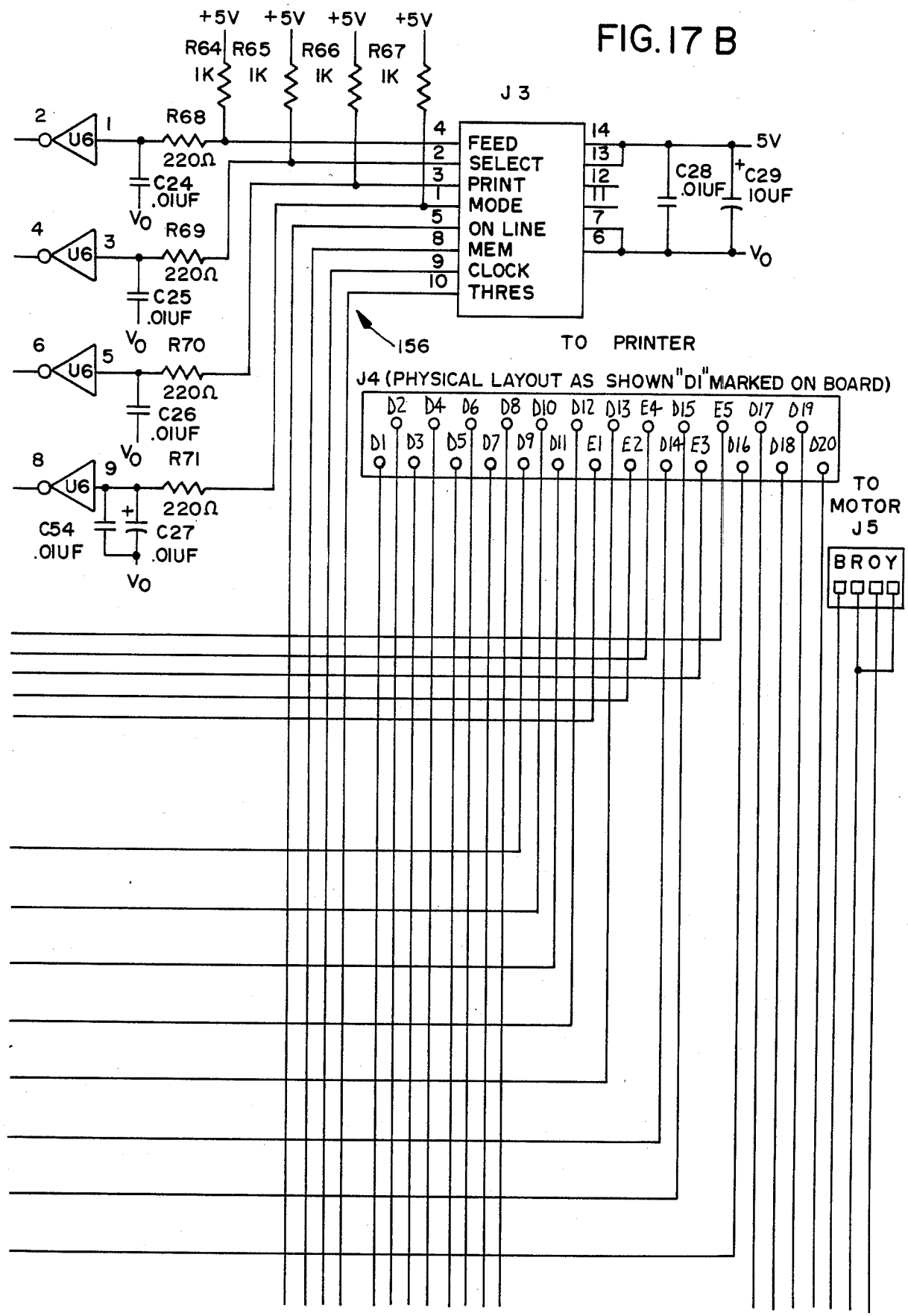
Figure 17:
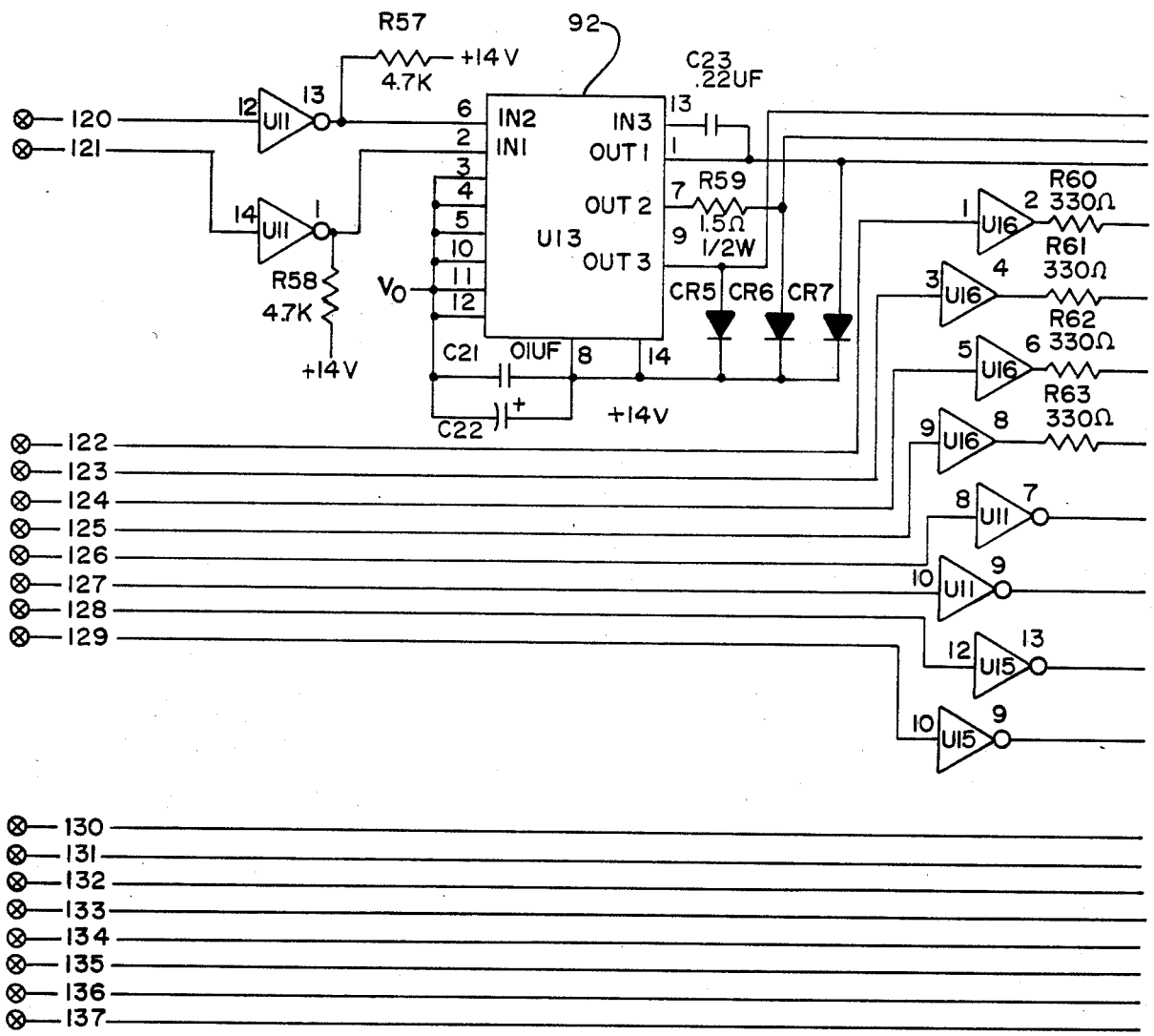

Keyboard 12 is connected to the PIA through terminal J3 of FIG. 17B and buffering circuitry generally indicated at 156. The motor drive 92 (FIG. 17A) is connected to the printer through connector J5. The printer motor is connected to connector J5 (FIG 17B). The printer 44 is connected to the dot interface 94 and column interface 95 through connector J4 (FIG. 17B). The "D" terminals are the column interface terminals and the "E" terminals are the dot interface terminals. The thermal printer 11 may be a Texas Instrument Model EPN9120. The inverters U14, U15, U16, and U17 of FIGS. 17A and 17B form the interface 94 and column interface 95.

PRINTER MODULE PARTS LIST

| REF SYM. | DESCRIPTION |
|---|---|
| | PRINTED WIRING BOARD |
| C1,3,7,11,13,15,17,C19,27,29 | CAP., 10uf, 20V |
| C2,4,8,9,12,14,16,18 C20,21,24–26,28,32,33 C36,38–41,43,47,49–54 | CAP., .01uf, 50V |
| C5,6 | CAP., 27pf, 1000V |
| C10 | CAP., 100uf, 10V |
| C22 | CAP., 27uf, 20V |
| C23 | CAP., 22uf, 80V |
| C30 | CAP., 2000uf, 50V |
| C31,35,42,44,46 | CAP., .1uf, 80V |
| C34,45 | CAP., 47pf, 1000V |
| C37 | CAP., 2000uf, 25V |
| C48 | CAP., 1500uf, 12V |
| CR1 | DIODE, 1N4001 |
| CR2-7 | DIODE, 1N914 |
| CR8 | DIODE, BRIDGE |
| CR9,10 | DIODE, A1158 |
| J1 | CONNECTOR, MINI JUMPER |
| J2,5 | CONNECTOR, 4 PIN |
| J3 | SOCKET, DIP, 14 PIN |

-continued

PRINTER MODULE PARTS LIST

| REF SYM. | DESCRIPTION |
|---|---|
| J4 | CONNECTOR, PRINTER |
| J6,7 | CONNECTOR, FAST-ON |
| L1,2 | CHOKE, INDUCTOR |
| P1 | PLUG, MINI JUMPER |
| R90 | RES., YAR., 600Ω, ¾W |
| R91 | RES., 480Ω, 1% ¼W |
| R98 | RES., 3.9KΩ, 5%, ¼W |
| R92 | RES., 270Ω, 10%, 2W |
| R93 | RES., 470Ω 5%, ¼W |
| R89 | RES., 1210Ω, 1%, ¼W |
| U1 | I.C. E PROM 7532 |
| U2 | I.C. MCM5810P |
| U3,U6 | I.C. 74LS14 |
| U4 | I.C. 74LS08 |
| U5 | I.C. M06802P |
| U7 | I.C. 6850 |
| U8,U9 | I.C. 6821 |
| U10 | I.C. MC14411P |
| U11,14,15,17 | I.C. 75492A |
| U12 | I.C. 7406 |
| U13 | I.C. TL370C |
| U16 | I.C. 7417 |
| U18,19 | I.C. 723 |
| VR1 | DIODE, ZENER 10V, 1N4740A |
| VR2,4 | DIODE, ZENER 30V,1N4751 |
| VR3 | DIODE, ZENER, 6.2V,1N4735A |
| XU1,2,7,10 | SOCKET, DIP, 24 PIN |
| XU5,8,9 | SOCKET, DIP, 40 PIN |
| Y1 | CRYSTAL, 4.0 MHZ |
| Y2 | CRYSTAL, 1.8432 MHZ |
| Q1,2,4 | TRANSISTOR, 2N2222 |
| Q03,11 | TRANSISTOR, 2N2907 |
| Q5-9 | TRANSISTOR, TIP120 |
| Q10,12 | TRANSISTOR, D45C5 |
| | HEAT SINK, Q10,Q12,CR8 |
| R1-4,16 | RES., 10KΩ, 5%, ¼W |
| R5-7,17-20,22-44,9 R57,58,73 | RES., 47KΩ, 5%, ¼W |
| R10 | RES., 15KΩ, 5%, ¼W |
| R11,12,46 | RES., 560Ω, 5%, ¼W |
| R13,14,46,50,64-67 R75,77,88 | RES., 1KΩ, 5% ¼W |
| R15 | RES., 22Ω, 5%, ¼W |
| R21,74,87 | RES., 1NΩ. 5% ¼W |
| R45 | RES., 2.7KΩ, 5%, ¼W |
| R47 | RES., 180Ω, 5%, ¼W |
| R49 | RES., 100Ω, 5%, ¼W |
| R50 | RES., 82Ω, 5%, ¼W |
| R52-56 | RES., 820Ω, 5% ¼W |
| R59 | RES., 1.5Ω, 5%, ¼W |
| R60-63,97 | RES., 330Ω, 5%, ¼W |
| R68-71 | RES., 220Ω, 5%, ¼W |
| R72,86 | RES., 270Ω, 5%, ¼W |
| R76 | RES., 470Ω, 10%, 2W |
| R78 | RES., 1690Ω, 1%, ¼W |
| R79 | RES., 1.755Ω, 1%, ¼W |
| R80,94 | RES., 10Ω, 5%, ¼W |
| R81-85 95 96 | RES., 1Ω, 5%, ¼W |

DETECTOR MODULE COMPUTER PROGRAM

The computer program used in the Detector Module microprocessor achieves the operating characteristics set forth above. The program comprises background and foreground operating modes from which all indicated computer tasks are derived. Each mode is defined in detail in the functional flow chart of FIGS. 19 through 42.

A complete understanding of the detector module program requires an understanding of the printer module program as well, since both modules function as a unit.

For additional information the reader is referred to the assembled listings of the Detector and Printer Module Computer Programs set forth in the Appendix.

Detector Module Software Operating Modes

Foreground mode software processes the highest priority time dependent tasks. Foreground mode processing is triggered by a hardware interrupt, i.e. sync pulse going high which normally occurs at the start of each ½ cycle of AC line voltage. All foreground mode processing is completed before the next ½ cycle starts and is enabled or disabled by the "clear" and "set" interrupt mask instructions respectively.

The high priority time dependent tasks are:

(1) Activation of the "Hit Light" the first time an event qualifies.

(2) Activation of the "Hit Alarm" from the start of qualification of each event to approximately one second after the last event terminates.

(3) Reading of the A/D #1 terminal which equals Peak Voltage. This is used for "Sag", "Surge", "Lo-Avg." and "Hi-Avg." event sensing.

Reading of the A/D #2 terminal which equals Common Mode Voltage.

Reading of the A/D #3 terminal which equals Impulse Voltage.

(4) Updating a 32 byte first-in-first-out register which contains the peak voltage readings of the previous 32 half cycles. After each half cycle an average for 16 cycles is computed and is used for "Lo-Avg." and "Hi-Avg." event sensing.

(5) Reading the A/D #4 terminal which equals Battery voltage and sounding "Hit Alarm" if voltage is outside safe battery limits.

(6) Detection and processing of line condition events, namely, "Sag", "Surge", "Lo-Avg.", "Hi-Avg.", "Impulse", "Common Mode" and "Black Out". Various event combinations can be qualified at the same time with each event having a different start and stop time. Event processing includes:

(a) Qualification of event via comparison to threshold value.
  (b) Holding event in a current event buffer during the time the event is qualified.
  (c) Recording of event start time.
  (d) Determining the worst magnitude of event from half cycle to half cycle while event is qualified.
  (e) Determining event duration.
  (f) Determining if the current event just ended is more significant than any of the events stored in the associated 10 worst case event register and if so replacing the least significant with the current.
  (g) Updating the "last event" register on a first-in-first-out basis.

(7) Detection of a change-of-day (i.e 00:00:00 time) and printing the 10 worst events stored in each event category and clearing the event memory if the Printer Module is connected and set to the "memory" mode.

(8) Loading a print buffer for real-time printing of events when the printer is connected and "on-line".

(9) Determining printer overflow, i.e. when the events happen at a rate faster than the printer module can process them.

Background Mode software processes all other tasks of the detector module not included in the foreground mode. The background mode operates during power turn-on and after initialization is completed and during this time from the completion of one foreground mode to the start of the next foreground mode. This time interval cam be anywhere from 1.5 to 6.5 MSEC depending on event activity in the foreground mode. These other tasks are:

(1) Communication with the Printer Module and checking for invalid transmission caused by framing, parity and overrun errors or an incorrect echo back of serial data.

(2) Decoding and processing of certain command words (8 bit codes) sent by the printer module to start the following tasks:

| | COMMANDS |
|---|---|
| Word (Hex) | Task |
| "F0" | Spare |
| "F1" | Detector Module reset and start up. Clears worst case event registers, initializes various software pointers, switches and tables and enables foreground mode. |
| "F2" | Transmits "on-line" events to printer module. |
| "F3" | Transmits "Memory" events to printer module. |
| "F4" | Transmits real-time clock/calendar data to printer module. |
| "F5" | Transmits voltage threshold data to printer module. |
| "F6" | Transmits line voltage and the 240/120 voltage range indicator to printer module. |
| "F7" | Transmits 10 worst case event registers to printer module at 00:00:00 time. |
| "F8" | Indicates printer module connected and operating in memory mode. |
| "F9" | Receive and load monitor ID number. |
| "FA" | Transmits monitor ID number to printer. |
| "FB" | Receive and load voltage threshold data in BCD and compute threshold values in binary and store in detector current event registers. |
| "FC" | Spare |
| "FD" | Special code transmitted to printer module to produce "printer overflow" message. |
| "FE" | Receive and load clock/calendar data. |
| "FF" | Spare |

(3) On power start-up, initializing ACIA and PIA, test if battery failed while power was down and perform appropriate initialization of detector.

Data Formats

The following data formats are used in both the Detector and Printer Module.

| SCALED BINARY VOLTAGE THRESHOLDS COMMUNICATION | | |
|---|---|---|
| WORD NUMBER | FORMAT | MESSAGE TYPE |
| | Bit Number: 7 6 5 4 3 2 1 0 | |
| 1 | x x x x x x x x | SAG THRESHOLD |
| 2 | x x x x x x x x | SURGE THRESHOLD |
| 3 | x x x x x x x x | LO-AVG THRESHOLD |

| | | |
|---|---|---|
| 4 | x x x x x x x x | HI-AVG THRESHOLD |
| 5 | x x x x x x x x | IMPULSE THRESHOLD |

"VOLTAGE THRESHOLDS" COMMUNICATION

| WORD NUMBER | FORMAT | MESSAGE TYPE |
|---|---|---|
| | Bit Number: 7 6 5 4 3 2 1 0 | |
| 1 | 0 0 0 0 x x x x | SAG HUNDREDS |
| 2 | 0 0 0 0 x x x x | SAG TENS |
| 3 | 0 0 0 0 x x x x | SAG UNITS |
| 4–6 | 0 0 0 0 x x x x | LO-AVG (SAME AS WORD #1–3) |
| 7–9 | 0 0 0 0 x x x x | HI-AVG (SAME AS WORD #1–3) |
| 10–12 | 0 0 0 0 x x x x | SURGE (SAME AS WORD #1–3) |
| 13–15 | 0 0 0 0 x x x x | IMPULSE (SAME AS WORD #1–3) |

"MONITOR ID NUMBER" COMMUNICATION

| WORD NUMBER | FORMAT | MESSAGE TYPE |
|---|---|---|
| | Bit Number: 7 6 5 4 3 2 1 0 | |
| 1 | 0 0 0 0 x x x x | ID NUMBER THOUSANDS |
| 2 | 0 0 0 0 x x x x | ID NUMBER HUNDREDS |
| 3 | 0 0 0 0 x x x x | ID NUMBER TENS |
| 4 | 0 0 0 0 x x x x | ID NUMBER UNITS |

INPUT AND AVERAGE VOLTAGE COMMUNICATION

| WORD NUMBER | FORMAT | MESSAGE TYPE |
|---|---|---|
| | Bit Number: 7 6 5 4 3 2 1 0 | |
| 1 | 0 0 0 0 0 0 0 x | WHERE x = 0 for 120 Volts  x = 1 for 240 Volts |
| 2 | x x x x x x x x | AVERAGE VOLTAGE FROM 32 ½ CYCLE REGISTER |

"CLOCK" DATA COMMUNICATION

| WORD NUMBER | FORMAT | MESSAGE TYPE |
|---|---|---|
| | Bit Number: 7 6 5 4 3 2 1 0 | |
| 1 | 0 0 0 0 x x x x | SECONDS UNITS |
| 2 | 0 0 0 0 x x x x | SECONDS TENS |
| 3 | 0 0 0 0 x x x x | MINUTES UNITS |
| 4 | 0 0 0 0 x x x x | MINUTES TENS |
| 5 | 0 0 0 0 x x x x | HOURS UNITS |
| 6 | 0 0 0 0 x x x x | HOURS TENS |
| 7 | 0 0 0 0 x x x x | DATE UNITS |
| 8 | 0 0 0 0 x x x x | DATE TENS |
| 9 | 0 0 0 0 x x x x | DAY OF WEEK |
| 10 | 0 0 0 0 x x x x | MONTHS UNITS |
| 11 | 0 0 0 0 x x x x | MONTHS TENS |
| 12 | 0 0 0 0 x x x x | YEAR TENS |
| 13 | 0 0 0 0 x x x x | YEAR UNITS |

"ON-LINE" EVENTS COMMUNICATION

| WORD NUMBER | FORMAT | | |
|---|---|---|---|
| | Bit Number: 7 | 6 5 4 | 3 2 1 0 |
| 1 | x  CHANGE OF MONTH INDICATOR | x x x  EVENT CODE | x x x x  DATE UNITS |
| | Bit Number: 7 6 | 5 4 | 3 2 1 0 |
| 2 | x x  DATE TENS | x x  HOURS TENS | x x x x  HOURS UNITS |
| | Bit Number: 7 6 5 | 4 3 2 1 | 0 |
| 3 | MINUTES TENS | MINUTES UNITS | EXTENSION OF SECONDS TENS FROM WORD #4 |
| | Bit Number: 7 6 | 5 4 3 2 | 1 0 |
| 4 | x x  SECONDS TENS | x x x x  SECONDS UNITS | x x  EXTENSION OF DURATION FROM WORD #6 |
| | Bit Number: | 7 6 5 4 3 2 1 0 | |
| 5 | | x x x x x x x x  EVENT MAGNITUDE | |
| 6 | | x x x x x x x x  EVENT DURATION | |

EVENT CODE TABLE

| CODE | EVENT |
|---|---|
| 000 | SAG |
| 001 | SURGE |
| 010 | LO-AVG |
| 011 | HI-AVG |

| | -continued | |
|---|---|---|
| | 100 | IMPULSE |
| | 101 | COMMON MODE |
| | 110 | BLACK OUT |
| | 111 | LOST EVENT |

"MEMORY" PRINTING COMMUNICATION

| WORD NUMBER | FORMAT |
|---|---|
| 1 | Bit Number: 7 6 5 4 3 2 1 0<br>x x x x x x x x<br>EVENT EXTENSION OF HIT<br>CODE COUNT FROM WORD #2 |
| 2 | Bit Number: 7 6 5 4 3 2 1 0<br>x x x x x x x x  HIT COUNT |
| 3–8 | SAME AS WORD #1–6 OF "ON LINE" EVENTS COMMUNICATION) |
| 9–14 | " |
| 15–20 | " |
| 21–26 | " |
| 27–32 | " |
| 33–38 | " |
| 39–44 | " |
| 45–50 | " |
| 51–56 | " |
| 57–62 | " |
| 63 | HEX "FF" TERMINATION CHARACTER |

The program interprets the sync pulse at PIA 60 (FIG. 7) as an interrupt and goes to the foreground mode (FIGS. 34 through 42). A number of indicators are checked in the foreground routine. The first (FIGS. 34 and 35) determine whether an event is in process, for example, if there is a blackout and another event was continuing. As soon as the blackout power-off happens we want to terminate the event in progress, but not ignore it. There is also a change of day indicator. At 00:00:00, i.e. 12 o'clock midnight, there is a complete printout. If the Printer Module is connected to the Detector Module there is a reset of the memory of the Detector Module. The detector does not go ahead and dump its memory to the printer unless the "Printer Memory Mode Indicator" is set. There are other indicators that need to be looked at so that the detector knows for sure that the printer is connected.

When we enter the foreground mode there could be an event in progress (the Foreground Mode being entered every 8 milliseconds). There is an indicator in FIG. 34 labeled "indicator" in turn on hit alarm set. Obviously if "yes" it turns on; if "no" it bypasses. The program then determines if the event hit alarm was on for the allotted duration of time. It is set to be on for approximately one second after the event terminates. So if it is on we turn if off and turn off its indicator. Now we read the A-D channel for peak voltage during the previous half cycle and save that for SAG and SURGE sensing. Now there is a first-in-first-out register saving the 32 previous readings of the peak voltage. So when the new value of peak voltage is read the program goes to "Update peak voltage register on first-in-first-out basis and calculate average from register values and save it for low average and high average sensing". (FIG. 34) Then we read the A-D for the impulse voltage and save it for impulse sensing. A reset signal is then sent to reset the Track and Hold capacitors.

The program now checks to see if the Event Defeat Switch 51 (FIG. 7) is set. (FIG. 35) Assuming it isn't, the program clears that indicator. The program then checks to see if the hit light clear or CLEAR EVENT LIGHT switch 21 is depressed and if so, it turns the EVENT light 8 off. We read the time from the real time clock. Then we store the month, date, hours, minutes and seconds in a register in the MPU. Then we check to see if the time we read from the clock is midnight. Assuming "no" the program proceeds to the sub-routine of FIG. 36.

Every time the tens digit of the minutes on the clock changes, a load is put on the battery for a period of one second and while this load is on the battery, the battery voltage is checked. If the battery voltage is less than some minimum value the event alarm is turned on and kept on until the tens digit of the minutes on the clock changes and the battery voltage is okay.

Figure 37:
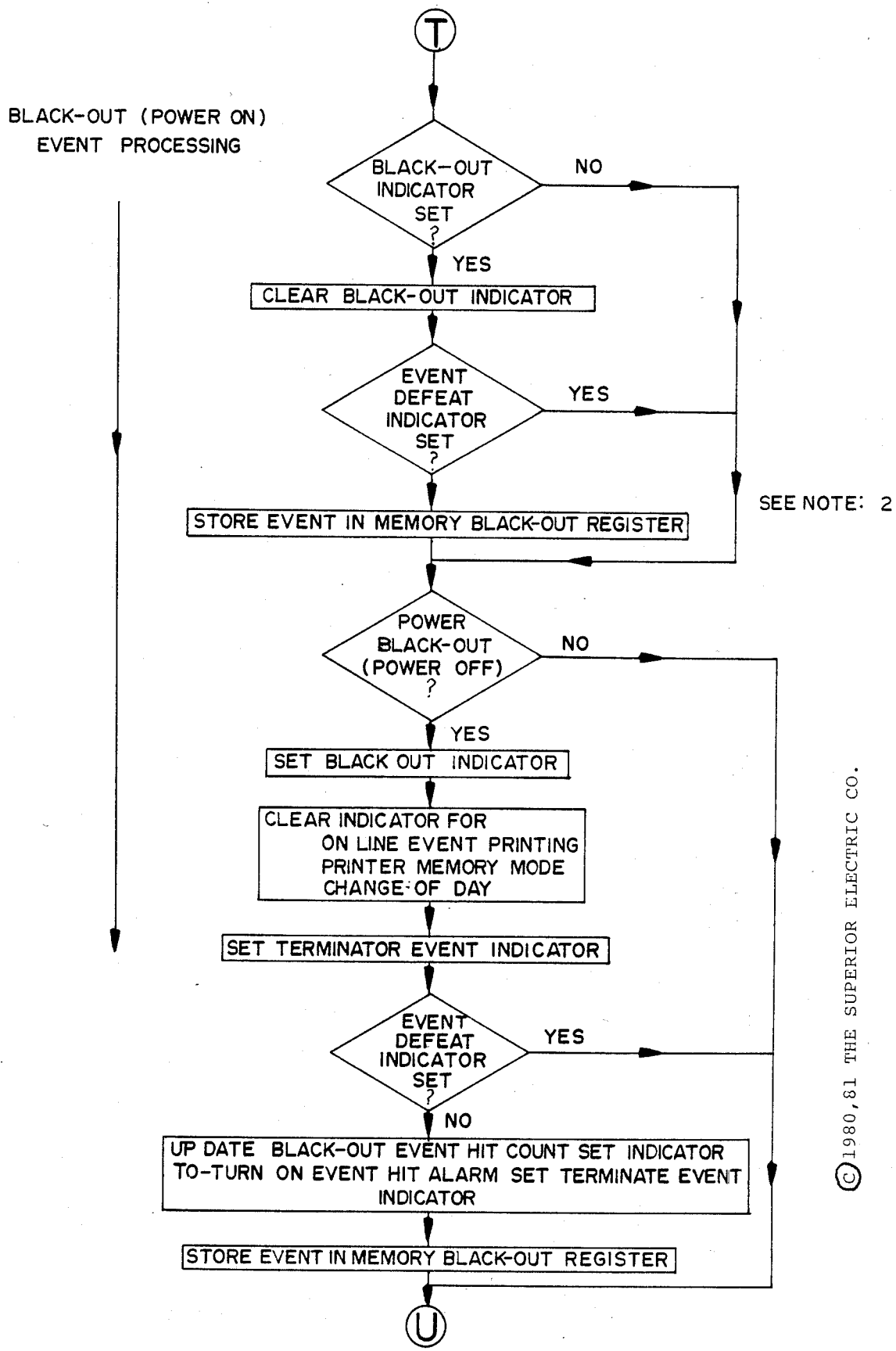
Figure 38:
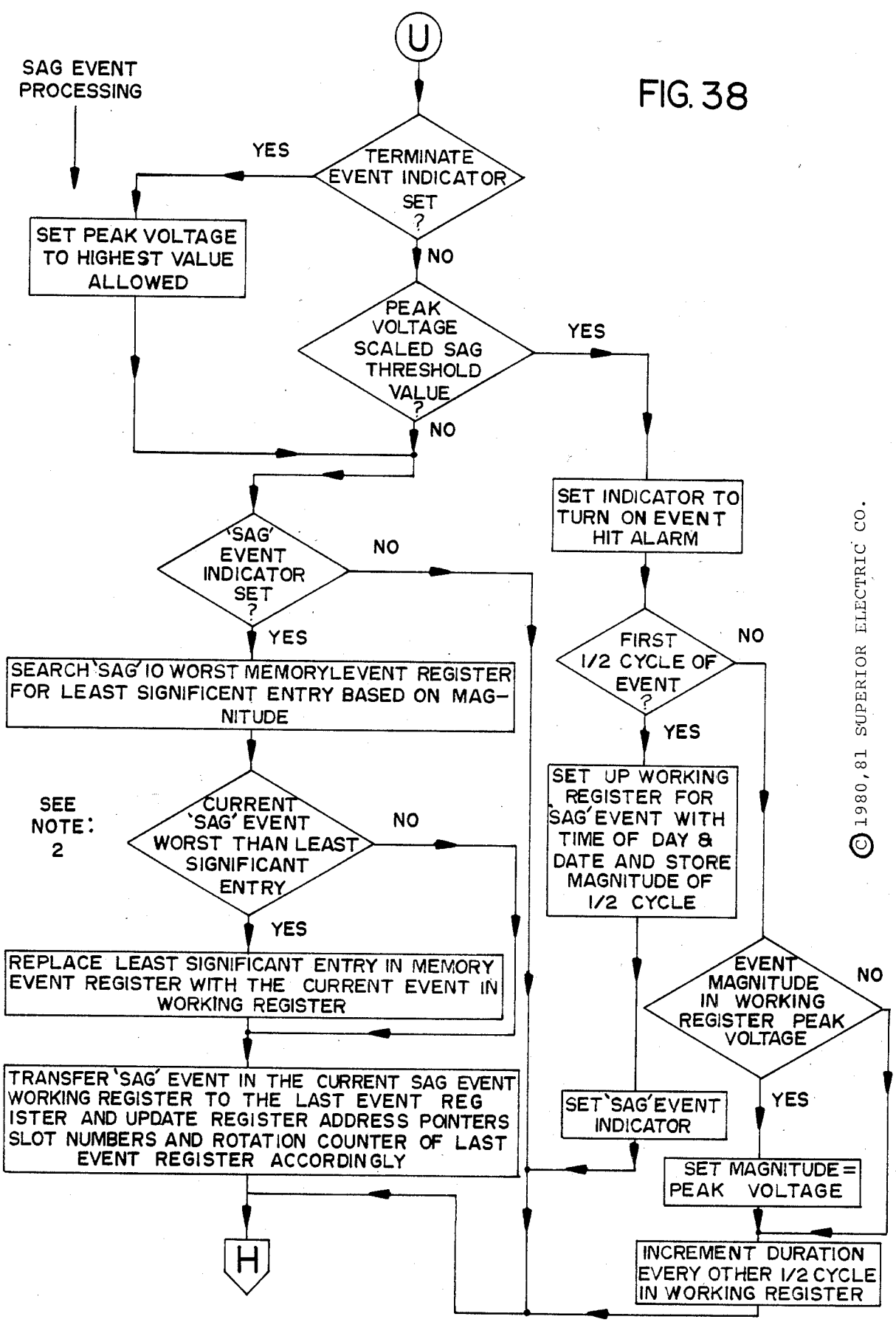

After performing the Blackout sub-routine (FIG. 37) the program enters the SAG event sub-routine (FIG. 38). It checks whether the terminate event indicator is set. It would not be set if there were no blackout or the event defeat switch were not set. The peak voltage of the prior half cycle is compared with the SAG threshold voltage. The SAG threshold voltage has been previously set by the printer. If the SAG threshold has been exceeded, i.e. the peak voltage is less than the SAG threshold the Hit (event) indicator is set.

Figure 39:
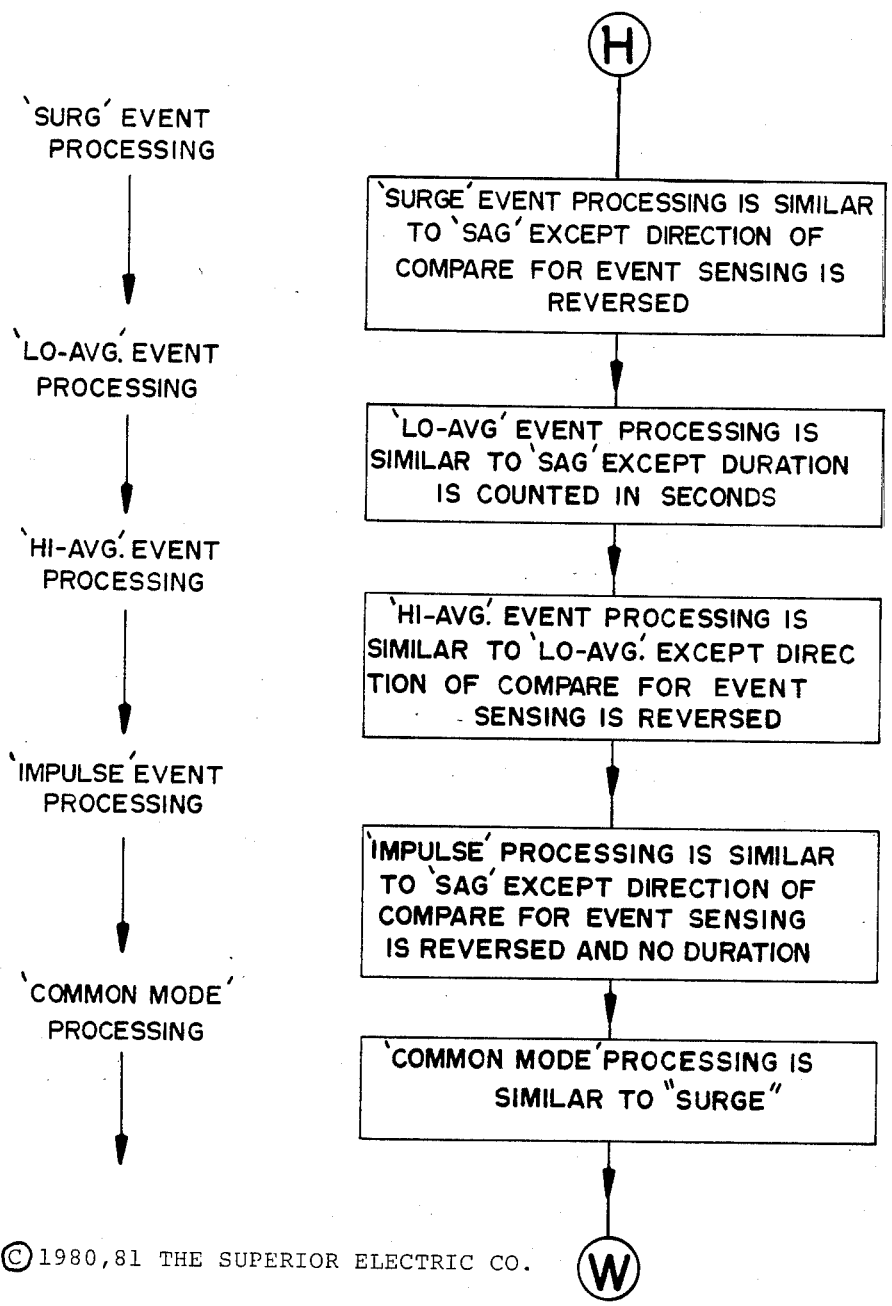
Figure 40:
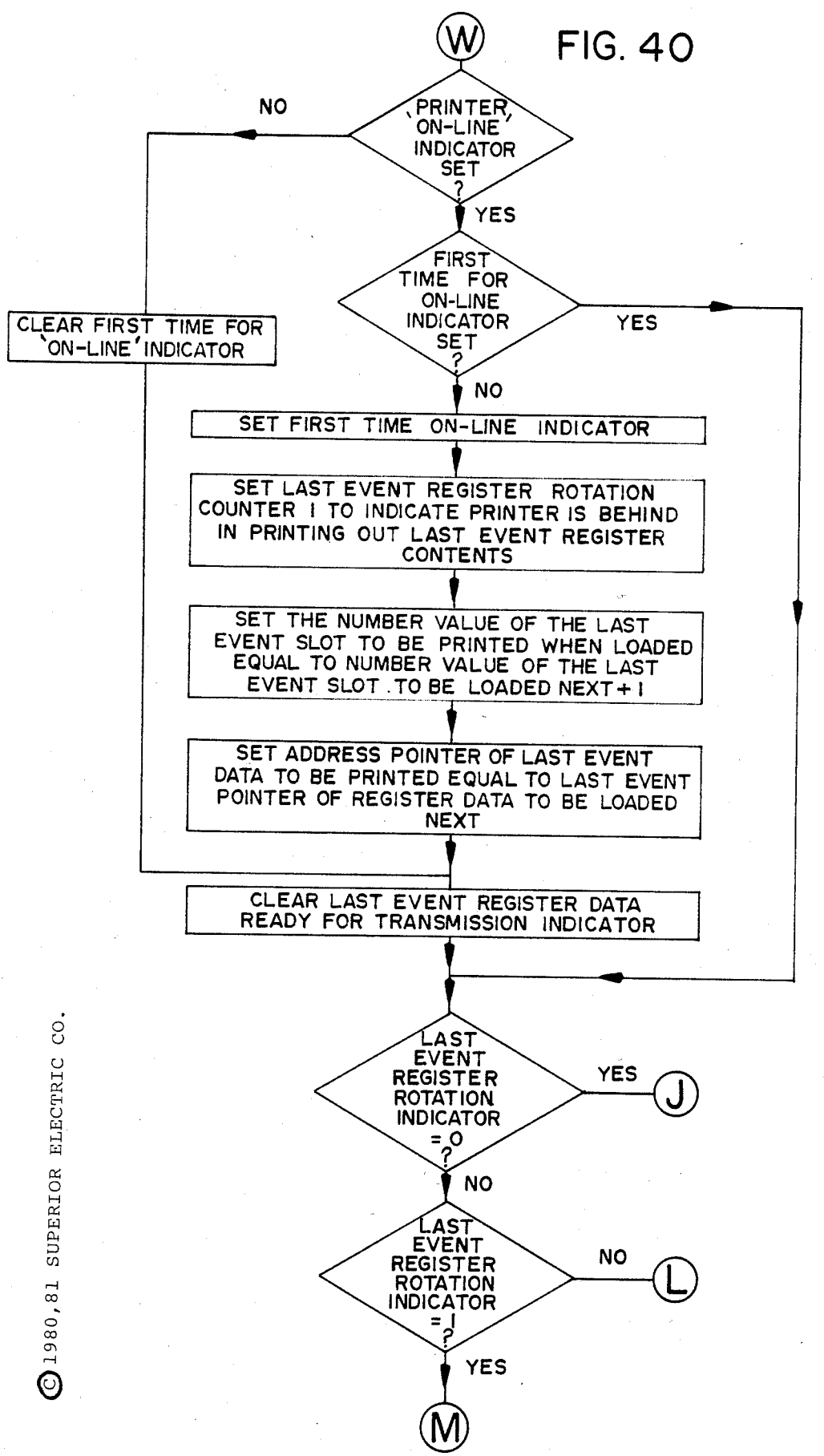
Figure 41:
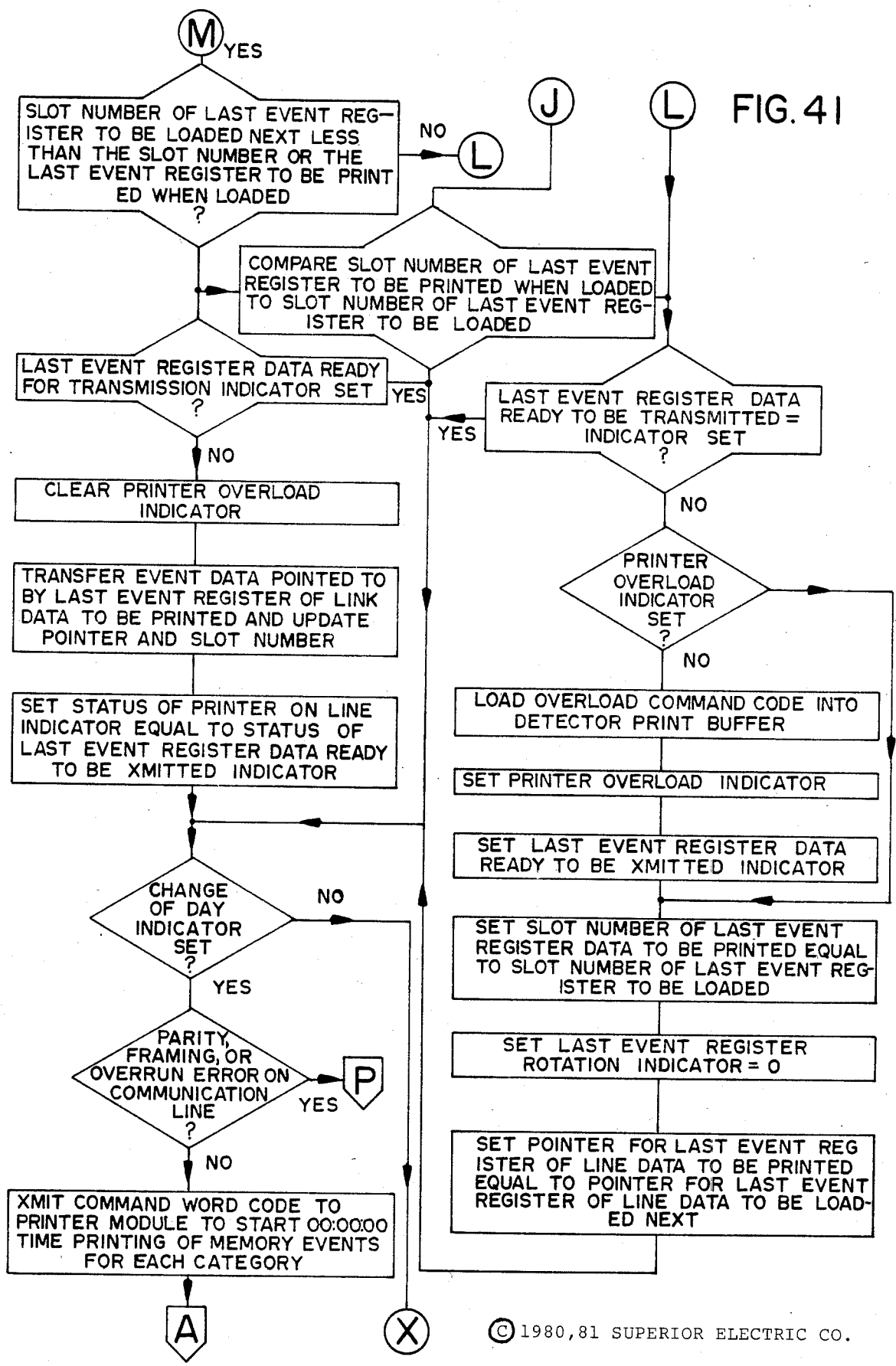

We now check to see if it is a continuing SAG event. It not, i.e. it is a new event there is a working register that is set up with the time of day that this SAG started, the value of the magnitude of the event for that particular half cycle and the SAG event indicator is set and the program continues to another sub-routine (FIG. 39).

Still referring to FIG. 38, if it is not the first half cycle of the SAG event the program checks the event magnitude in the working register. It compares the event magnitude in the working register with the peak voltage occurring during the last half cycle. If the voltage is worse than the magnitude in the working register we store the peak voltage in the working register so that the voltage stored in the working register is the worst peak voltage read during the duration of the SAG event.

Duration for SAG is measured on a cycle basis. The interrupts are occurring every half cycle and the program increments the duration counter every other time.

If the peak voltage is greater than the SAG threshold we come down to the next decision to see if the SAG indicator is set. If it was not set, the program proceeds to the sub-routine of FIG. 39. If it was set, we now search the worst memory event registers for the ten worst SAG events. There is a register with entries for the ten worst SAG. The program scans that register and picks out the SAG event that has the least significant magnitude of the ones there. And that is compared with what is in the working register. If the contents of the working register is worse than the least significant one in the Worst Events Register, the contents of the working register is substituted into the Worst Events Register. The ten worst events are updated in this manner. The SAG event in the working register is also stored in the Last Events Register. The Last Events Register stores the last ten events on a first-in-first-out basis.

SURGE events processing is exactly the same thing as SAG except the direction of compare for event sensing is reversed. (FIG. 39) The peak voltage has got to be greater than the SURGE threshold. LOW AVERAGE and HIGH AVERAGE are similar to SAG except the duration is counted in seconds. LOW AVERAGE and HIGH AVERAGE sensing use the average of the peak voltage register as calculated in FIG. 34 for comparison to declare an event.

IMPULSE processing is similar to SAG except the direction of comparison is reversed and no duration is recorded. Since the sampling is on a half cycle basis, the voltage magnitude recorded will be of the greatest impulse within the prior half cycle.

COMMON mode processing is similar to SURGE except that the highest peak voltage is recorded along with the number of cycles duration of the event.

After completing the sub-routines of FIG. 39, the program proceeds to check whether the printer is in the ON LINE condition. (FIG. 40) If the printer ON LINE indicator is not set, a "first time for ON LINE indicator" is cleared, as is the "Last Event Register Data Read For Transmission" indicator. If the printer ON LINE indicator is set, a check is made to see whether it is the first time. If it is the first time, the program immediately proceeds as shown. If it is not the first time, the first time indicator is set, a rotation counter is set to 1 to indicate that the printer is behind, and the position of the last event slot to be printed is noted. The program establishes a limited number of slots for events to be stored when events are being stored faster than the printer is printing them out and for the pointers to keep track of where the events are to be placed into the register and where they are to be read out for printing. In the event that events are being recorded at a faster rate than events are being printed out, and that the recording of new events is actually overtaken the printing of old events, this situation is detected by the continuation of the sub-routine of FIG. 40 in FIG. 41 and the printer overload indicator is set and a load overload command code loaded into the detector print buffer to notify the printer of the overload. The program then puts the two indicators, that is the indicator of the position in the register where the new data is being entered and the position where old data is being read out to coincide again and the printing process continues.

Referring to FIG. 37, blackout is defined as the last peak half cycle voltage being below a predetermined voltage, for example 56 volts, and upon the occurrence of this condition, a blackout indicator is set. Blackout processing proceeds to record the time that the blackout began and to orderly shut down the MPU. Because there may have been an event in process the program terminates them as of the time the power blackout occurred. (FIG. 37)

Referring to FIG. 38, if the Terminate Event indicator is set, the program forces the peak voltage read out of the A to D to be the highest possible value so obviously it is going to be above the threshold, so the program will look at the SAG event as if the event just ended. Thus the shutdown process for the detector proceeds in an orderly manner.

Figure 42:
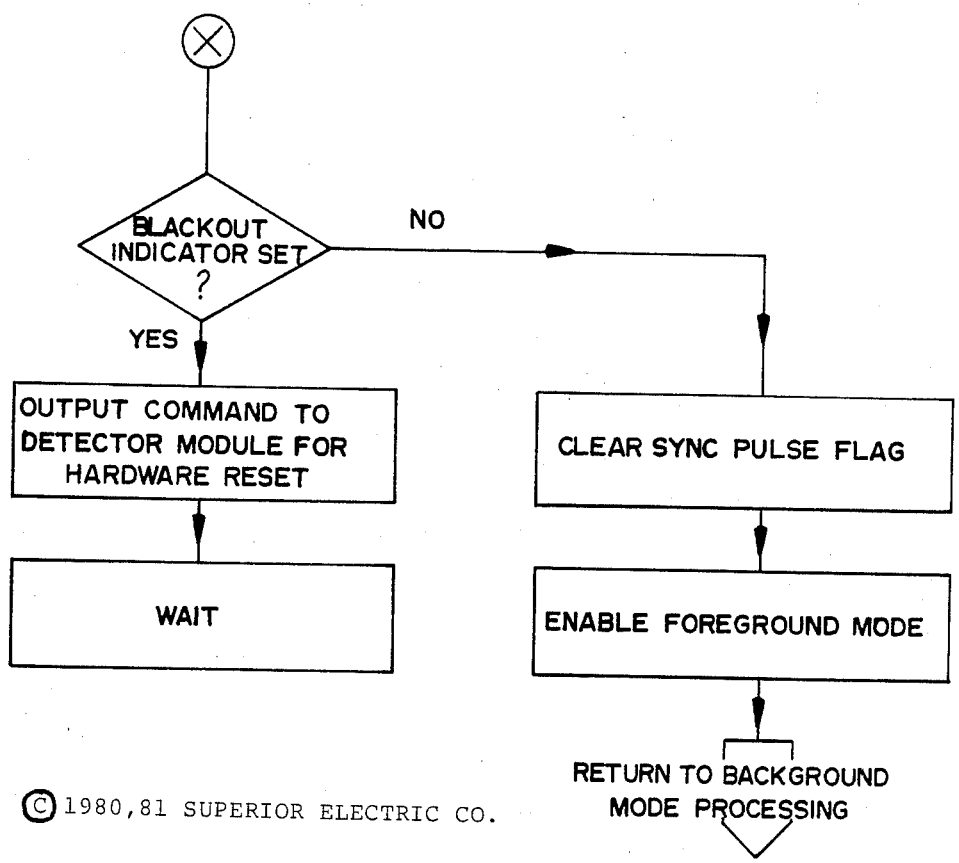

Referring to FIG. 42, the program checks to see if the Blackout indicator is set. If it is not set it clears the sync pulse flag, which is the flag that was set to get the program into the foreground mode originally. This enables the foreground mode, but the program returns to the background mode.

Referring to FIG. 37, during power on, the program checks to see if the blackout indicator was set. If so, it clears it and if the Event Defeat indicator is not set, it stores the power on event in the blackout register, together with the time. The program then checks to see if the power has gone off again, if so, it proceeds to process another blackout. If not, the program proceeds out of the subroutine.

Figure 19:
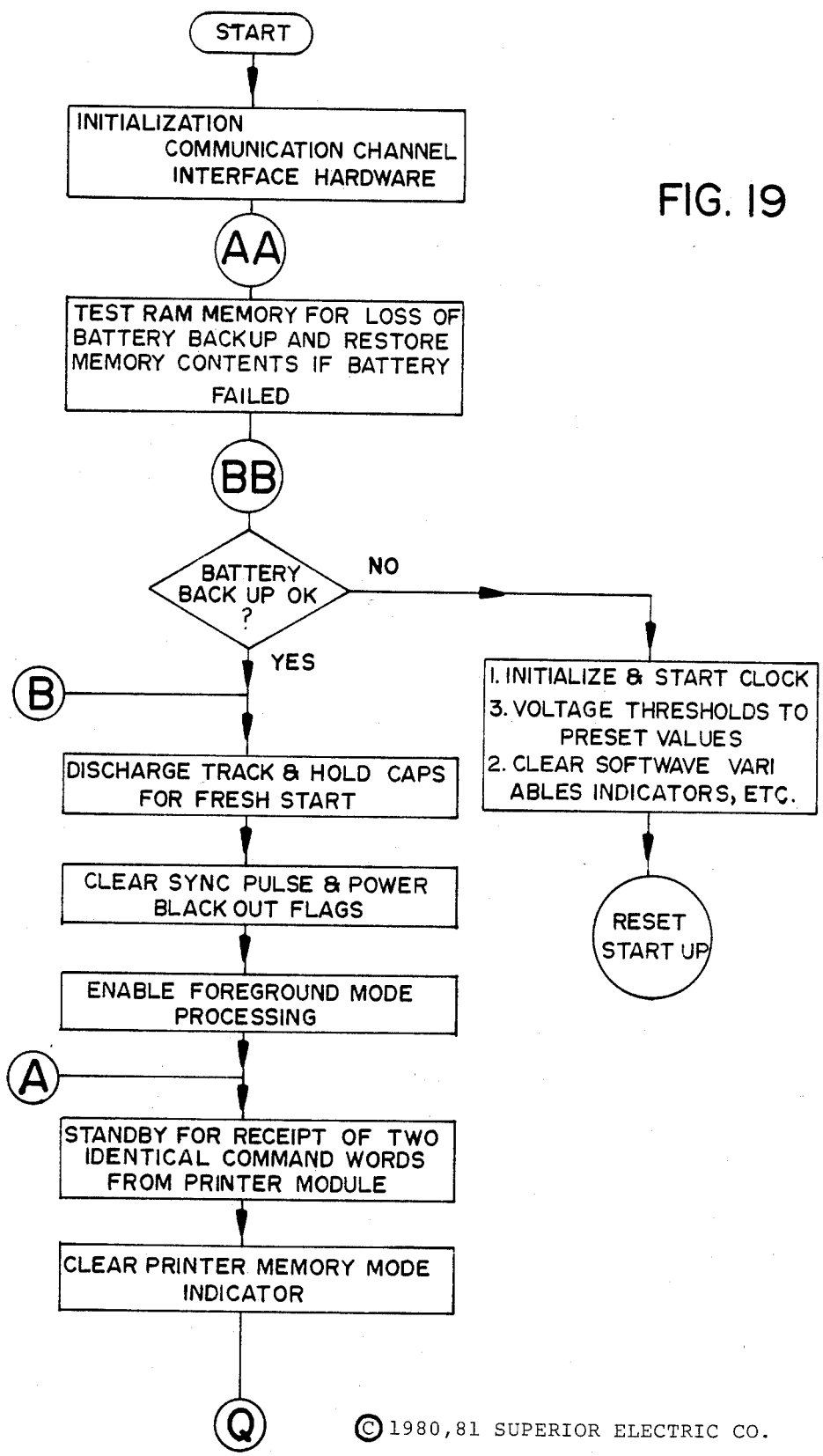

The background mode is entered when power comes on at START in FIG. 19. The microprocessor itself has hardware built in. When the processor comes up there is a vector that points to the starting address of the program and this is the point of start. After initialization of the hardware we have to be certain that the battery that was backing up RAM memory did not fail while the power was off. There is a block of RAM memory that is not being used by the detector, so we use that unused portion of RAM for a code. We store a code of 00 next - the next byte will be 01, then 02, then 03 and so forth. We do this for 300 bytes. Thus all possible combinations are tested.

Figure 20:
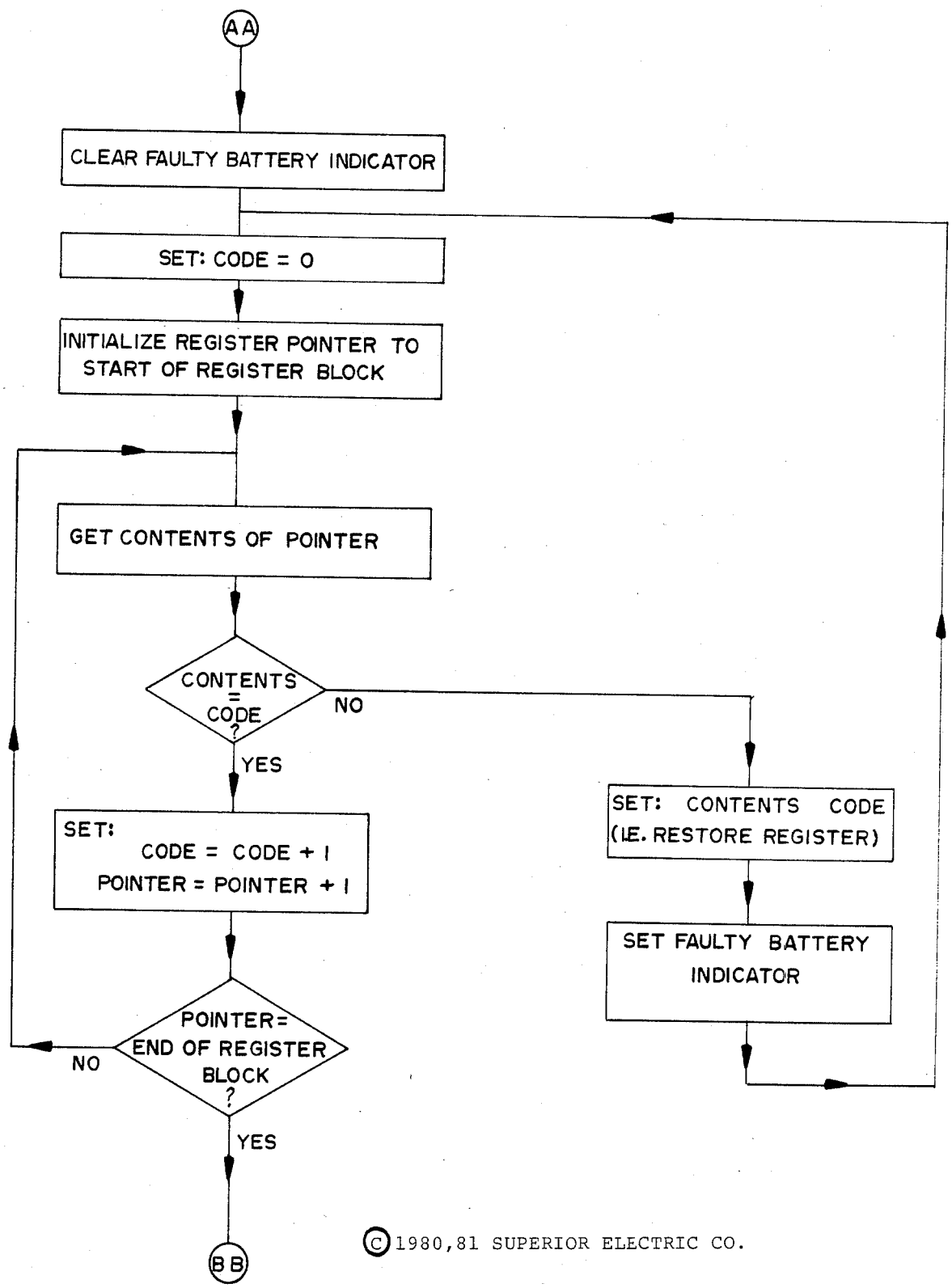

As shown in FIG. 20 the program reads the first byte out of RAM, compares it against 00; if it is OK it reads the second byte and compares it against 01 and so forth. If that test is satisfied we proceed with the program. If not, then the detector is totally reinitialized. We initialize and start the clock going and we set threshold to some preset values. (FIG. 19) We hust initialize the clock to an arbitrary time, e.g. all ones. We set up certain software variables and we go to reset startup.

When the processor comes on the foreground mode is automatically disabled. The mask for interrupts is set to disable the interrupt because "reset startup" can be entered by other means. We initialize the worst case event registers and some indicators and so forth (see FIG. 25) and reenter the program at point B of FIG. 19.

The sensing capacitors for peak voltage IMPULSE and COMMON mode are discharged. The foreground mode is software enabled and upon receiving a sync pulse the detector will start processing events. (FIGS. 34 to 42)

Every 8.3 milliseconds there is an interrupt and the foreground mode is processed for about a millisecond and a half up to maybe 8 milliseconds, depending on the number of events processed.

Figure 33:
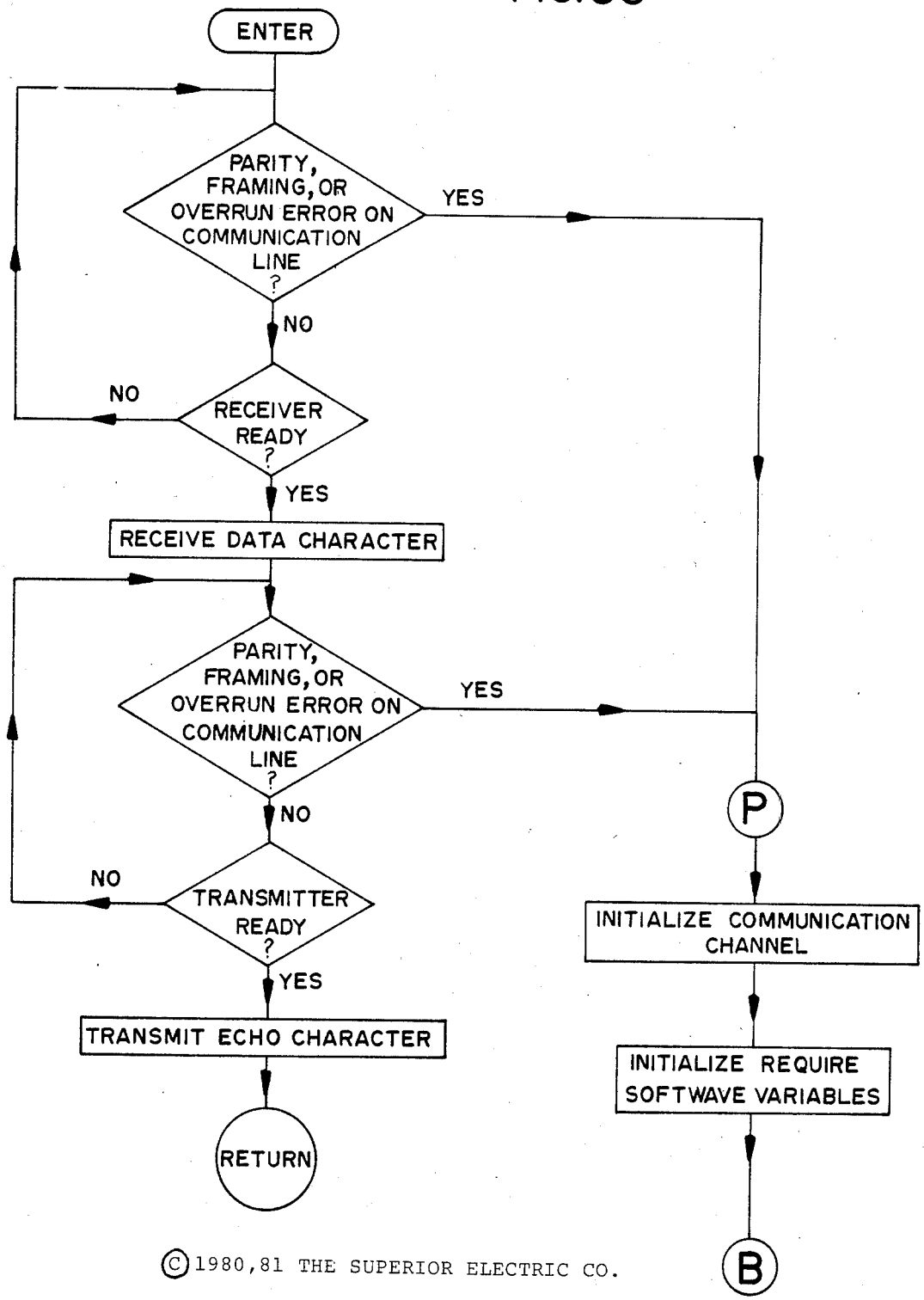
Figure 34:
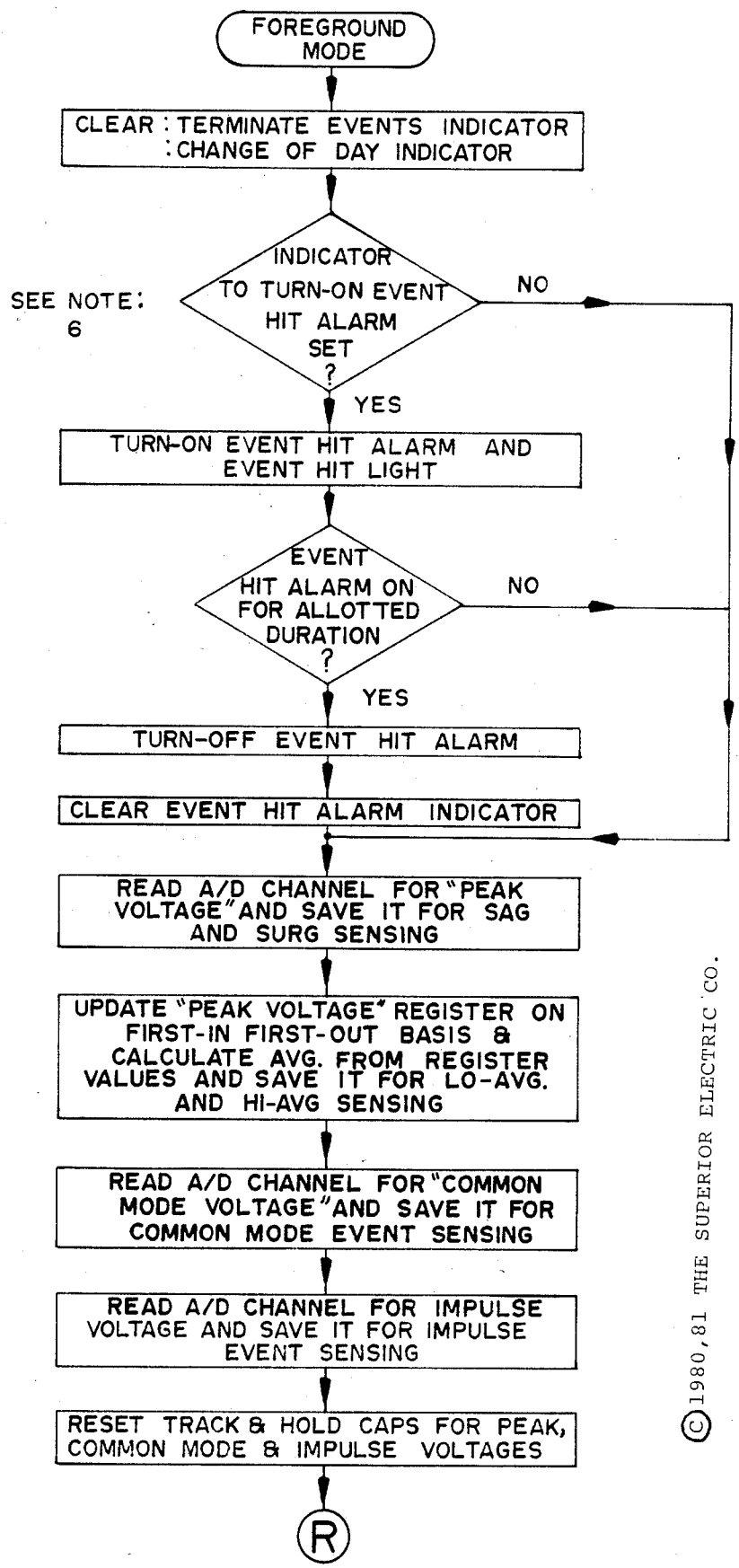
Figure 35:
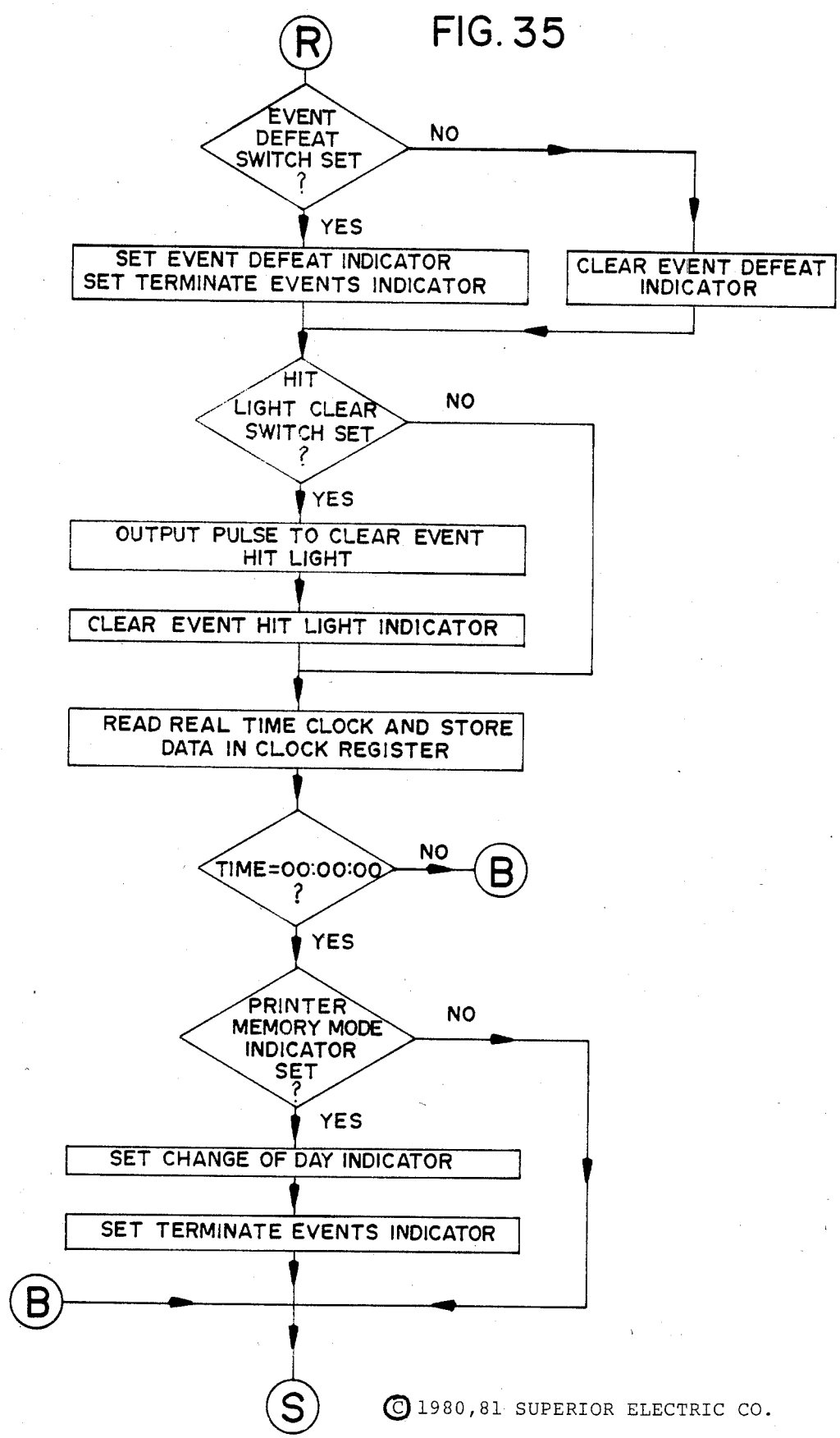
Figure 36:
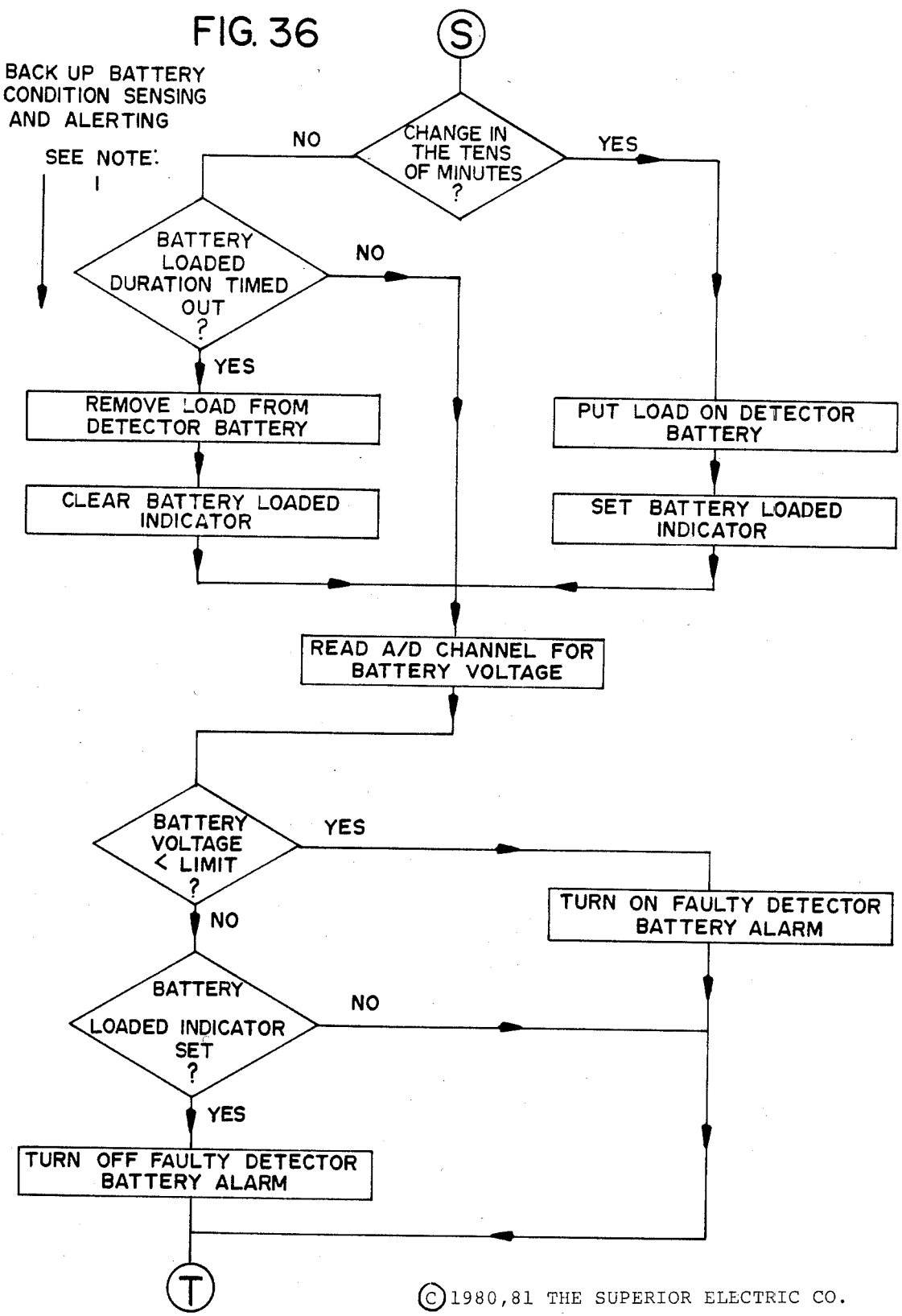

The detector module thus alternates between the foreground and the background modes. When it is in the background mode it is waiting for a communication from the printer. In order to harden the system so that we will not by coincidence get a false command word to the detector from noise or whatever, there must be two adjacent identical command words before the detector will perform its task. This is shown in FIG. 33.

We check to see if there is a parity, frame of over-run error on the line. If not, we check to see if the receiver is ready. If not, the program sits in this loop in a standby mode.

Figure 21:
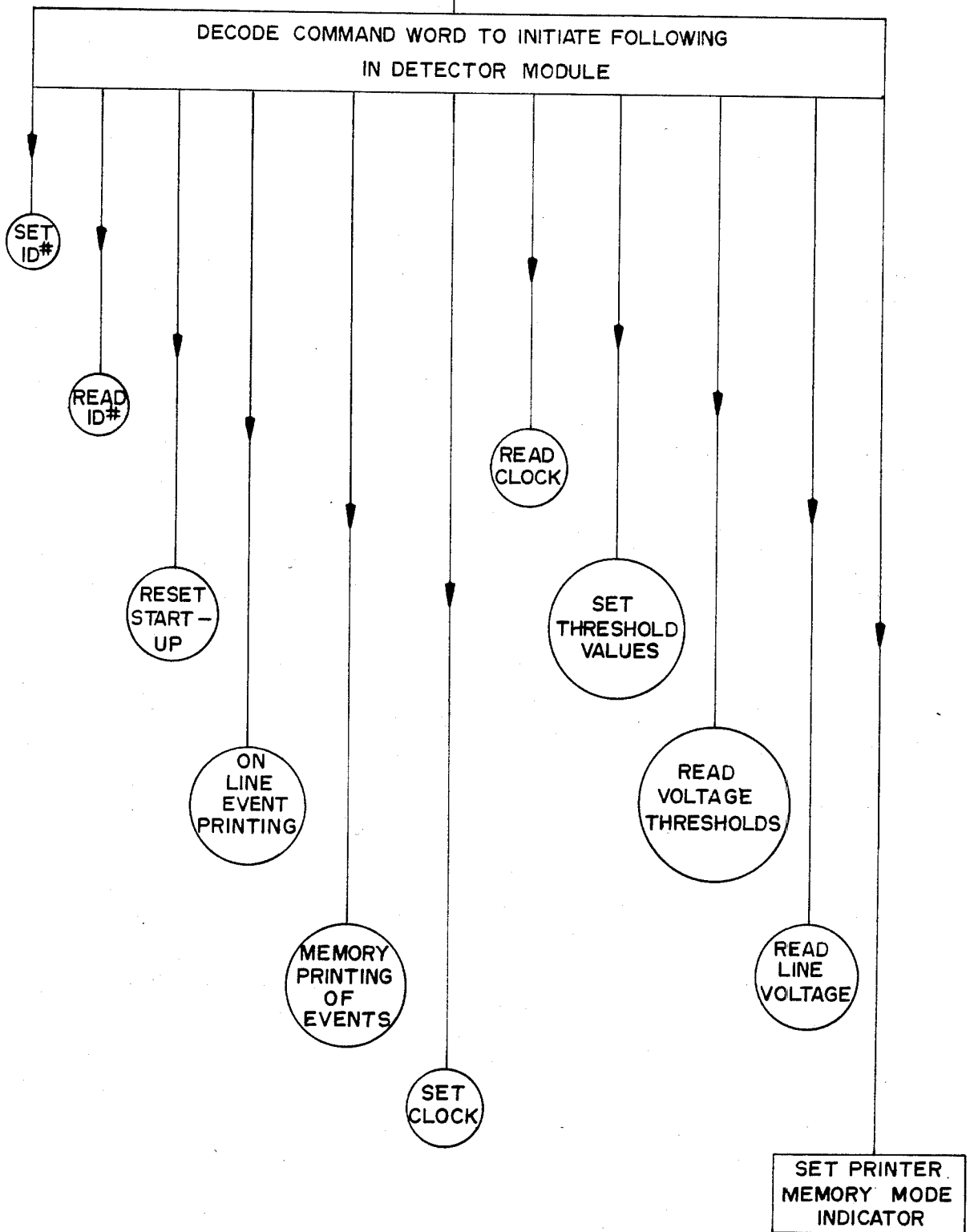
Figure 26:
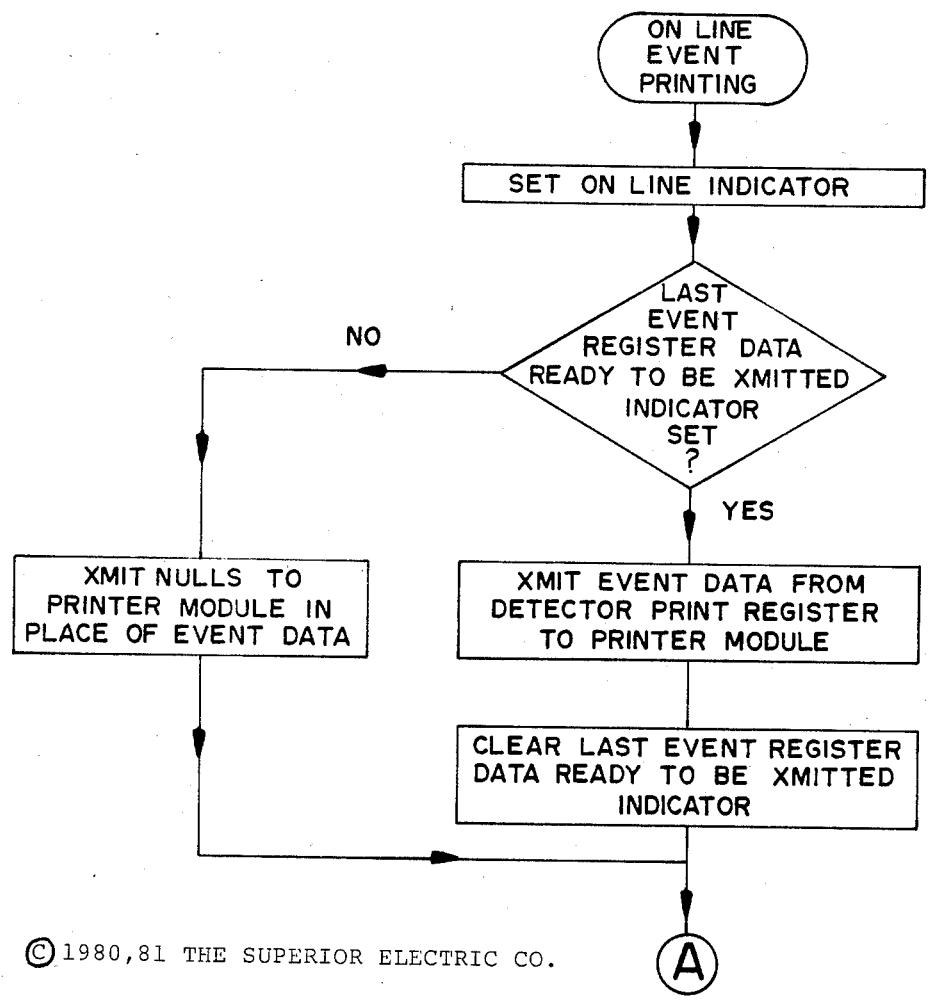

If there is data received, it then checks for errors in transmission. If there are none, it transmitts the same data it received back to the printer. This echo back is a further hardening of the system. Now, because two identical characters must be received, it repeats this process again and it checks the first one it received against the second one it received. The decoding of the command words received from the printer is indicated in FIG. 21. The selected sub-routines are indicated in FIGS. 22 through 31.

Figure 27:
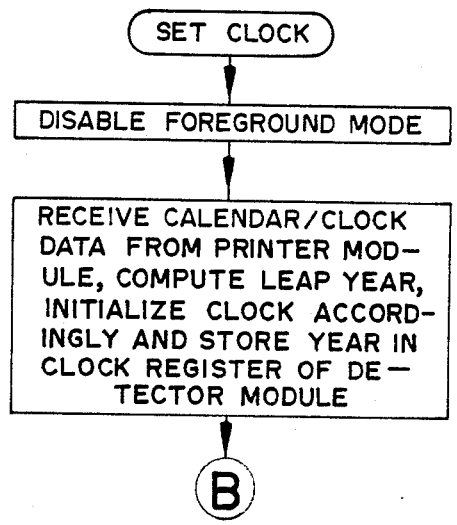
Figure 28:
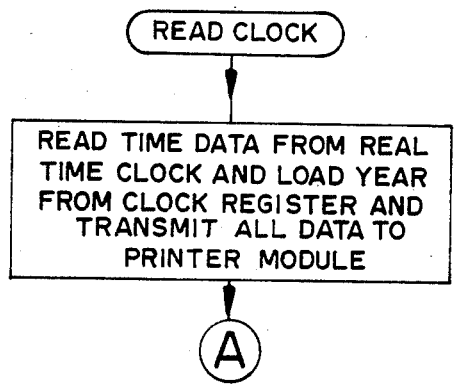
Figure 29:
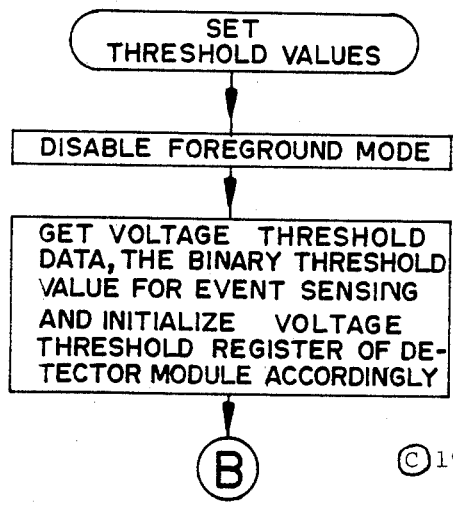
Figure 32:
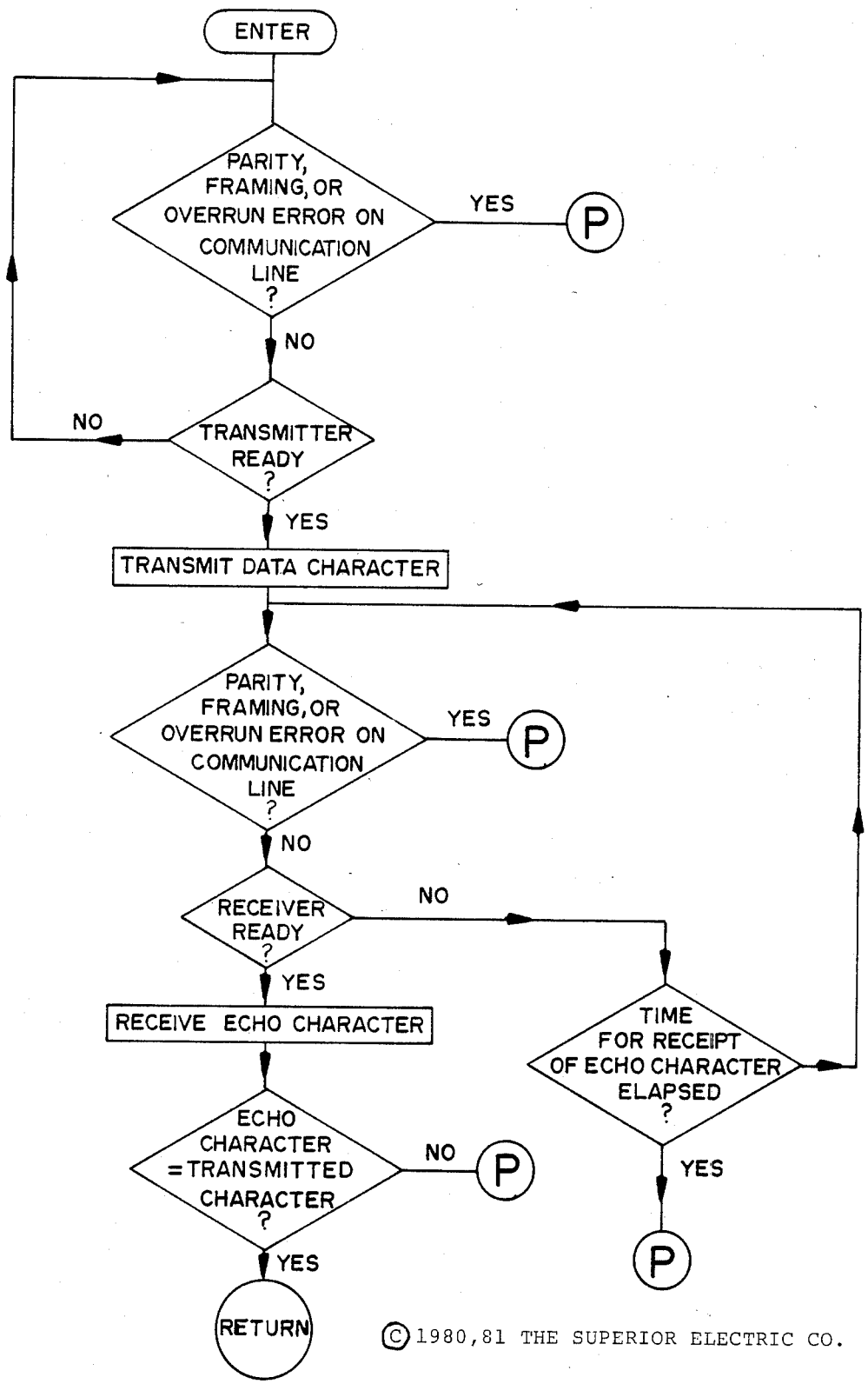

Referring to FIG. 22, when the I.D. number as set up in the printer is received by the detector, it is stored in the I.D. register of the detector. In Read I.D. (FIG. 23) we just transfer the ID number that is in the register of the detector to the printer for printout. Reset startup (FIG. 25) is clearing of the worst case event memory register block and restarting the detector. Set clock and read clock, FIGS. 27 and 7, are similar to set ID, read ID, as are set threshold and read threshold (FIGS. 28 and 29)

ON LINE event printing (FIG. 26) is the real time printing of events. As indicator is set in the detector that tells it that the printer is connected and it is ON LINE. We check the status of the last event register data is ready indicator. It it is set that means that there is information ready to go from the last event register to the printer. So the detector transmits that information to the printer and it clears the last event register data ready indicator. If that indicator is not set, we transmit nulls in place of data to the printer. So, when the printer and detector are connected and ON LINE, even though nothing may be coming out on the printer, communications are still taking place and it just happens to be nulls. This constant communication is done to guarantee that the printer is always there and it is ON LINE. If it was not done, there could be a communications error and you would not know about it until the instant you started to transmit information.

Figure 30:
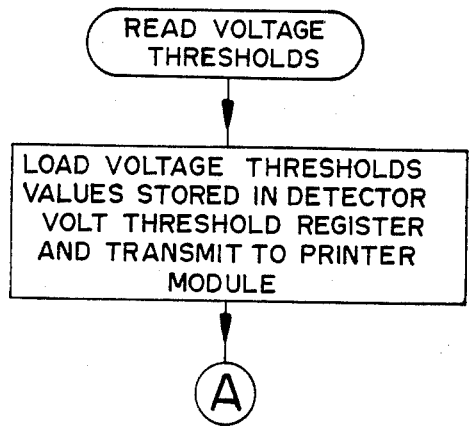
Figure 31:
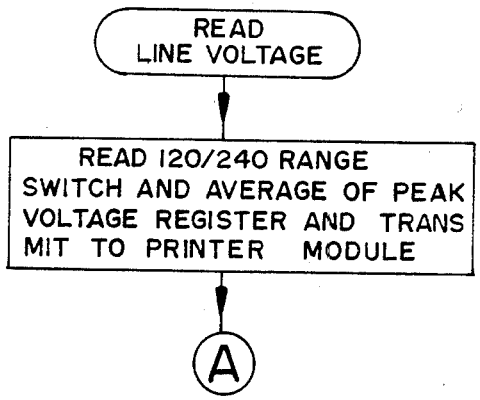

The sub-routines of FIGS. 24, 30 and 31 are self explanatory.

It should be noted however that in transmitting the threshold information from the printer to the detector, it is done in two parts. First the threshold information as printed on the printer printout is transmitted. That information is stored in the detector so that when the operator requests the threshold values, the information is transferred directly to the printer and is printed out. Also transmitted to the detector are what we call scaled thresholds. These are the BCD numbers that are scaled and are actually used for comparing against the peak values. The reason we are not transferring the scaled thresholds back to the printer is that in order to do that we would have to unscale them and therefore some rounding off problems might occur and the operator would get confused or may get a little bit worried because he might have programmed 117 volts for SURGE and when requesting this threshold it might come back as 116 or 118. So we are transferring the BCD data back that was actually programmed. What the detector is actually using is scaled versions of that information.

When the detector is started up from a virgin type start there are present thresholds set into the detector memory. They are a SAG of 90, LOW AVERAGE of 100, HIGH AVERAGE of 130, SURGE of 140 and an IMPULSE of 500. Also the assumption is made that the unit is connected to 120 volt line so there is an indicator in the detector which is initialized to 120 volt operation. When thresholds are being changed by the operator using the printer module and it comes time to load the thresholds into the detector, the LOW AVERAGE threshold is looked at, in the beginning. If its value is 160 volts or higher, then we assume that the detector is connected to 240 volts. A LOW AVERAGE of 160 volts is much too high for 120 volt operation. So, that being the case, the scaling that comes in here is different for 240 than for 120.

NOTES TO FIGS. 19 THROUGH 42

Note 1

Faulty detector battery alarm turns off only when battery voltage tests good and battery is under load. Alarm will turn-on at any time however. This allows for some difference between event hit alarm and faulty battery alarm sound duration since the faulty battery alarm typically will stay on for a longer time interval.

Note 2

Separate memory event registers exist for "SAG", "SURGE", "LO-AVG", "HI-AVG", "IMPULSE", and "COMMON MODE" "BLACK-OUT", and "LAST EVENTS".

Each register holds data for up to 10 events. The "SAG", "SURGE", "LO-AVG", "HI-AVG", "IMPULSE", and "COMMON MODE" registers store the 10 worst events (based on magnitude) in each category from the time the detector was last reset and subject registers were initialized.

The "BLACK-OUT" and "LAST EVENTS" registers store events on a first in first out basis.

Each memory event register contains the following event data. (In some cases certain data slots are not filled if they are not required for the event)

Time=change-of-month indicator, data, hour, minute and second at start of event.

Magnitude=worst case voltage magnitude recorded during duration of event.

Duration=event duration (cycles or seconds)

Event Type="SAG", "SURGE" ETC

Each memory event register is headed by event type and number of hits.

Note 3

Memory event registers are initialized to least significant magnitude value for event type for ease in decision making in determining a worst case event.

Note 4

The peak voltage register is a first in - first out register which contains the peak voltage readings for the previous 32 ½ cycles. An average value for the register data is calculated each ½ cycle and is used for "LO-AVG" and "HI-AVG" sensing and line voltage readings.

Note 5

Initialize "LAST EVENT" register pointers, etc to output last 10 events of register on initial entry before printing real time events.

Note 6

Event hit alarm turns on as soon as any event qualifies and stays on for 1 second after end of last hit.

Event hit light turns on as soon as first event qualifies and stays on until detector is reset or "clear" hit button is held.

Note 7

"Peak Voltage" register is initialized to the average of the "LO-AVG" and "HI-AVG" threshold values.

Note 8

Detector Module Communication Processes are sufficiently hardened to provide very reliable transmission and reception of data via the serial communication channel. This is accomplished through testing for parity, overrun and framing errors, character verification on echo back of data sent or received, and double transmission of command words to detector. When a communication error occurs the detector aborts command in process and waits for a further command. The foreground mode of event sensing, etc continues operating and is not disturbed by this.

PRINTER MODULE COMPUTER PROGRAM

The computer program used in the Printer Module microprocessor achieves the operating characteristics set forth above. The program comprises background and foreground operating modes from which all indicated computer tasks are derived. Each mode is defined in detail in the functional flow chart of FIGS. 43 through 65.

A complete understanding of the Printer Module program requires an understanding of the Detector Module program as well since both modules function as a unit.

For additional information the reader is referred to the assembled listings of the printer and detector module computer programs set forth in the Appendix.

Printer Module Software Operating Modes

The foreground software processes tasks immediately following the actuation of the printer module "Mode" push button. The foreground mode is triggered by actuation of the printer module mode push button which causes a hardware interrupt via terminal CB1 of PIA #1. The processed tasks are:

(1) Transmission of parameter setting data to the detector module if the appropriate "setting" indicator is set. The parameter setting data comprises:
   (a) Clock Setting data.
   (b) Voltage Threshold setting data.
   (c) Monitor ID setting data.
(2) Advancement to the next printer module operating mode.
(3) Control of Printer Module mode lights.

The background mode software processes all other tasks of the Printer Module not included in the foreground mode. These tasks are:

(1) Serial communication with the Detector Module and checking for invalid transmission caused by framing, parity and overrun errors or an incorrect echo back of the serial date and automatic start up.
(2) Initialization of the ACIA, PIA #1 and #2 and all software variables.
(3) Advancement of the printer paper when the "feed" button is pushed.
(4) Communication with the Detector Module to perform:
   (a) "Reset and Start-up" of the Detector Module.
   (b) "On-Line" real-time printing of line condition events.
   (c) "Memory" printout of 10 worst hits for each event category. This is done either automatically at 00:00:00 time or manually.
   (d) "Clock/Calendar" data printout and allow for changing of this data.
   (e) "Voltage Threshold" data printout and allow for changing of this data.
   (f) Monitor ID # data printout and allow for changing of the data.
(5) Control of thermal print head and stepper motor of the dot matrix printer.

There are two PIA's. One is used for controlling the thermo-printer and the motor drive for the printer. The other PIA is used for controlling the lights and push buttons on the front panel. The ACIA serial interface is the communication point for the printer. The RAM memory contains the data that is transmitted by the detector to the printer for processing and working registers required by the printer. The EPROM contains the software of the printer. Similar to the detector module, the printer module contains a foreground mode and a supervisory background mode. The foreground mode is controlled by way of the mode push button on the front panel of the printer. That is the mode that we are going to be talking about first. We should not be confusing foreground mode with things like MEMORY mode, ON LINE mode and so forth. Those are modes that a printer module operates in by way of the front panel switches. The foreground mode and background supervisory mode are software modes.

The foreground mode of the printer is enabled when the interrupt mask is cleared. This is a software instruction. That is, the foreground mode is entered when the mode button is pushed. In other words, for the process to recognize an interrupt, it must be programmed to have the interrupt mask cleared so it is armed to recognize interrupts and then the mode button when it is pushed creates the interrupt.

When the printer is first turned on, the foreground mode is disabled and there is some initialization that takes place. Then the foreground mode is enabled. The printer is programmed to come up in the MEMORY mode. The reason for this is because the printer and the detector may be operating as a unit at some site, the printer may be connected to a power source that is different from the detector, although both units are side by side, operating together. So, when the power goes off to the printer, and then sometime later the power to the printer comes back on, the cover of the attache case may be closed. If the printer started operating ON LINE it could jam up with paper. So, therefore, the MEMORY mode would tell the user something, yet not generate an awful lot of paper.

Figure 64:
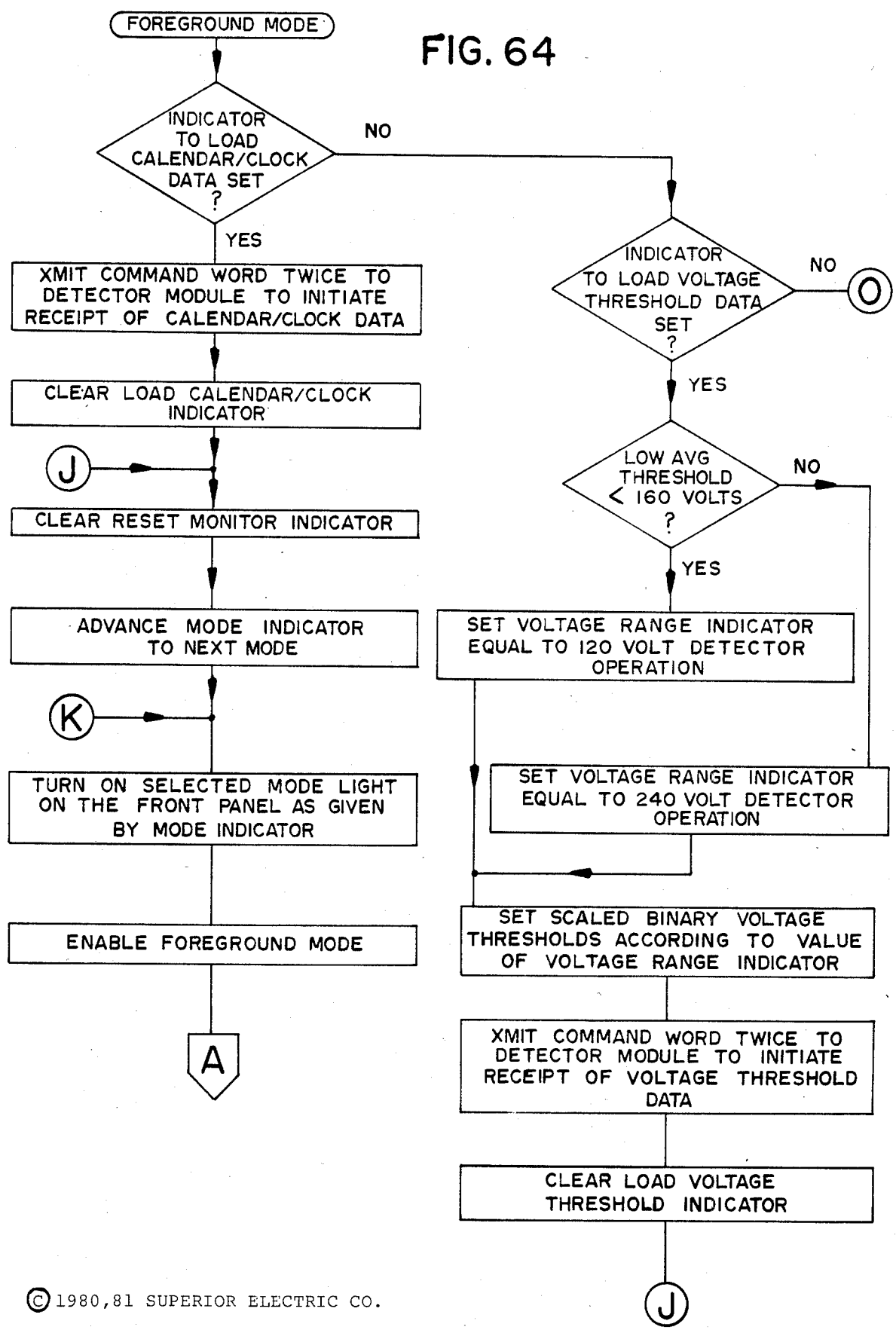

Referring to FIG. 64, upon entering into the foreground mode, decisions are made to see which mode we are leaving. So, are we leaving the clock calendar mode? Let's say the answer to that indicator is "No". Are we leaving the threshold mode? "no". Are we leaving the mode to load the moditor I.D. number? "No". (FIG. 65) Is the print button held? Let's say "Yes". Is the select button held? Let's say "Yes".

If you hold the two buttons at once, and press the mode button that leads to resetting the detector. One must hit both buttons simultaneously so that the program could not accidentally be reset. This command fully initializes the detector and clears its memory completely. It does not reset the clock or the thresholds but it clears all the event data. If the print button is held and the select button is held and the mode indicator is set to ON LINE then the function is to set the monitor reset indicator. The program goes to K (FIG. 64) and turns on the mode light on the front panel. It then enables the foreground mode. The program enters the foreground mode and the hardware of the MPU automatically disables the foreground mode from another entry. In the event that somebody winds up whacking or pushing the MODE button, the program stays in the foreground mode until it has completed its function. If the program was in the set calendar/clock mode (FIG. 64) the program transmits the appropriate command word to the detector module twice to initiate receipt of clock calendar data.

All communications are done twice and echoed back and checked for error. The printer in effect says, "Is this the same character that I originally sent?" "Yes". And again sends the same character back to the detector. When the detector gets it, it says, "Is this the same character that I received the first time?" "Yes". Then the detector goes on and does its thing.

If the printer does not receive that character back the second time it goes through a reset. The mode light begins to blink. Now the printer starts to reestablish communication with the detector by sending a character to the detector, which has nothing to do with the command word. And this character must bounce back and forth, a determined number of times. When that is successfully done, then the printer reinitializes itself and restarts up the mode it was originally in.

Again referring to FIG. 64, the command word goes across twice to the detector and assuming that it was received successfully by the detector, the printer starts to clear the indicator that it is to send the command word across. It also does a secondary task here, referring to the reset monitor indicator. It advances the mode indicator to the next mode, which, in our case, is the threshold mode. And then we turn on the next mode light and enable the foreground mode.

In the clock/calendar set mode, after the printer transmits the command word to the detector, it initiates receipt of the clock calendar data. Then the clock calendar data is sent to the detector. The indicator on the clock is the presence of the * during setting.

Still referring to FIG. 64, if the threshold indicator is set (only one of these indicators can be set, at any time) we look at the low average voltage. Is it less than 160? "Yes". Then the assumption is made that the threshold is set up for 120 volt operation. So, we set the 120 volt indicator and we scale the threshold accordingly. Then we send the appropriate command word to the detector, to initiate receipt of the voltage threshold data. And we send the voltage threshold BCD values at they were printed out on the printout sheet and we also send the scaled values to the detector. Then we clear that indicator to hold the threshold data. On the other hand, if the low average threshold, was 160 or higher, we set the indicator for 240 volt operation and scale the thresholds accordingly.

If the set to load the monitor I.D. number indicator is set, then the printer sends the monitor I.D. number across to the detector and then clears that entry.

Figure 43:
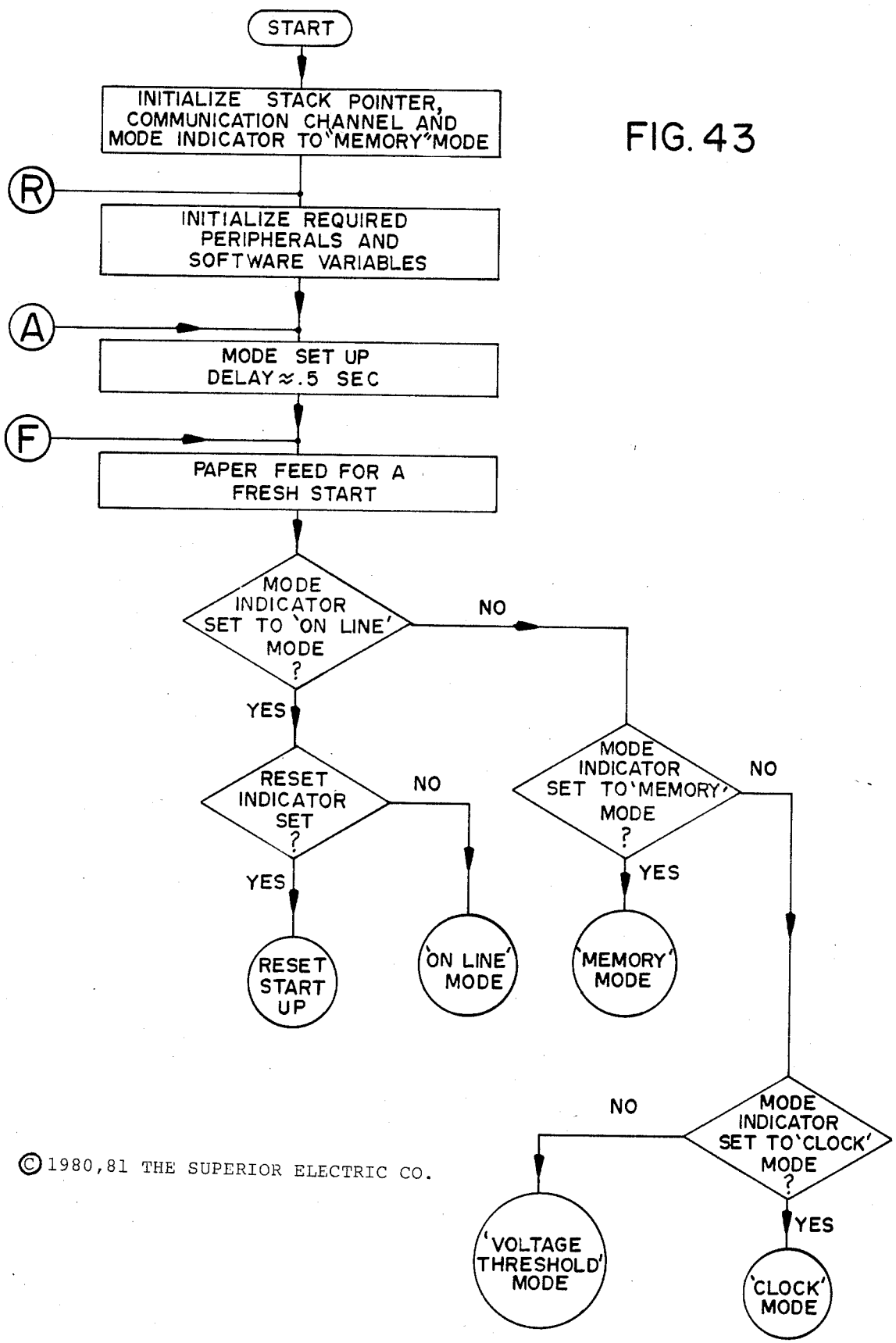
Figure 44:
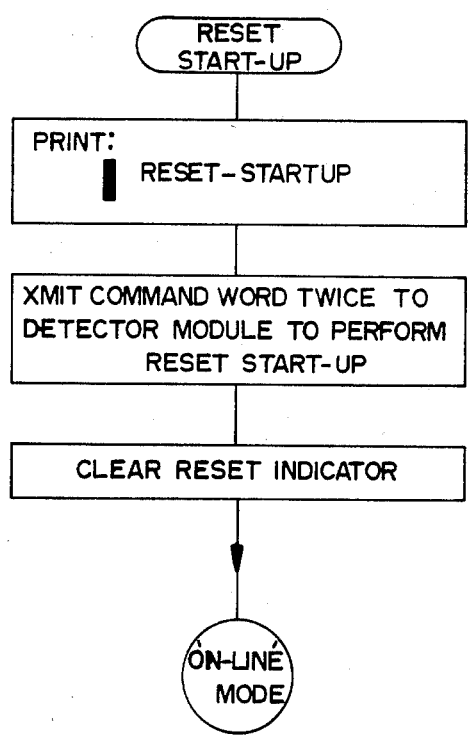
Figure 45:
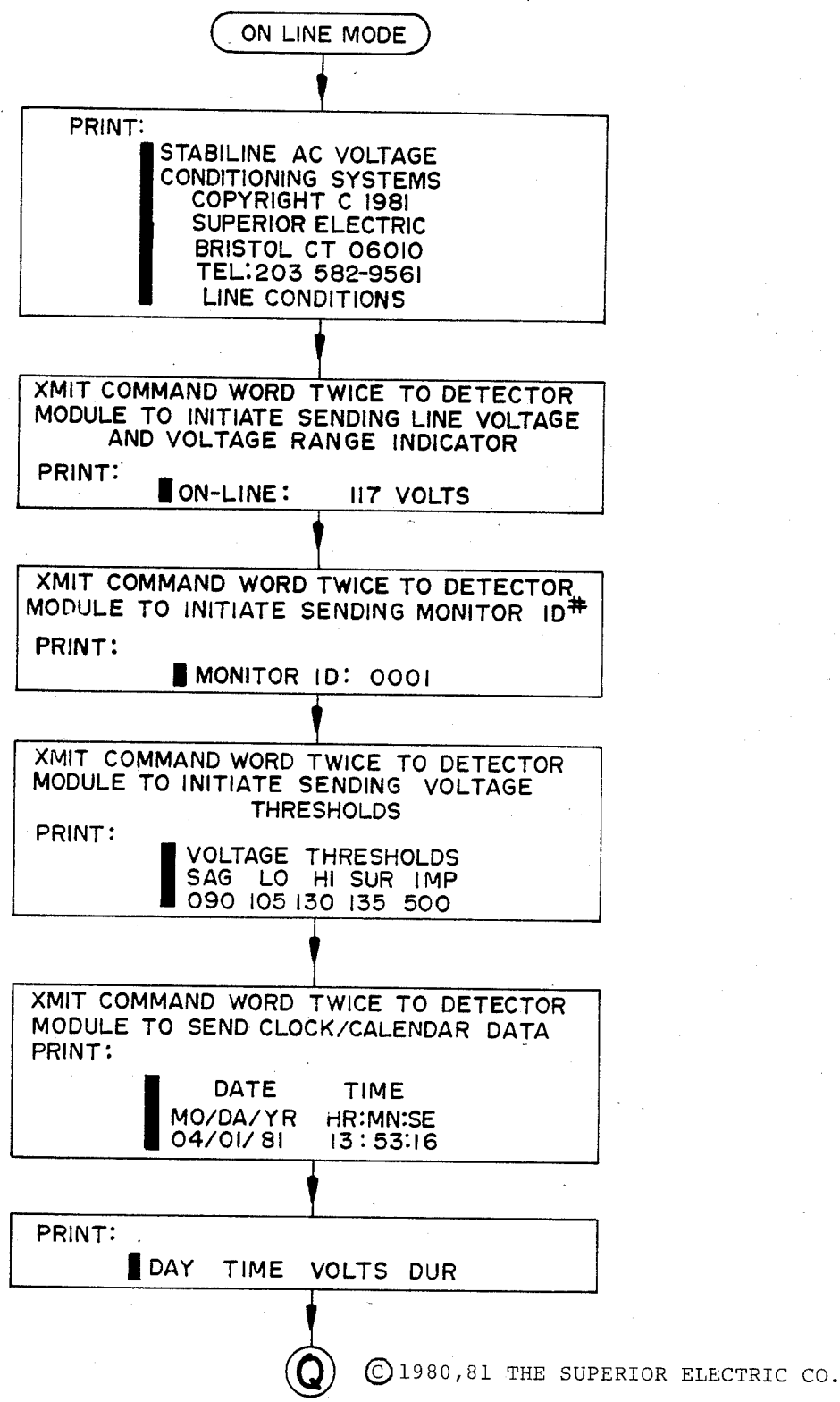

Now referring to FIG. 43, at Start Up, the program checks to see what mode the printer is in. If it is in the ON LINE mode the program checks to see if the reset indicator is set. This is an indicator that was set in the foreground mode by depressing the SELECT and PRINT buttons simultaneously. If set then we branch to "reset startup" (FIG. 44) and we print the message on the printer "reset startup". We transmit a command word twice so the detector module can perform the "reset startup" function and clear the reset indicator. Then we branch directly into the ON LINE mode. (FIG. 45) We print the heading information. We print a clear copy, then the rest of an ON LINE readout as shown in FIG. 10. First, the heading, then the actual line voltage, so that there is a command word that goes from the printer to the detector for the detector to transmit that information back to the printer to print out. Similarly, for the monitor I.D. number, the voltage threshold information, and again for voltage thresholds, all it is printing out is just the BCD information. All that the detector is sending to the printer is the BCD information entered by the operator; not the scale numbers it uses. Then the clock information and the general purpose heading for the timed events are printed.

Every single line of event transmission is initiated by a command word. If the detector has an event there, it will send it. But, if it does not have an event, what it will send are "Nulls" in place of the event. So, at this point we either have "Nulls" or event information.

Figure 46:
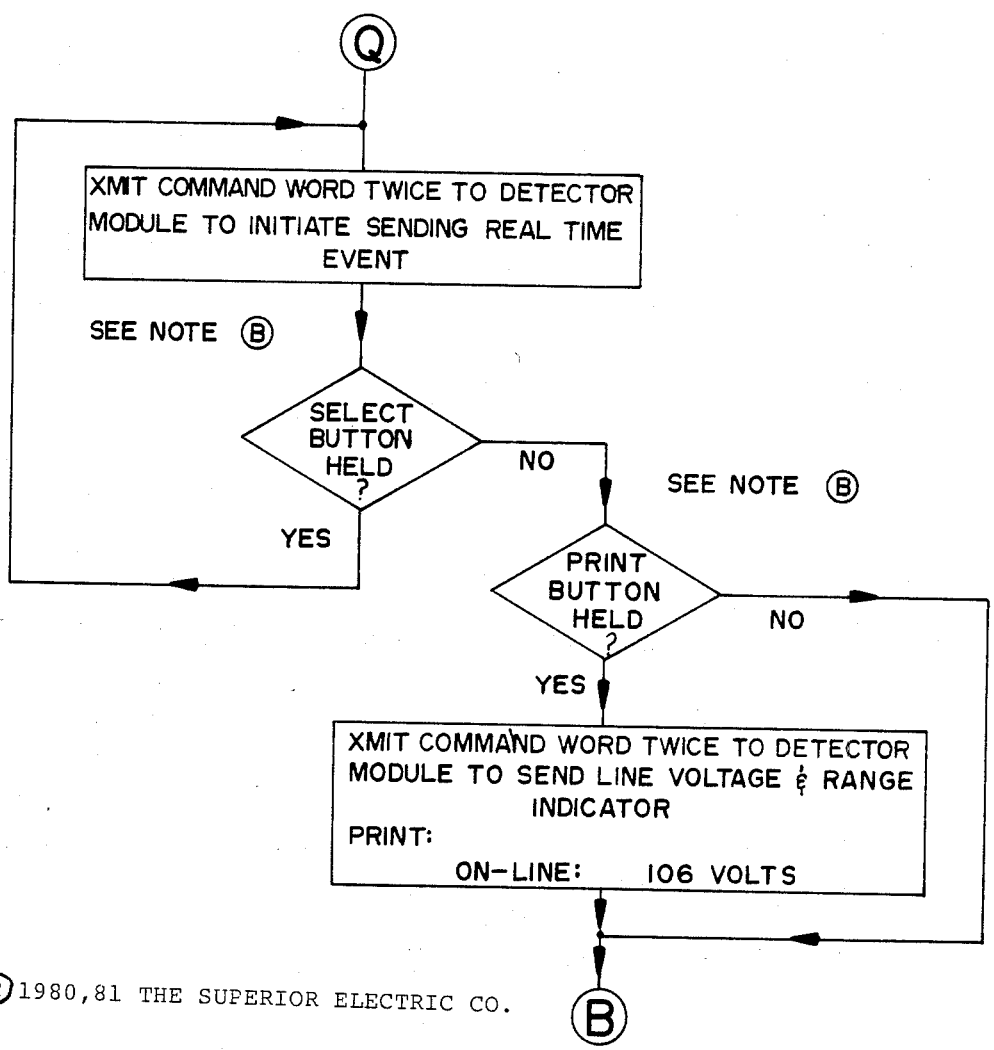

The printer continues to send that command as long as it is in the ON LINE mode at almost the baud rate. If one does not want to see the last ten events, one holds the select button in, and the printout is bypassed. (FIG. 46)

If the button is held in, the program branches back to the place where the printer sends another command word to the detector to get some more information.

Next we check the print button. (FIG. 46) The function of the print button in the ON LINE mode is to print the existing line voltages. If it is held in, a command word is sent to the detector to send the line voltage and range indicator. The range indicator again is to indicate either 120 volts or 240 volts. The line voltage comes across from the detector to the printer as an output from the average voltage register. The range indicator indicates whether that output is to be used as is or whether it should be scaled for 240 volt operation.

Figure 47:
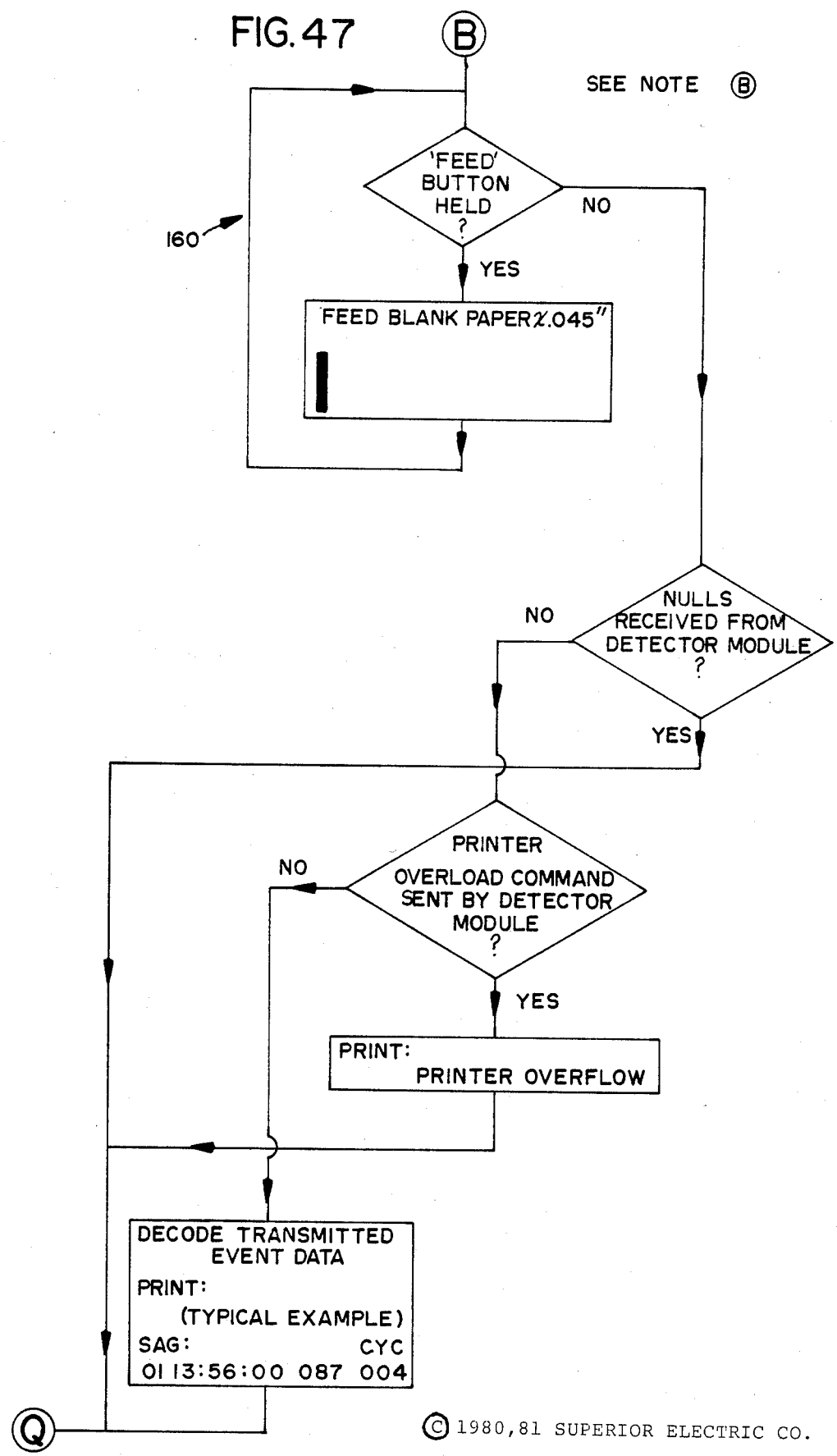
Figure 48:
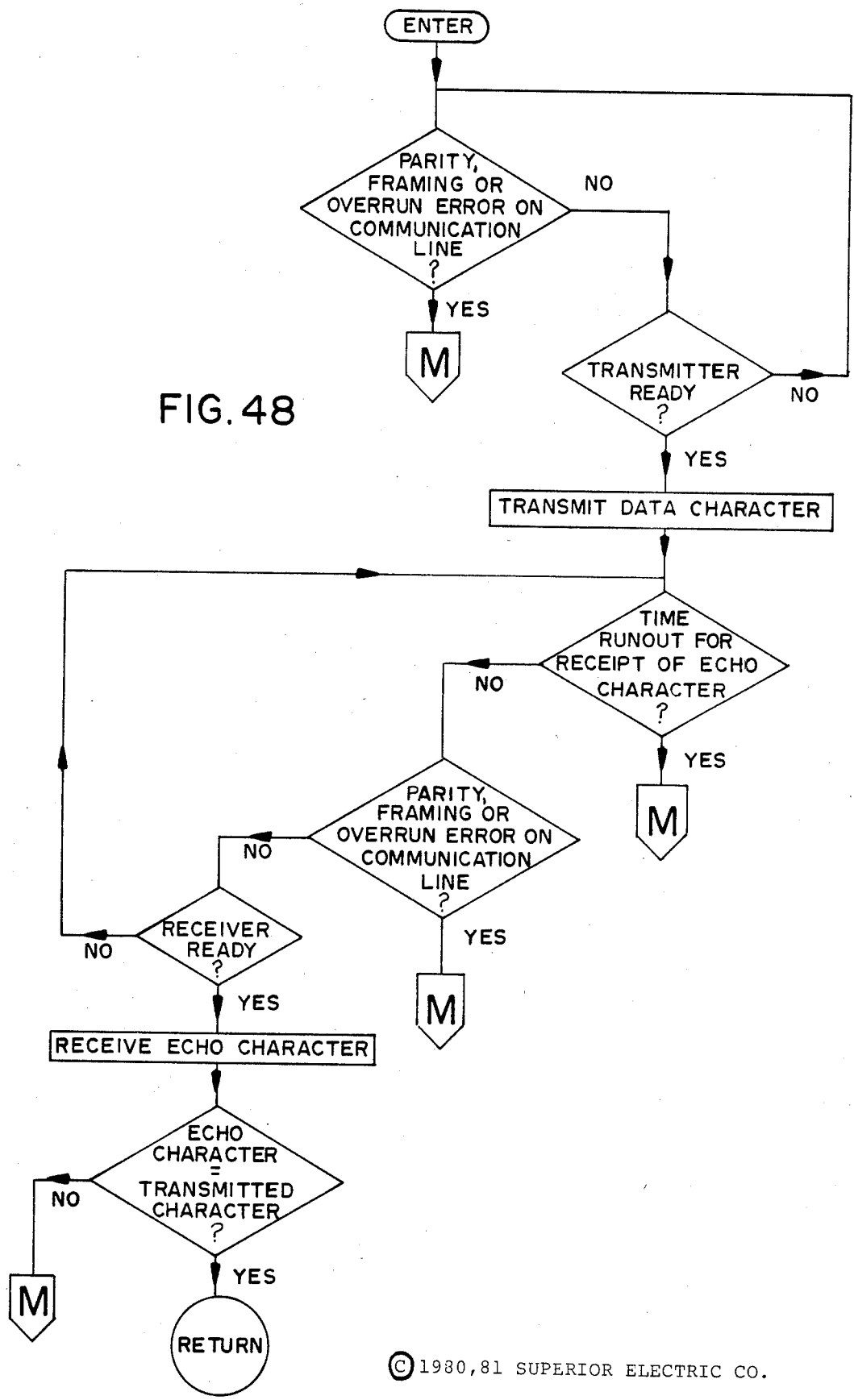
Figure 49:
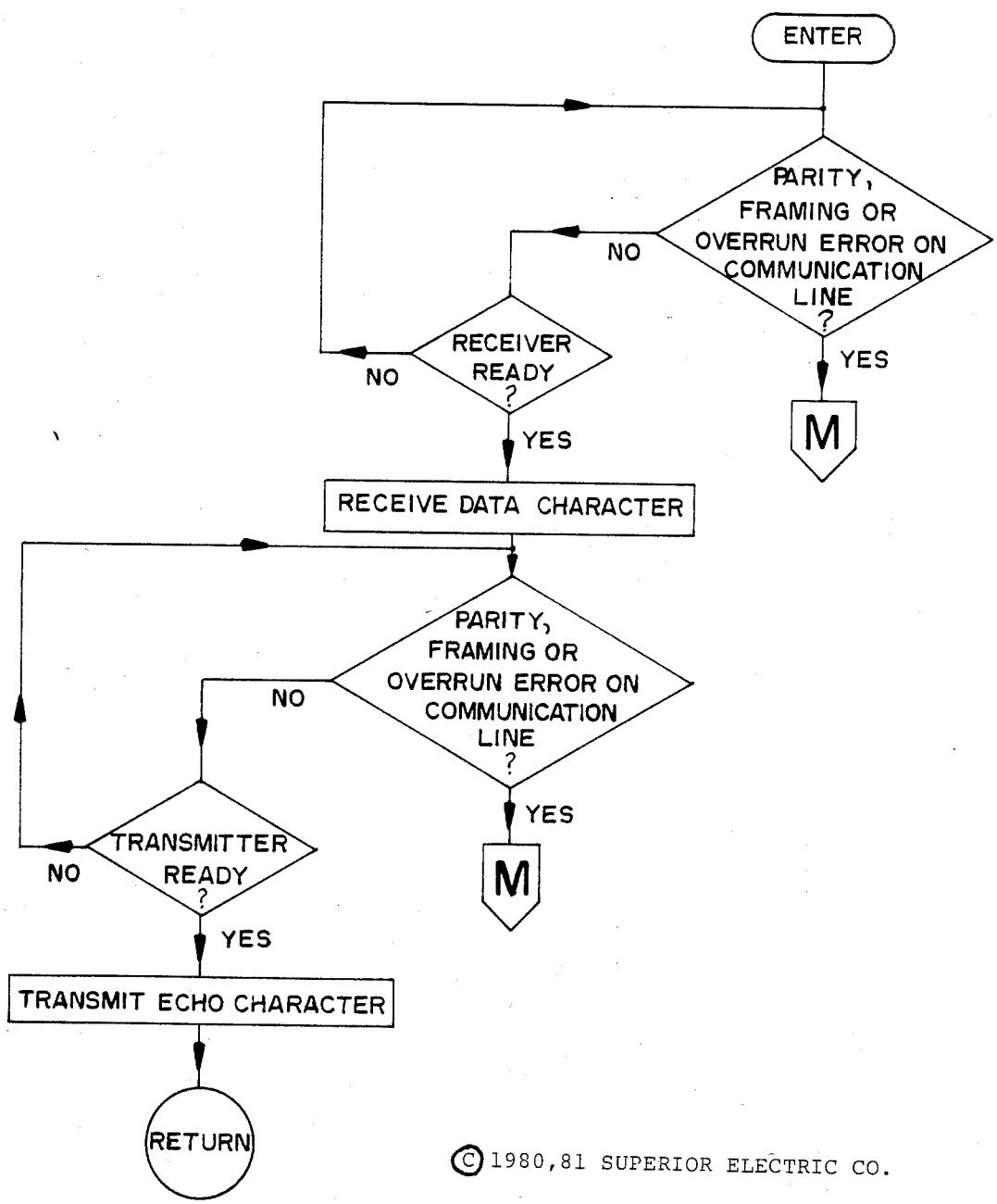

Referring to FIG. 47, we still have not printed anything yet. Now we check the feed button. The feed button just produces blank paper and it advances the paper out of the printer. Every time the program goes through loop 160 the paper goes up 0.045 inches, which is equal to the distance between a row of dots on the printout. Now we check to see if Nulls were received. If so, we send the command word again to receive more information; on the other hand if the Nulls were not received, we check to see if the information sent from the detector to the printer was a command, and if there is a printer overload, the printer prints the printer overload message.

The detector has two pointers on the last event register. One pointer is used to indicate the position of the data in the last event register that is being transmitted to the printer. The other pointer indicates the position of the data which is being loaded into that last event register. Therefore, when the printer pointer falls far enough behind the pointer for the data being loaded in, i.e. the old data is being erased and the new data is being put into the last event register before it can be transmitted to the printer. Then the printer overload command is sent from the detector to the printer and is printed out by the printer. Then another command word is sent to the detector, requesting more. If the overload command is sent, the detector automatically will reset the pointers.

Figure 50:
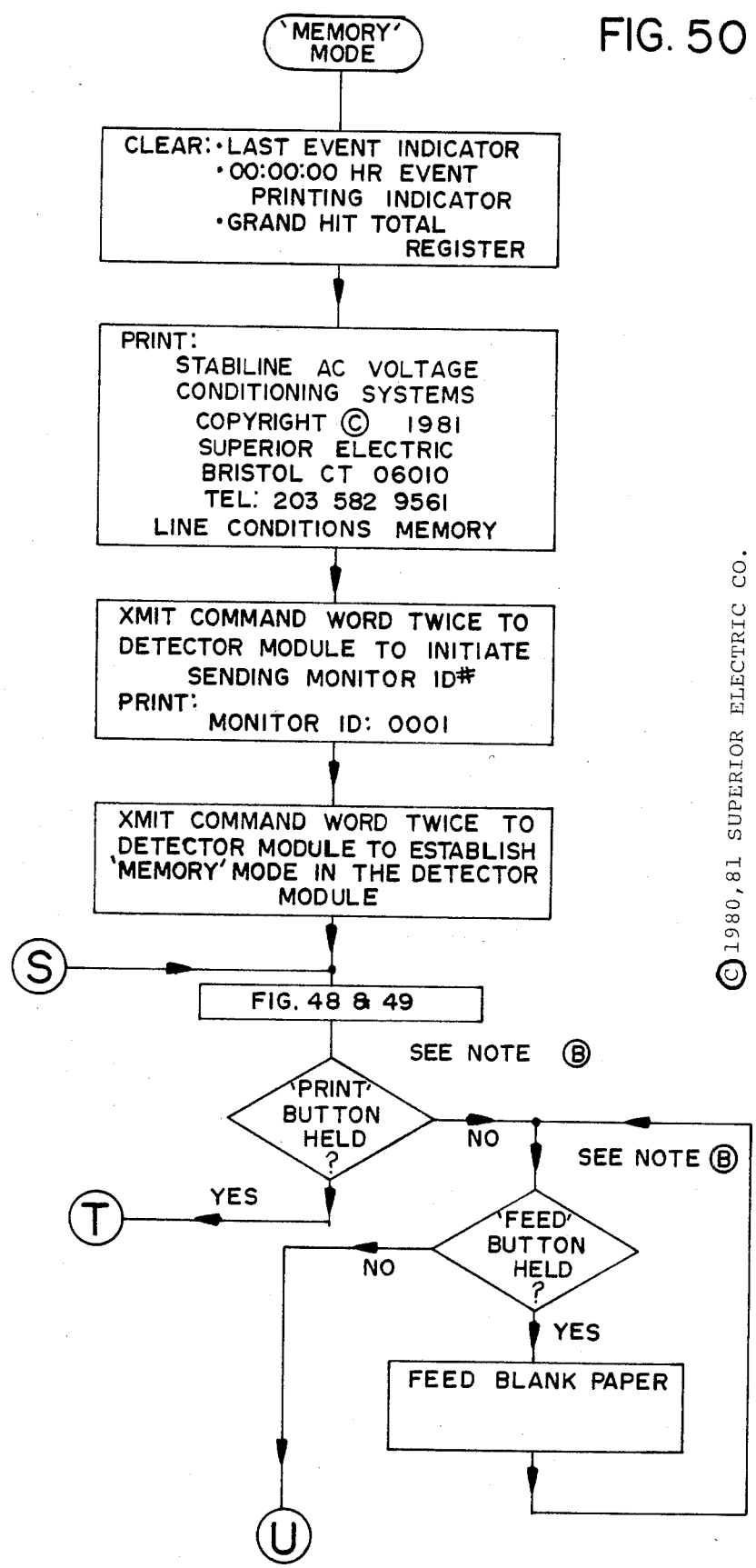
Figure 51:
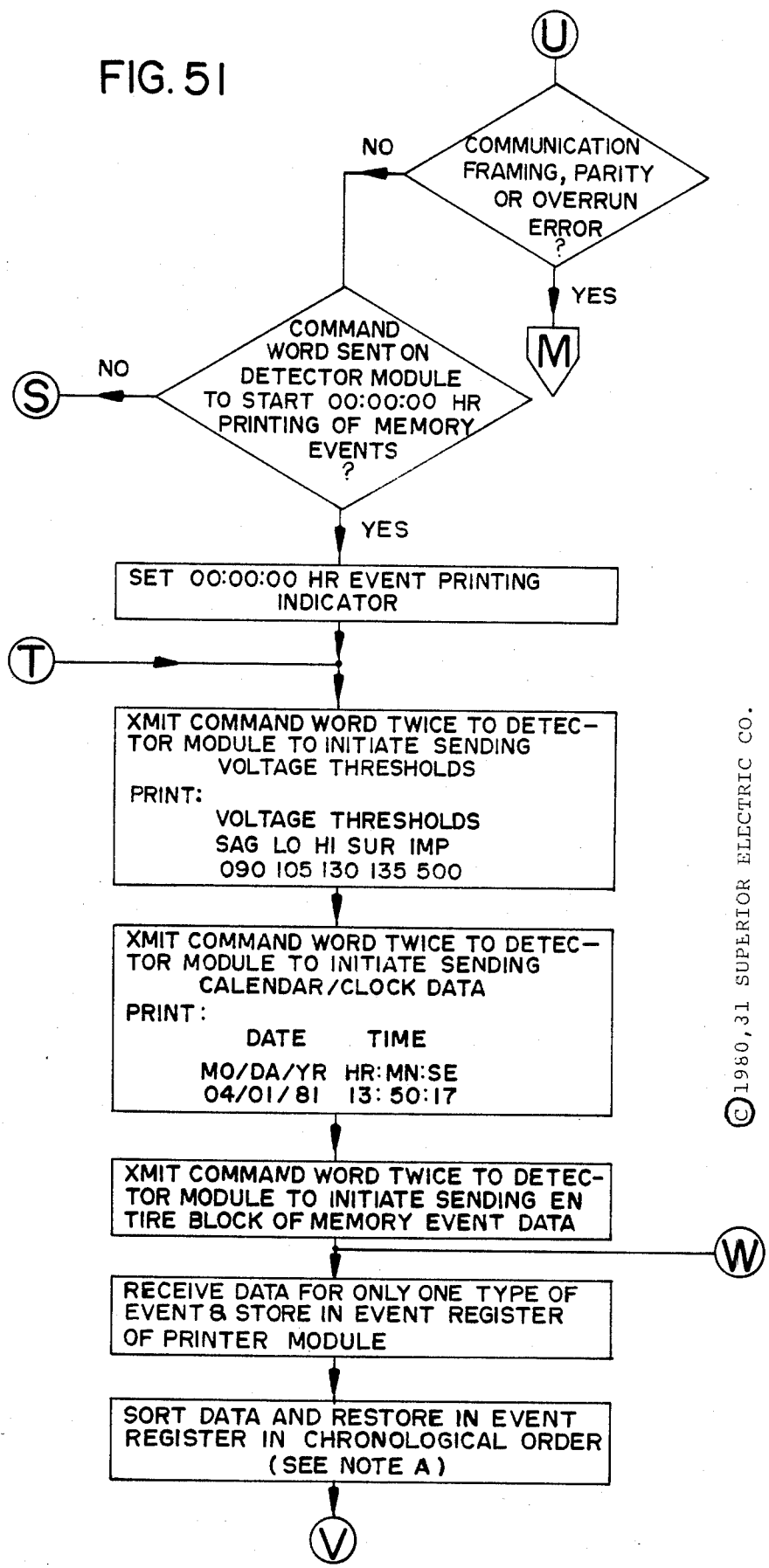

Referring to FIG. 50, in the memory mode if the print button is held we come down to where we have the box "Print Button Held" and proceed to "Transmit Command Word" in FIG. 51. The Memory command word is transmitted according to the sub-routines of FIGS. 48 and 49.

At this point, we are at a decision that has to be made: if it is a twelve o'clock printing that we are going to do or is it memory printing made at the request of the user. If the "Print" button is pushed, printing is made at the request of the user. However, if it is not and the FEED button is not, (FIG. 50) we proceed to the sub-routine at the top of FIG. 51. It is a twelve o'clock printing and an appropriate command word is sent from the detector to the printer. The program then moves on to the twelve o'clock midnight printing. We have to set an indicator in the memory mode because at the end of this printing we are going to send the command back to the detector and clear memory. Whereas, you do not have to touch that indicator if you are using just the printout.

So, unlike the ON LINE mode where only one event is transmitted at a time: transmitting and printing, transmitting and printing and so on; in the memory mode the detector transmits a block of event data. For example, all the SAG data to the printer. The data in the printer is sorted chronologically so that the printout of SAG data is printed chronologically in time. The register that contains the grand total hit count is updated by the number of hits that occurred in the SAG. (FIG. 52) Subheadings are printed for the various types of events. (FIG. 53) For example, for SAG there is day, time, volts and cycles; however, for LOW AVERAGE, there is day, time volts and seconds and so forth. So, decisions are made as to what type of event it is. Also, going through the sub-routine of FIG. 52 there are decisions made to see if the SELECT button is held. If it is held we are going to bypass the printing of the event. Under that event type, if the FEED button is held we are going to paper feed and so forth.

Figure 52:
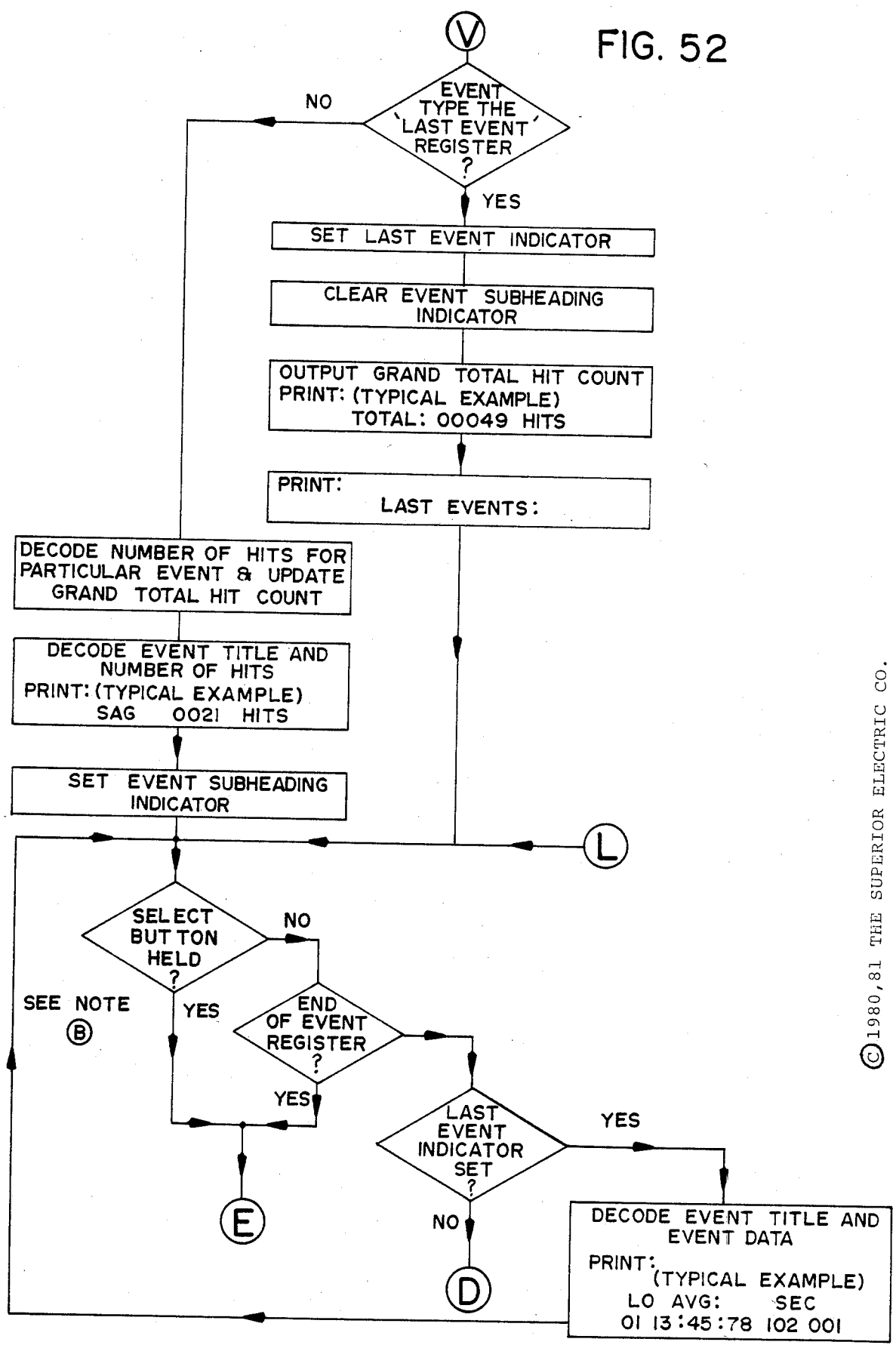
Figure 53:
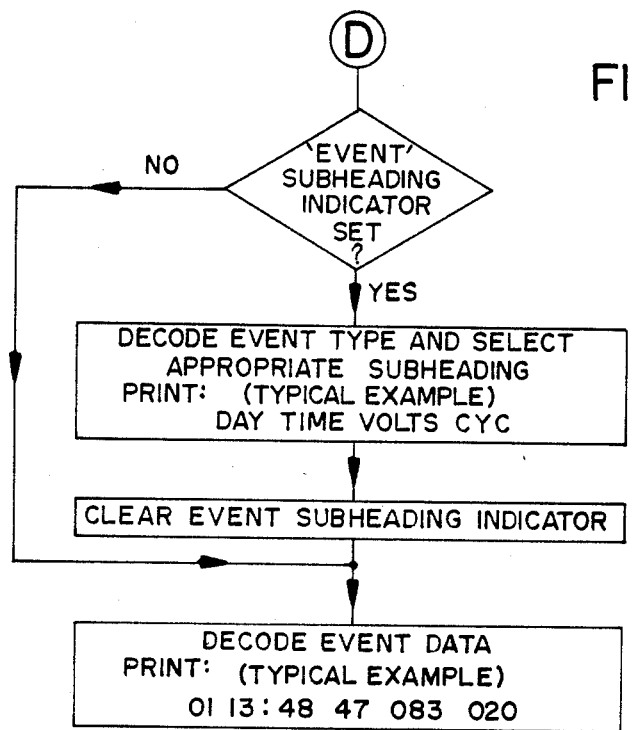
Figure 54:
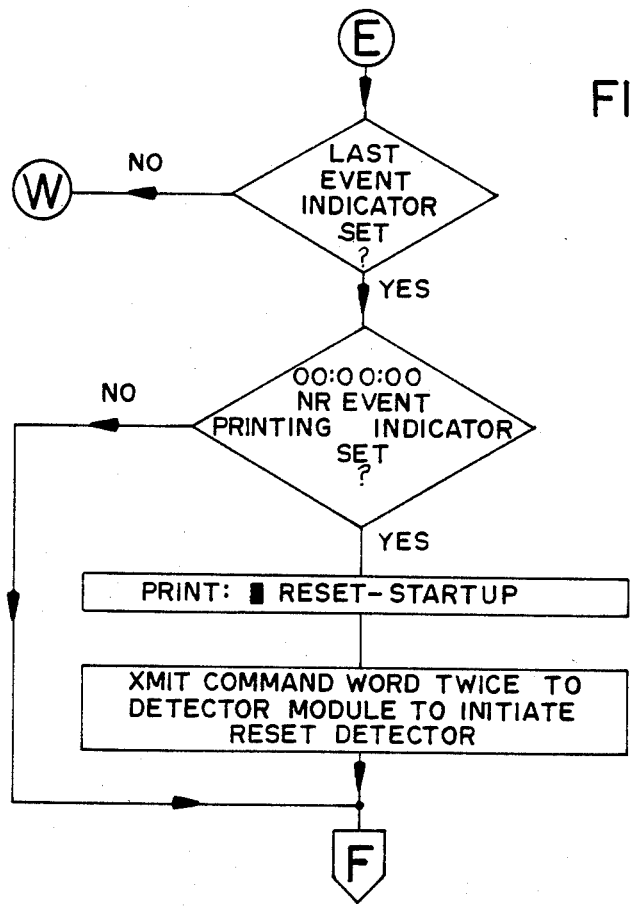

When all the events are printed out for a particular type of event, then the printer goes back to the detector to request information for the next set of categories. In our case, it will be SURGE. That process repeats until the last events are printed out. An indicator is set to indicate to the printer that it is the last event register that is being printed out so that the process can be terminated. (FIGS. 52 and 54)

Figure 55:
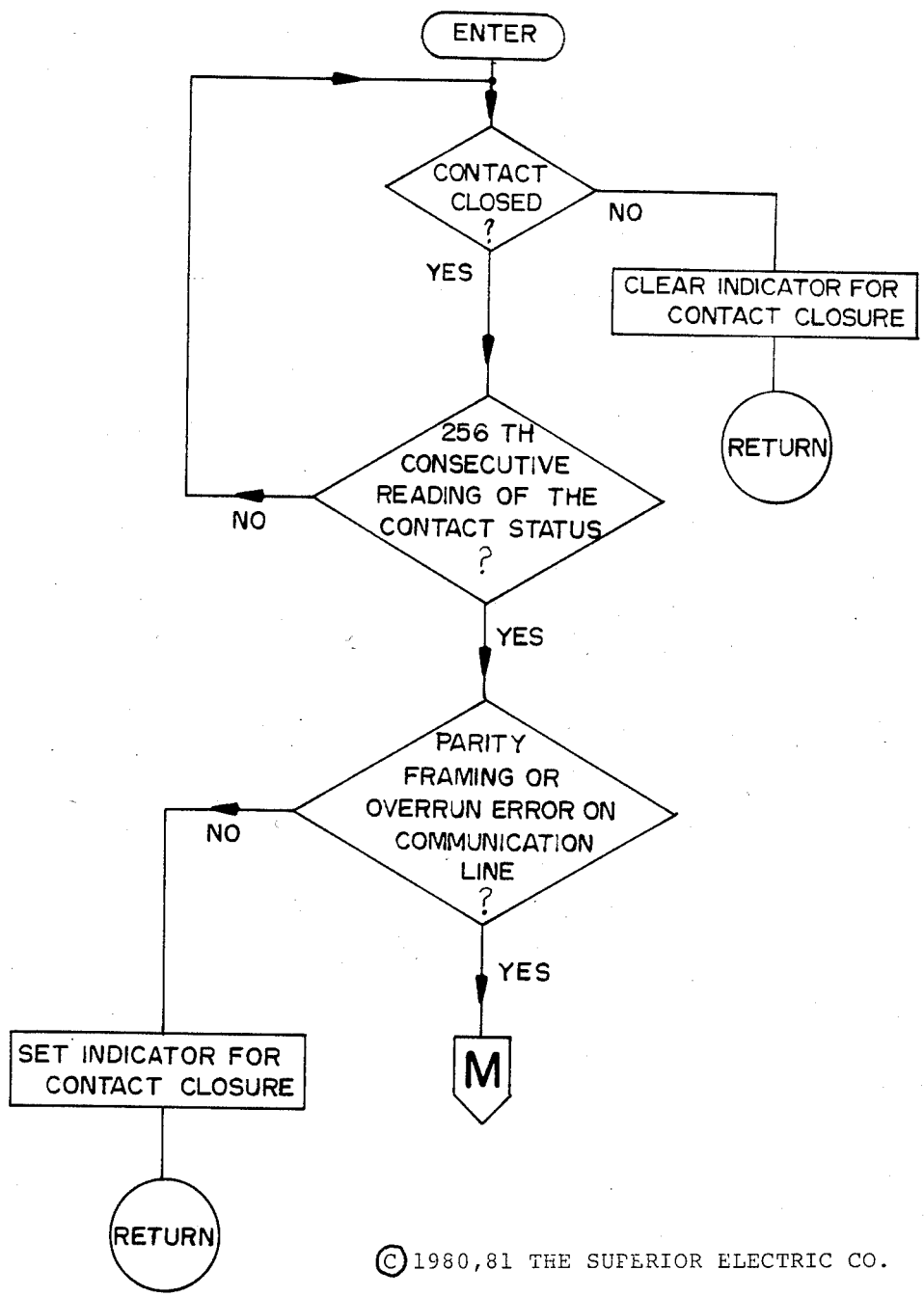

Referring to FIG. 55, the switches SELECT, PRINT and FEED have software for anti-bounce of the switch contacts. If for example a FEED button is held, we check to make sure that the contact is closed; if it is, we check to see if this is the 256th consecutive time through that loop, that the contact was closed. If it is, we exit that loop with the indicator set that the contact was closed. If during any one of those 256 loops the contact was bouncing and the PIA indicated that the switch was opened, then we would clear that indicator to indicate that the contact was not closed and we would exit from that loop determining that the switch was not closed. Thus "Print Button Held?" in FIG. 50 means that the program is really checking the indicator in FIG. 55. That also applies to the FEED and SELECT buttons. Because of the fact that, for example, when we are setting the clock data, all the action is in the printer itself. There is no communications going on between the printer and the detector. So, in order to check if there is a problem with the communications channel, at the time we check for contact closure with any one of these push buttons, we also check for parity, framing, or overload error on the communication line. (FIG. 55) If we do see one of those, even though we are not doing any communicating, we exit through point M to the routine that prints the message "Communication Error" and goes through the reset start up of the printer. (FIG. 62) The mode that the printer was originally in is the mode that is entered again.

Figure 56:
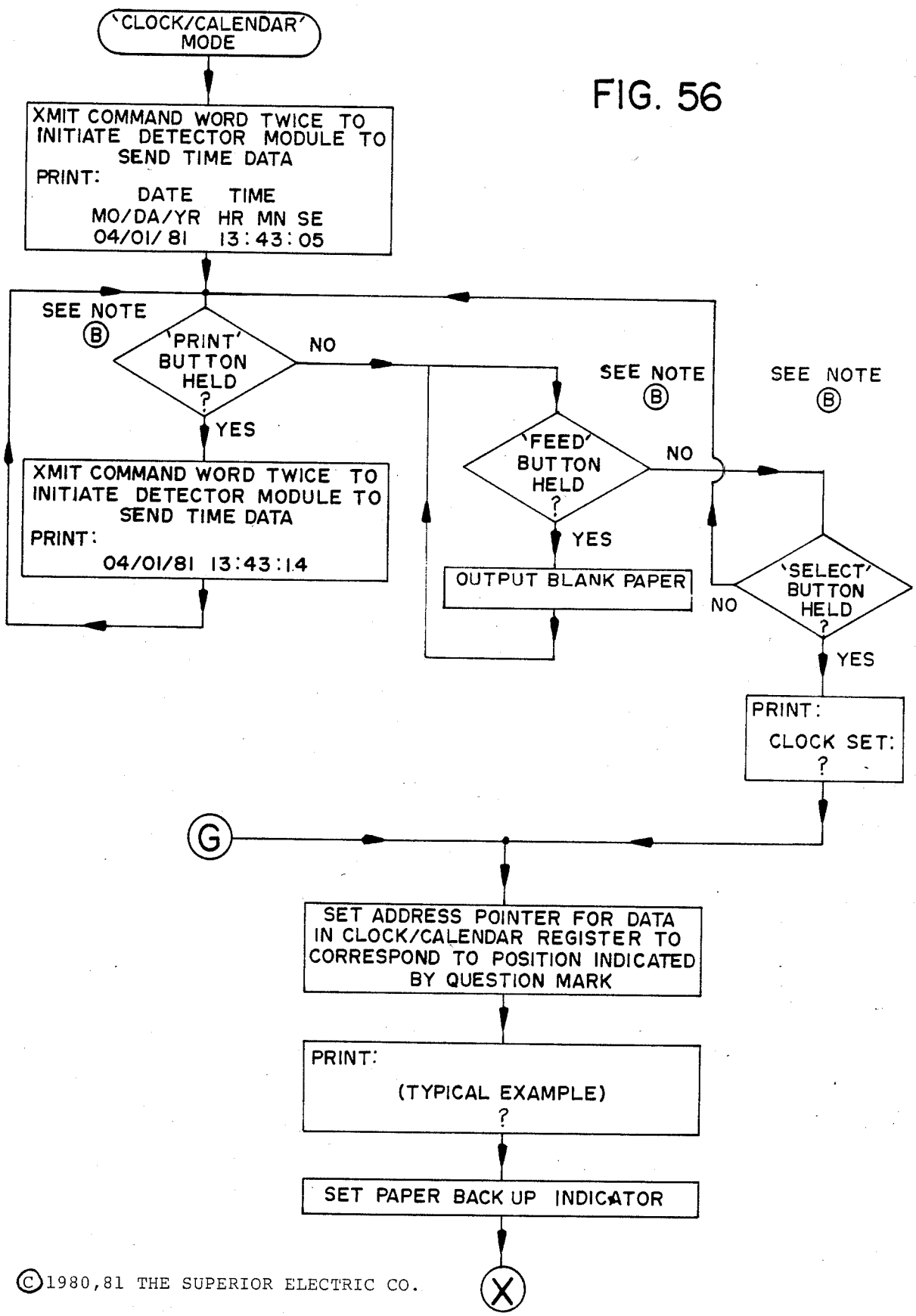
Figure 57:
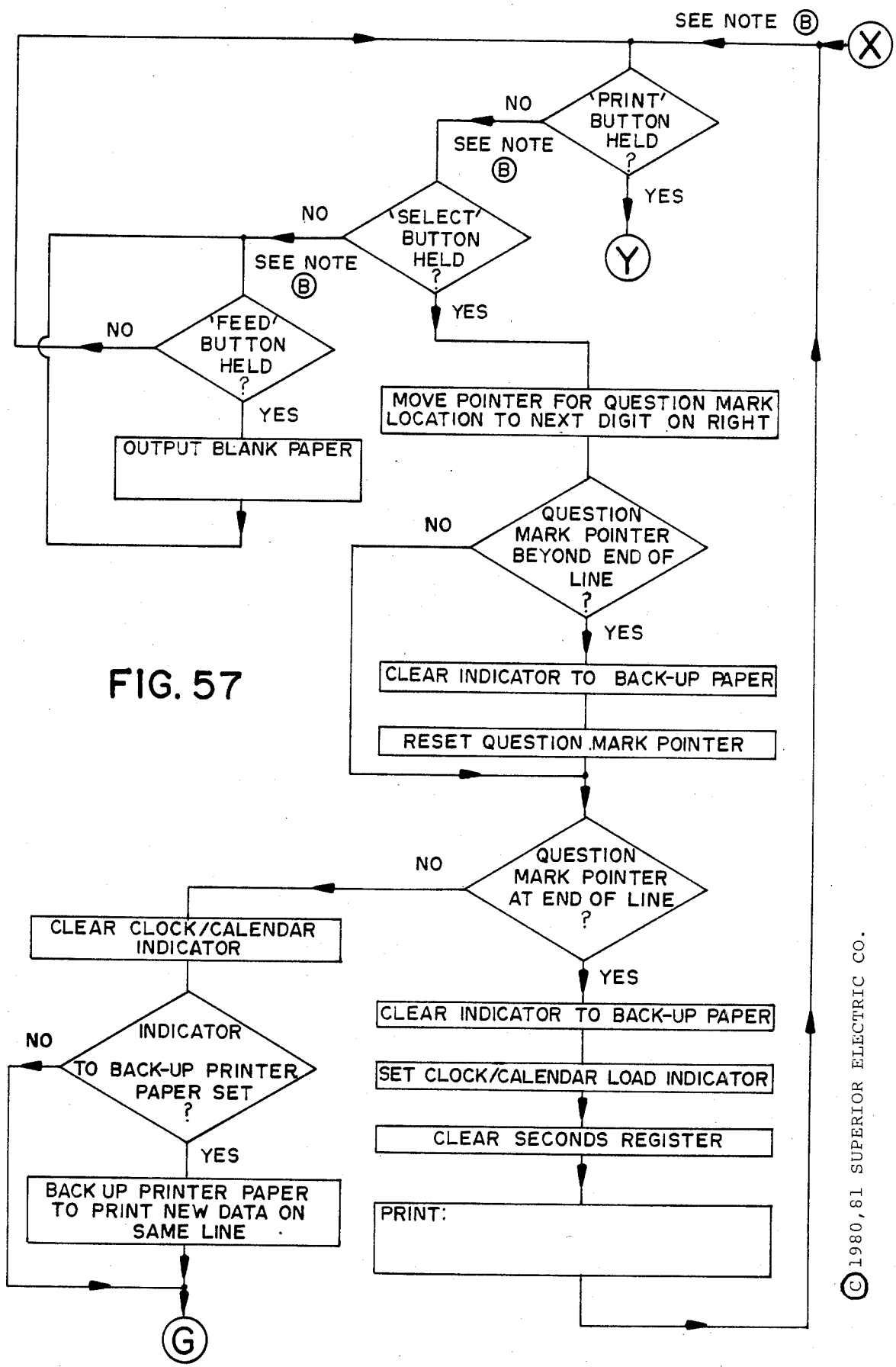
Figure 58:
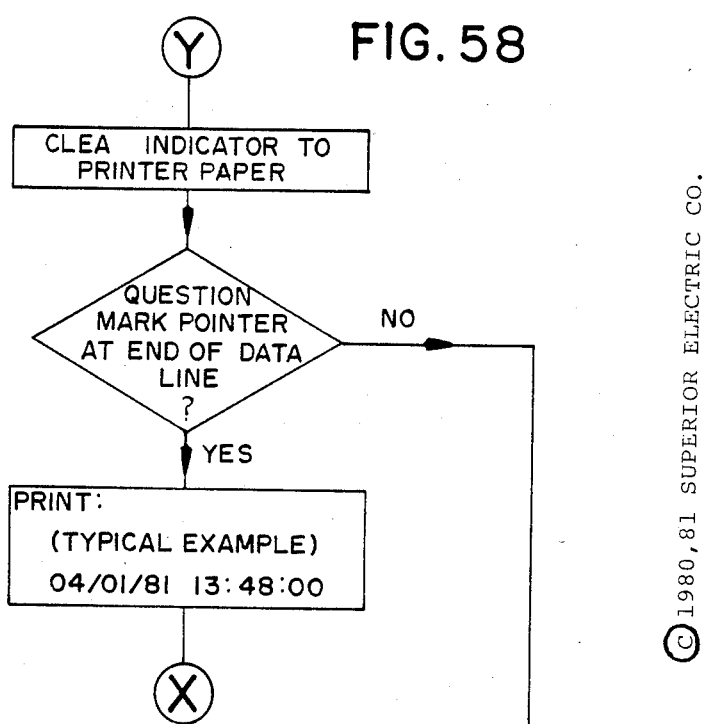
Figure 59:
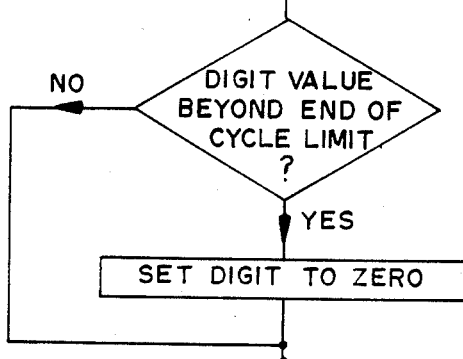
Figures 60, 61:
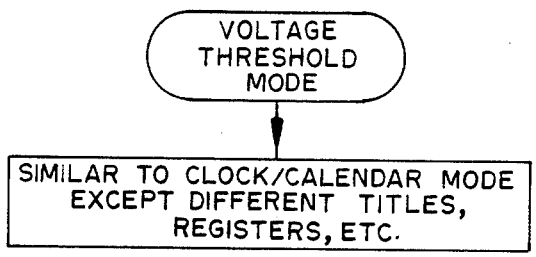

Referring to FIG. 56, in the clock calendar mode, the function of the FEED button is obviously to advance the paper. The function of the SELECT button is to get us into the clock setting mode, and also to advance the ? that is printed out. The ? indicates the particular digit that is going to be modified by way of using the print button. A typical clock mode output is shown in FIG. 12. For example, we are setting the clock; the original time is the eleventh month, the eleventh day, the 00 year, eleventh hour, the eleventh minute and 04 seconds. So we want to set this to be the third day, so the ? is under the 1, the 21st of the month. You want to set that from a 1 to a 3. So we hit the print button twice, each time incrementing the ones digit of the day and printing the new date 1/23/00. Then we hit the SELECT button again, that leaves the ? one place to the right under the tens digit of the year. We now hit the PRINT button eight times setting the year to 80.

If there are two consecutive digits, or two digits that are adjacent to each other that do not have to be set, instead of advancing the paper and putting the ? to the right and ahead of the previous ?, we back the printer paper up, so that all the ??'s are on the same line. So, eventually the ? moves all the way over to the extreme right hand position, an * is printed on the extreme right hand side of the lines (see FIGS. 57 and 58).

If the operator now hits the SELECT button the next line will be printed out with the ? at the first digit. But if he hits the PRINT button again, then the same line is just printed again.

The new clock/calendar setting is entered by exiting the CLOCK CALENDAR mode. The operator hits the MODE button, the program creates an interrupt and goes to the foreground mode. (FIGS. 64 and 65)

In the foreground mode, the first thing you do is to check the indicators to see which one is set. In the case of the * the clock/calendar indicator would be set. The appropriate command word is transmitted to the detector, to initiate receipt of the clock data by the detector. So, all this information goes to the detector and the detector initializes the clock to this data, and starts its clock going.

The threshold mode (FIG. 60) is similar to the clock/calendar mode, except that there are different titles and working registers and so forth used. The process is exactly the same to advance the ? by pressing the SELECT button and the digit over the ? by pressing the PRINT button.

The MONITOR I.D. mode is entered at the end of the voltage threshold mode when the * printed. Once the mode is entered the I.D. number may be set the same way as the clock/calendar.

When the Program first enters the clock/calendar mode, (FIG. 56) the clock is still running in the detector, so if we hit the PRINT button we are going to resend the command word from the printer to the detector to send the new time information from the clock. So in that way, once you enter the clock/calendar mode you can use the PRINT button to get an indication of how accurately the detector's clock is set to a standard. However, once you enter the clock set mode, by way of the select button, you are using the time that was last read from the clock. At the end of the clock/calendar mode, if you are loading the time, the seconds are automatically set to zero. If you reinitialize the clock, your are reinitializing to zero seconds.

Figure 62:
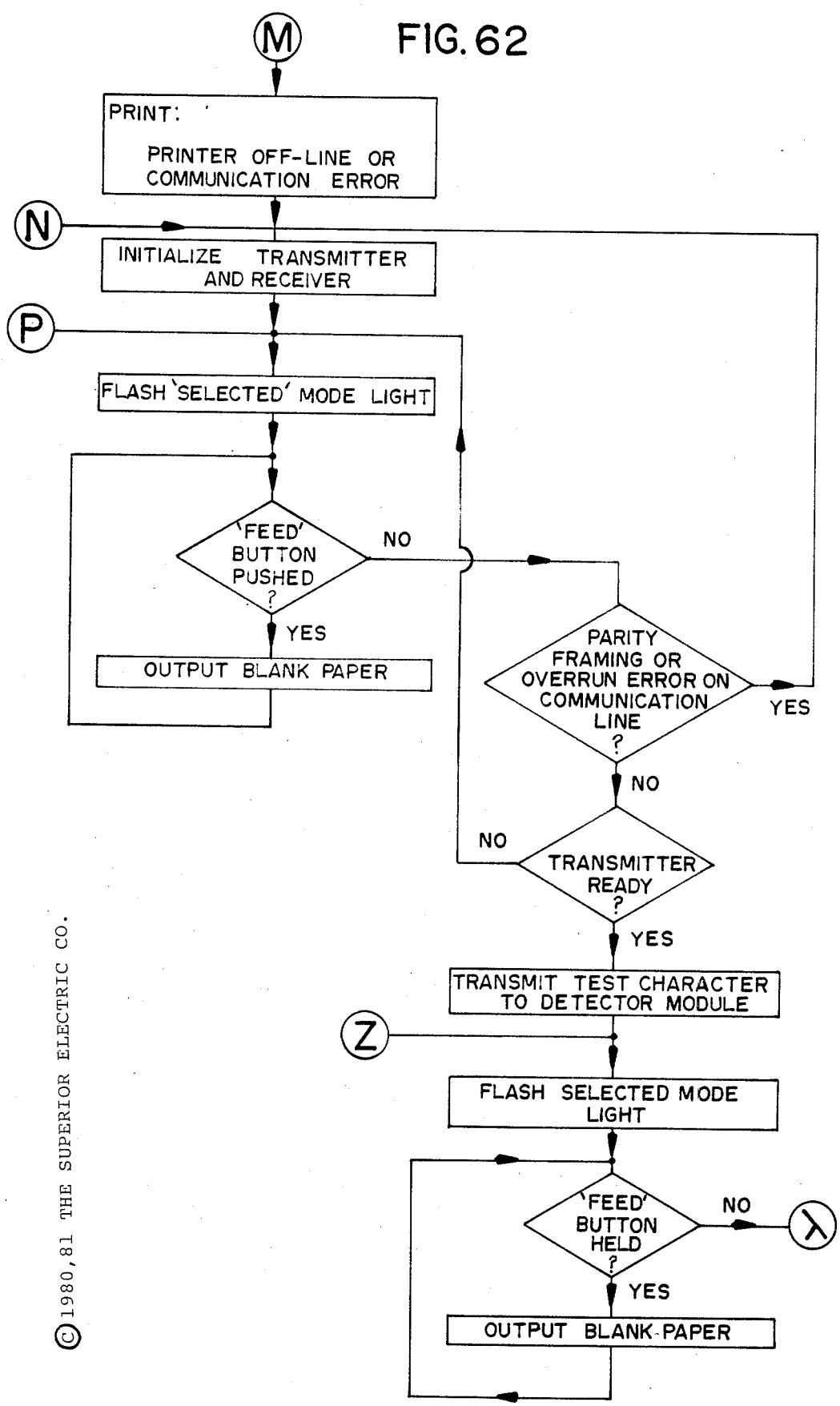
Figure 63:
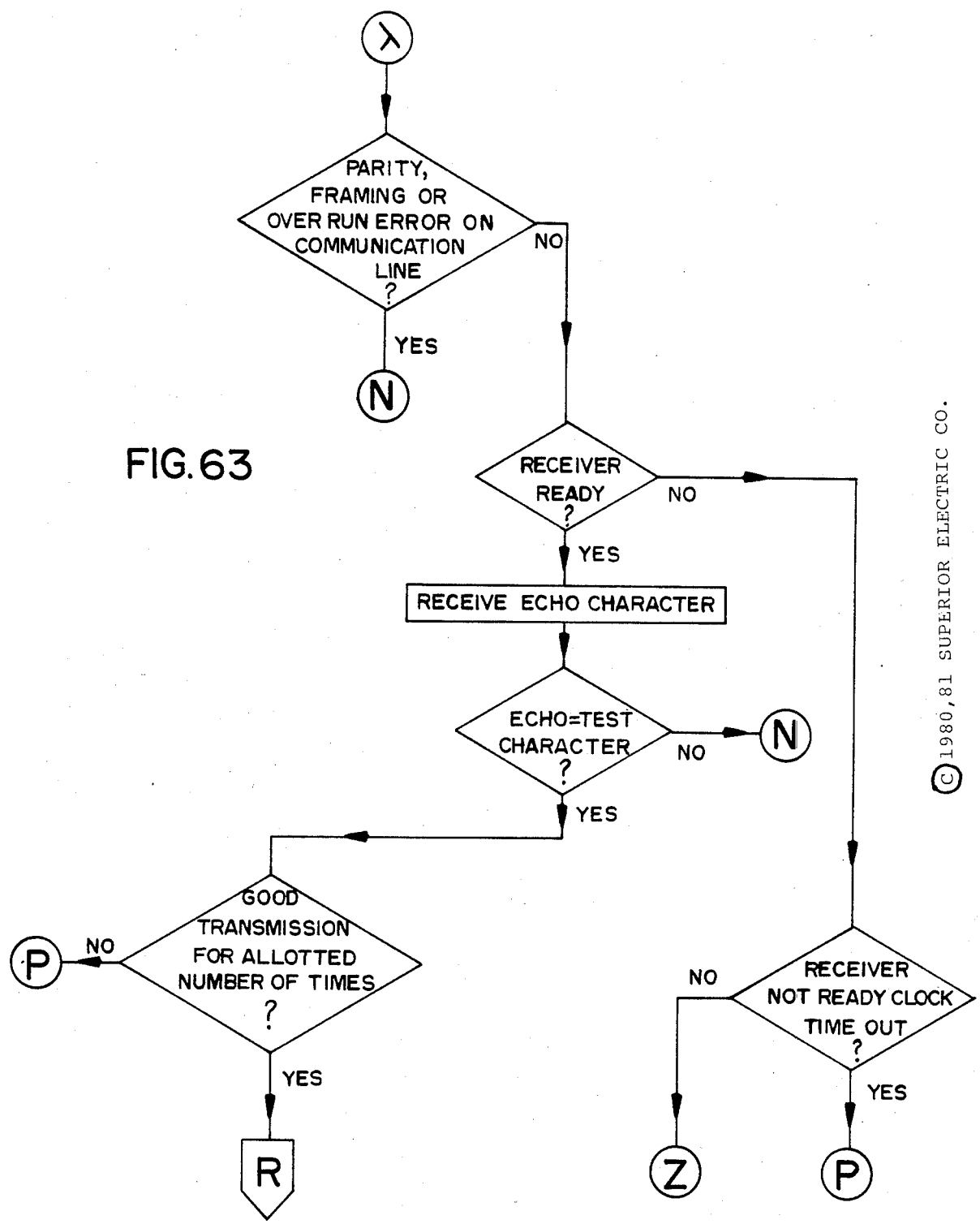

Looking at entry point M of FIG. 62, whenever there is a framing, parity or communication error or an echo back character does not agree with the original character, i.e. any type of communication error, the program comes into point M. The printer will print the message "Communication Error". Then the program tries to establish communication with the detector. Essentially all the sub-routine of FIG. 62 is doing is to re-establish that communication. While it is trying to re-establish that communication, the MODE light of the printer is flashing. The MODE light that flashes is the particular mode that the printer was in when the communication error occurred. Now, normally if it is just a glitch that lasts for just a split second, one may not see that mode light flash. But, if the communication line is really broken, communication will never be established and one will definitely see that mode light flash.

If the power was not disabled, was not turned off to the printer, then point R indicates a restart up of the printer, using the mode that it was previously in. If there was a fresh power turn-on, the mode of the printer is set to the memory mode. That is, the only time that the mode indicator is set to the MEMORY mode is when the power is first turned on. Otherwise, it is always in the mode that the printer was in before the error first occurred.

The Printer Module program listings appear with comments in the Appendix B.

NOTES TO FIGS. 43 THROUGH 65

Note A. Sorting is done by starting at the beginning of the Event Register, comparing the time of adjacent events and interchanging their position in the register if the event further down in the Register is older.

Note B. Process for testing for "Select", "Print" and "Feed" contact closures.

It will thus be seen that the objects set forth above among those made apparent from the preceeding description are efficiently attained and, since certain changes may be made in carrying out the above methods, in the constructions set forth in the above system without departing from the scope of the invention it is intended that all matter contained in the above description or shown in the accompanying drawings or appendix shall be interpreted as illustrative and not in a limiting sense.

It is also to understood that the following claims are intended to cover all of the generic and specific features of the invention herein described, and all statements of the scope of the invention which, as a matter of language, might be said to fall therebetween.

Having described our invention what we claim as new and desire to secure by Letters Patent is:

1. An alternating current line voltage monitor comprising:
    (A) a filter adapted for connection to an AC power line for filtering out impulses occurring on a phase thereof;
    (B) first means connected to said filter for detecting and storing the peak value of the peak voltage occurring during each half cycle of said phase of said AC power line;
    (C) storage means; and
    (D) computer means connected to said first means and said storage means for comparing said peak half cycle value with surge and sag thresholds and if it is greater than said surge thresholds or less than said sag threshold, for supplying it, together with the time of occurrence of the first half cycle a threshold was exceeded and
    the duration the same threshold was exceeded for consecutive half cycles to said storage means for storage therein.

2. The alternating current line voltage monitor of claim 1 wherein said computer means also stores the said values of the peak voltages occurring during a preset plurality of the immediately preceeding half cycles of said phase of said AC power line and during each half cycle determines the average of the stored peak values and if it is greater than a high average threshold or less than a low average threshold supplies it, together with the time of occurrence of the first half cycle a threshold was exceeded and the duration of threshold was exceeded to said storage means for storage therein.

3. The line voltage monitor of claims 1 or 2, and:
    (E) means adapted for connection to said AC power line and to said computer means for detecting and storing an impulse value proportional to the highest peak voltage of any impulse occurring during each half cycle of said phase; and said computer means further supplying said impulse value if it exceeds an impulse threshold to said storage means together with the time of occurrence of the impulse for storage therein.

4. The alternating current line voltage monitor of claim 3, and:
    (F) means adapted for connection to said AC power line and to said computer means for detecting and storing a common mode value of the peak voltage of a common mode voltage occurring during each half cycle of said phase of said AC power line and said computer means further supplying said common mode peak value if it exceeds a common mode threshold to said storage means together with the time of occurrence of the first half cycle the common mode threshold was exceeded for storage therein.

5. The line voltage monitor of claims 1 or 2, and:
    (H) means adapted for connection to said AC power line and to said computer means for detecting and storing the peak voltage of a common mode voltage occurring during each half cycle; and
    (I) means for storing said peak common mode voltage if it exceeds a common mode threshold together with the time of occurrence of the first half cycle the common mode threshold was exceed.

6. The line voltage monitor of claims 1 or 2, and:
    (J) means for storing at least one worst event of at least one kind of event in which one of said thresholds has been exceeded; and
    (K) means for comparing each new event after termination thereof with said worst events storage means and for storing the new event and if said worst events storage means is full, for deleting from storage the least significant event stored therein.

7. The line voltage monitor of claim 3, and:
(J) means for storing at least one worst event of at least one kind in which one of said thresholds has been exceeded; and
(K) means for comparing each new event after termination thereof with said worst events storage means and for storing the new event and if said worst events storage means is full, for deleting from storage the least significant event stored therein.

8. The alternating current line voltage monitor of claim 4, wherein said storage means stores at least one worst event of at least one kind in which one of said thresholds has been exceeded; and said computer means compares each new event after termination thereof with said stored worst events and stores the new event and if said worst events storage means is full deletes from storage the least significant event stored therein.

9. The line voltage monitor of claims 1 or 2, and:
(L) means coupled to said computer means for storing a predetermined number of at last occurring events of at least one type in which one of said threshold values has been exceeded.

10. The line voltage monitor of claim 3, and:
(L) means coupled to said computer means for storing a predetermined number of the last occurring events of at least one type in which one of said threshold values has been exceeded.

11. The line voltage monitor of claim 4, and:
(L) means coupled to said computer means for storing a predetermined number of at last occurring events of at least one type in which one of said threshold values has been exceeded.

12. The line voltage monitor of claim 5, and:
(L) means coupled to said computer means for storing a predetermined number of the last occurring events of at least one type in which one of said threshold values has been exceeded.

13. The line voltage monitor of claim 6, and:
(L) means coupled to said computer means for storing a predetermined number of the last occurring events of at least one type in which one of said threshold values has been exceeded.

14. The line voltage monitor of claim 7, and:
(L) means coupled to said computer means for storing a predetermined number of the last occurring events of at least one type in which one of said threshold values has been exceeded.

15. The line voltage monitor of claim 8, wherein said storage means stores a predetermined number of the last occurring events of at least one type.

16. A line voltage monitor as defined in claim 1, further defined in that said means for detecting and storing the peak voltage of each half cycle comprises:
(a) a low pass filter connected to said AC power line;
(b) a full wave rectifier connected to receive the output of said low pass filter and to rectify the same; and
(c) a sample and hold circuit for receiving the output of said full wave rectifier and for storing a voltage proportional to the peak voltage received by it.

17. A line voltage monitor as defined in claim 16 and:
(M) means for generating a reset signal at the beginning of each half cycle to reset said voltage stored in said sample and hold circuit to zero.

18. A line voltage monitor as defined in claim 3, wherein said means for detecting and storing the peak voltage of any impulse comprises:
(A) a high pass filter connected to said AC power line to be monitored and adapted to pass impulses to be monitored;
(B) a current transformer connected to receive impulses from said high pass filter, and provide a current proportional thereto;
(C) a sample and hold circuit for receiving said proportional current and storing a voltage proportional to the peak voltage of the biggest impulse received by it; and
(D) means for deleting the stored voltage from said sample and hold circuit.

19. An alternating current line voltage monitor as defined in claim 1, wherein said first means comprises:
(i) means for storing said peak values of said peak voltages occurring during a preset plurality of immediately preceeding half cycles, and
(ii) means for determining the average of the stored peak voltages and storing it, if it is greater than a high average threshold or less than a low average threshold together with the time of occurrence of the first half cycle a threshold was exceeded.

20. An alternating current line voltage monitor as defined in claim 1, and:
(D) synchronization means comprising:
(a) means connected to said AC power line to be monitored and for deriving therefrom a sync signal synchronous with oscillations of the line,
(b) means responsive to said sync signal to monitor the line voltage at the repetition rate of the sync signal, and
(c) means for supplying an artificial sync signal during blackouts at a rate faster than the oscillation of the line.

21. The alternating current voltage of claims 1, or 2, or 4, wherein said computer means compares the threshold exceeding peak values occurring during consecutive half cycles and provides the greatest value to said storage means whereby, at the termination of consecutive half cycles wherein a said threshold has been exceeded, there remains stored in said storage means, the time of initial occurrence of said consecutive half cycles, the duration thereof, and said greatest value.

* * * * *